United States Patent [19]
Ehlers et al.

[11] Patent Number: 5,572,438
[45] Date of Patent: Nov. 5, 1996

[54] ENGERY MANAGEMENT AND BUILDING AUTOMATION SYSTEM

[75] Inventors: Gregory A. Ehlers, Tampa, Fla.; Robert D. Howerton; Gary E. Speegle, both of Decatur, Ga.

[73] Assignee: TECO Energy Management Services

[21] Appl. No.: 369,679

[22] Filed: Jan. 5, 1995

[51] Int. Cl.[6] .................................................. H02J 3/00
[52] U.S. Cl. ........................... 364/492; 364/132; 307/39; 307/126
[58] Field of Search .................................. 364/492, 493, 364/464.04, 132, 138, 139; 307/38, 39, 41, 115, 116, 126, 132 E

[56] References Cited

U.S. PATENT DOCUMENTS

| | | | |
|---|---|---|---|
| 1,547,242 | 7/1925 | Strieby . | |
| 4,075,699 | 2/1978 | Schneider et al. | 364/492 |
| 4,291,375 | 9/1981 | Wolf | 364/483 |
| 4,324,987 | 4/1982 | Sullivan, II et al. | 307/35 |
| 4,336,462 | 6/1982 | Hedges et al. | 307/35 |
| 4,466,074 | 8/1984 | Jindrick et al. | 364/145 |
| 4,475,193 | 10/1984 | Brown | 379/66 |
| 4,503,288 | 3/1985 | Kessler | 379/67 |
| 4,511,979 | 4/1985 | Amirante | 364/481 |
| 4,513,189 | 4/1985 | Ueda et al. | 219/714 |

(List continued on next page.)

FOREIGN PATENT DOCUMENTS

| | | |
|---|---|---|
| 0534839A1 | 3/1993 | European Pat. Off. . |
| 2645968 | 10/1990 | France . |
| 2660511 | 10/1991 | France . |
| WO93/08653 | 4/1993 | WIPO . |
| WO94/00824 | 1/1994 | WIPO . |
| WO94/03989 | 2/1994 | WIPO . |
| WO94/09572 | 4/1994 | WIPO . |

OTHER PUBLICATIONS

"Boosting Your Home's IQ; Manufacturers agree on standards for creating the smart house", Technology, p. 70 (not dated).

Schrock, Clifford B., "Conservation and safety for the 90's using cable TV networks", Cable Bus Systems Corp. (no ref or date).

(List continued on next page.)

*Primary Examiner*—Emanuel T. Voeltz
*Assistant Examiner*—Kyle J. Choi
*Attorney, Agent, or Firm*—Wolf, Greenfield & Sacks, P.C.

[57] ABSTRACT

An energy management and building automation system including a local area network or home automation data bus such as the CEBus. Each load is connected to the bus via a control module which may contain a circuit breaker to disconnect the load from the mains upon command or upon occurrence of a power outage. Current monitoring control modules measure load current and power monitor modules monitor power consumed by selected loads, both modules transmitting bus messages indicating load status and status changes. A first microcomputer preferably is external to the customer premises, adjacent the electric utility power meter. A second microcomputer preferably is inside the customer premises. The two microcomputers communicate with each other and with the various modules via the network/data bus. The first microcomputer communicates with the utility company via any appropriate communications link. The second microcomputer serves, in part, as an input/output terminal for the system, allowing the customer to set parameters and query the system as to power usage, displaying reports requested by the customer and messages transmitted by the utility company and by either microcomputer. The first microcomputer acts as a master controller and/or network server, communicating with the world outside the premises, as a communications gateway between voice, video and data services, and being the primary data collector and operator of load control modules; the second microcomputer provides certain backup functions. The utility company can access selected utilization data and control at least some loads via messages to the first microcomputer.

29 Claims, 43 Drawing Sheets

U.S. PATENT DOCUMENTS

| | | | |
|---|---|---|---|
| 4,514,594 | 4/1985 | Brown et al. | 340/310.01 |
| 4,520,576 | 6/1985 | Vander Molen | 33/438 |
| 4,521,645 | 6/1985 | Carroll | 379/42 |
| 4,523,307 | 6/1985 | Brown et al. | 370/30 |
| 4,633,775 | 5/1987 | Olek | 100/297 |
| 4,665,544 | 5/1987 | Honda et al. | 43/82 |
| 4,728,949 | 3/1988 | Platte et al. | 340/825.37 |
| 4,771,185 | 9/1988 | Feron et al. | 364/492 |
| 4,772,870 | 9/1988 | Reyes | 340/310.02 |
| 4,819,180 | 4/1989 | Hedman et al. | 340/501 |
| 4,847,554 | 7/1989 | Goodwin | 324/127 |
| 4,847,781 | 7/1989 | Brown, III et al. | 364/492 |
| 4,847,782 | 7/1989 | Brown, Jr. et al. | 340/310.01 |
| 4,855,922 | 8/1989 | Huddleston et al. | 364/493 |
| 4,888,495 | 12/1989 | Feron et al. | 307/39 |
| 4,899,129 | 2/1990 | MacFadyen et al. | 340/310.01 |
| 4,899,217 | 2/1990 | MacFadyen et al. | 348/8 |
| 4,977,515 | 12/1990 | Rudden et al. | 364/492 |
| 4,987,513 | 1/1991 | Shelley | 361/92 |
| 5,033,112 | 7/1991 | Bowling et al. | 359/154 |
| 5,045,823 | 9/1991 | Nichols, III | 333/132 |
| 5,086,385 | 2/1992 | Launey et al. | 364/188 |
| 5,090,024 | 2/1992 | Vander Mey et al. | 375/204 |
| 5,101,191 | 3/1992 | MacFadyen et al. | 340/310.01 |
| 5,109,222 | 4/1992 | Welty | 340/825.72 |
| 5,126,934 | 6/1992 | MacFadyen | 364/140 |
| 5,134,356 | 7/1992 | El-Sharkawi et al. | 323/211 |
| 5,168,170 | 12/1992 | Hartig | 307/35 |
| 5,196,982 | 3/1993 | Landsberg et al. | 361/93 |
| 5,218,552 | 6/1993 | Stirk et al. | 364/492 |
| 5,263,046 | 11/1993 | Vander Mey | 375/204 |
| 5,278,862 | 1/1994 | Vander Mey | 375/200 |
| 5,315,499 | 5/1994 | Bilas et al. | 364/140 |
| 5,323,307 | 6/1994 | Wolf et al. | 364/140 |
| 5,347,167 | 9/1994 | Singh | 307/125 |
| 5,436,510 | 7/1995 | Gilbert | 307/38 |
| 5,469,365 | 11/1995 | Diekema et al. | 364/483 |

OTHER PUBLICATIONS

Dawson, Fred, "Energy saver can support voice and data", Multichannel News, Oct. 21, 1991.

"Schlumberger launches new venture for building automation systems in Europe using Echelon Technology",Bus. Wire, Jul. 13, 1992.

Saladyga, John S., "New home automation systems integrate security, energy and entertainment", Newsday, Inc., Oct. 15, 1992.

Rupinski, Patrick, "New device automatically alerts company of power interruption", (no ref or date).

Niggli, Michael R., "PowerView: Two–Way Customer Communications" (no ref or date).

"Demonstrating smarts; bright home: a demonstration home that utilizes consumer electronics . . . " Popular Science, Jul. 1991.

"Scientific–Altanta, Bell Atlantic To Offer Cost–Effective Information", PR Newswire, Sep. 23, 1991 (Mary Nagelhout).

"Entergy moves into fiber optics to control residential comsumption", Energy Report, Dec. 14, 1992, vol. 20, No. 49 (sr abst).

"Commonwealth Edison installs Metricom's communication network". Business Wire, Mar. 4, 1993.

Sanders, Michele, "Interfacing with the home of the future", Information Access, Apr. 1993.

"PGW to begin automatic meter reader installations in 500,000 homes in June", PR Newswire Assoc., Apr. 2, 1993.

Jones, David A., "Smart Money? Home automation systems", *Builder* Jun. 1993, pp. 162–166.

Millar, Heather, "Smart houses: getting switched on", *Business Week*, Jun. 28, 1993.

"Is DSM having an impact on electric–utility credit ratings?", Electrical World, Aug. 1993.

"Entergy Enterprises' CC2000 test joined by Sprint, Honeywell . . . " PR Newswire Assoc, Aug. 26, 1993.

Kaplan, Daniel, "DSM Monitoring a key issue for utility industry E–source", The Energy Daily, Oct. 5, 1993.

Jones, David A., "Cutting edge; three houses that break the rules and break new groung . . . ", Builder Info Access, Nov. 1993.

Piepmeier, James M. et al, "The tools of competition: differentiation, segmentation . . . ", The Electricity Journal, Nov. 1993.

Colman, Andrew et al, "Competitive edge–Power View: a DSM–focused technology", Fortnightly, Nov. 1, 1993.

Vizard, Frank, "Building the information superhighway", *Popular Mechanics*, Jan. 1994.

"Entergy announces a major development in its residential customer–controlled load manage . . . ", PR Newswire Assoc, Jan. 19, 1994.

McLeister, Dan, "Dramatic changes lie ahead for home automation" Professional Builder & Remodeler, Feb. 1994.

"Cebus (R) power line carrier technologies from Intellon Corp. support home automation application . . . ", PR Newswire, Mar. 1, 1994.

"Honeywell, Oracle Corp. unveil joint technology and marketing alliance", Electric Utility Week's Demand–Side Report, Mar. 3, 1994.

Phillips, Tim, "Welcome to the computerized home", The Guardian, Mar. 10, 1994.

"First Pacific Networks, Central and South West Corp. to conduct energy management project in Laredo, TX", Business Wire, Mar. 24, 1994.

"Johnson Controls makes major entry into home energy automation market, . . . ", PR Newswire, Mar. 28, 1994.

"Re–engineering electric utility metering and communications", Transmission & Distribution, Apr. 1994.

Cain, Charles J., "Metering gets real", Fortnightly, Apr. 1, 1994, pp. 39–40.

"Itron signs $27 million contract with Baltimore Gas and Electric", PR Newswire, Apr. 4, 1994.

"Leading companies demonstrate home automation based on Echelon's technology", Business Wire, Apr. 14, 1994.

Salpukas, Agis, "Big hopes put on electric wires", *The New York Times*, Jul. 6, 1994.

Karve, Anita, "Brainy Buildings", *LAN Magazine*, Aug. 1994.

"LonWorks—the choice in home automation", Motorola, Mar. 1994.

"Home automation: what's in it for utilities?", EPRI, Apr. 1990.

"50 Successful DSM Programs", The Results Center, lists.

"Variable electric rates", Transtext.

"Bell of Pennsylvannia's automatic meter reading could mean greater security and privacy for customers", PR Newswire, Feb. 28, 1990.

"NetComm matures as advanced communication and metering system", Research Newsletter, 4th quarter 1990.

Teletimer Energy Savings Service: "Low–cost—high value building automation".

"PLC features & specifications", Regency Electronics, Inc.

"Using the line sharing switch in power utility load study applications", Teltone Telesolutions, 1993.

Home Automation Laboratories, Fall 1994 Catalog.

"S87C752 CMOS single–chip 8–bit microcontroller", Signetics.

```
struct CUSTOMER
{
                  /42A
    double  cost_kwh;      // Customer's cost per killowatt hour
                  /42B    // electricity usage.
    char    name[21];      // Customer's name
                  /42C
    char    addr[31];      // Customer's address
                  /42D
    char    acct[21];      // Customer's account number

```
struct METER
{                /53A
    unsigned int  cebus_hc;           // CEBus House Code
                 /53B
    unsigned int  cebus_unit;         // CEBus unit code (MAC address)
              /53C
    double current;                   // Last reading recorded
                 /53D
    double current_start [24];        // 24 hour table (1 entry for each hour)
                                      // of first reading for the hour
                 /53E
    double current_reading [24];      // 24 hour table (1 entry for each hour)
                                      // of last reading for that hour
                 /53F
    double mtd [24];                  // 24 hour table (1 entry for each hour)
                                      // of energy usage during that hour (not
                                      // including today).
                 /53G
    double last_month;                // 24 hour table (1 entry for each hour)
                                      // of energy usage during that hour for
                                      // all of last month.
                 /53H
    double ytd [24];                  // 24 hour tabke (1 entry for each hour)
                                      // of energy usage during that hour for
                                      // all of this year to date (not including
                                      // today).

```
struct DEVICE
{
    unsigned short  watts;         // Watts this device uses when on.
                                   // Used to compute POWER usage when
                                   // only off/on status is available.

unsigned short  amps;          // AMPS this device uses when on.
                                   // Used to compute POWER usage when
                                   // only off/on status is available.

unsigned char   volts;         // VOLTS this device uses when on.
                                   // Used to compute POWER usage when
                                   // on;y off/onf status is available.

unsigned char   power_factor;  // The Power factor for this device
                                   // (Power Factor = W / VA
                                   //     W  = Watts
                                   //     VA = Volts * Amps)
                                   // note: in Alternating Current circuits,
                                   // the current is not necessarily in
                                   // phase with the voltage. Hence, the
                                   // product of volts a nd amps does not
                                   // always equal power. IE. a typical
                                   // power factor for an electric motor is
                                   // .8 (80% of the wattage times voltage
                                   // times amps).

unsigned char   load_type;     // resistive, inductive, florescent unsigned char   priority;      // Priority:  0 = Not controlled by power
                                   //                company
                                   //            1 = Last device to be turned
                                   //                off during load shedding
                                   //            2 = Moderate priority
                                   //            3 = First type of device
                                   //                to be turned off during
                                   //                load shedding requests.

unsigned char   circuit;       // Not in use
    unsigned char   code_number;   // X10 address -- Number
    unsigned char   code_lettter;  // X10 address -- Letter
    unsigned int    cebus_hc;      // CEBus house code
    unsigned int    cebus_unit;    // CEBus unit number
    char            desc [13];     // Description (informational filed)
```

FIG. 6A

```
char  location [18];              // Location (informational field)
                    /44L
                    /44M
unsigned char  status;            // Current off/on status
                    /44N
unsighed int  current_hours [24]; // current day's device on count.
                                  // each 'tick' represents 30 seconds of
                                  // on activity.
                    /44O
unsigned int  mtd_hours [24];     // month to date device on count.
                                  // each 'tick' represents 30 seconds of
                                  // on activity.
                    /44P
unsigned int  last_month [24];    // last month's device on count.
                                  // each 'tick' represents 30 seconds of
                                  // on activity.
                    /44Q
unsigned int  ytd_hours [24];     // year to date device on count.
                                  // each 'tick' represents 30 seconds of
                                  // on activity.
                    /44R
char  cebus_noack;                // if a CEBus device, flag to designate
                                  // whether or not to expect an ACK from
                                  // this device
};

struct DEVICE
```

```
struct COMMERCIAL
{
    unsigned short      com-yr; 49A         // year of this interval
    unsigned short      com-mo; 49B         // month of this interval
    unsigned short      com-da; 49C         // day of month of this
                                            //   interval
    unsigned short      com-hr; 49D         // hour of day, this interval
    unsigned short      com-qtr; 49E        // this interval no within
                                            //   hour
    unsigned short      com-id; 49F         // meter id -- in case of
                                            //   multiple meters
    unsigned short      com-interval; 49G   // interval size, in minutes
    double              com-kwh; 49H        // kwh consumed this interval
    double              com-kvah; 49I       // kvah consumed this interval
    double              com-kvarh; 49J      // kvah consumed this
                                            //   interval
    double              com-demand; 49K     // demand this interval
    double              com-min; 49L        // no minutes device was on
                                            //   in this interval
    double              com-mtr; 49M        // meters reading at end of
                                            //   interval
    double              com-inter; 49N      // interval length
};
```

FIG. 7

| | |
|---|---|
| 54 ↘ | |
| DEVICE NO. — 55A | ⎫ |
| VOLTS — 55B | |
| CURRENT (in-∅) — 55C | |
| CURRENT (reactive) — 55D | 54A |
| KWH — 55E | |
| KVAH — 55F | |
| KVARH — 55G | ⎭ |
| VOLTS | ⎫ |
| CURRENT (in-∅) | |
| CURRENT (reactive) | |
| KWH | 54B |
| KVAH | |
| KVARH | ⎭ |

FIG. 9

```
#define MAX_EVENTS 128
                                          56
struct event
{
    unsigned char device;     // device this event acts on unsigned char hour;       // hour that it is to occur (0 - 23)

unsigned char min;        // minute that it is to occur (0 - 59)

unsigned char type_day;   // days of the week during which it is
                              // to occur. Bit 0 = Sunday, Bit 1 =
                              // Monday, etc. If bit set this event
                              // is to occur that day.

unsigned char action;     // Action: 0 = off
                              //         1 = on
                              //         2 + 16 * Dim amount = Dim
};

struct event  events [MAX-EVENTS];
```

FIG. 10

| Date:<br>WED. 12/14/94 | Time:<br>02:12:13 PM | Total Energy Used Today<br>6.0900 KWH $0.49 | Current Energy Load |

Description: Test Device
Location: Kitchen
Priority 0
Monitored: N
Watts: 0
Volts: 0
Amps: 0.0
Load Type: Resistive X10/CEBus X10
X10 Letter: A
X10 Number: 1   OK
              Cancel F10 to Save

FIG. 12

| Date: | Time: | Total Energy Used Today | Current Energy Load |
| WED: 12/14/94 | 02:13:39 PM | 6.0900 KWH $0.49 | |

Description  Location
AIR COND     CRAWL SPACE

Pri Mn? Watts Volt Amps Tp    Address
0                              CEB...0001-0002

ON  12:05a  SMTWTFS
ON   1:30a  SMTWTFS
ON   1:31a  SMTWTFS
ON   1:32a  SMTWTFS
OFF  7:00a  SMTWTFS

Time of day: [12:00]  AM/PM: A    Action: OFF    Days: SMTWTFS
             OK
             Cancel

FIG. 13

| Date:<br>WED. 12/14/94 | Time:<br>02:12:50 PM | Total Energy Used Today<br>6.0900 KWH  $0.49 | Current Energy Load |

| Description | Location | Pri Mn? | Watts | Volts | Amps | Tp | Address |
|---|---|---|---|---|---|---|---|
| AIR COND | CRAWL SPACE | | | | | CEB: | 0001-0002 |
| LIGHTING | HALLWAY | 0 | | | | X10: | A  4 |
| LOW VOLTAGE | HALLWAY | 0 | | | | X10: | C  2 |
| LIGHTING | LIVING ROOM | 0 | | | | X10: | A  2 |

<Enter> Delete     <Esc> Return

FIG. 14

| | | | | | |
|---|---|---|---|---|---|
| Intro...... | Read Meter | Reports | Graphs | Files | Exit | Help |

Current Reading: 0.0000

| Date | Time | KWH | KVAH | KVARH |
|---|---|---|---|---|
| 11/22/94 | 16:00-16:14 | 0.1368 | 0.1682 | 0.0978 |
| 11/22/94 | 15:45-15:59 | 0.1146 | 0.1373 | 0.0756 |
| 11/22/94 | 15:30-15:44 | 0.0624 | 0.0624 | 0.0000 |
| 11/22/94 | 15:15-15:29 | 0.0984 | 0.1044 | 0.0438 |
| 11/22/94 | 15:00-15:14 | 0.1410 | 0.1791 | 0.1104 |
| 11/22/94 | 14:45-14:59 | 0.0792 | 0.0823 | 0.0222 |
| 11/22/94 | 14:30-14:44 | 0.0624 | 0.0624 | 0.0000 |
| 11/22/94 | 14:15-14:29 | 0.1386 | 0.1714 | 0.1008 |
| 11/22/94 | 14:00-14:14 | 0.1092 | 0.1276 | 0.0660 |
| 11/22/94 | 13:45-13:59 | 0.0624 | 0.0624 | 0.0000 |

FIG. 20

Daily Load & Demand for Saturday 9/17/94

| Hour | KWH | KVAH | Hour | KWH | KVAH |
|---|---|---|---|---|---|
| 0: | 0.6582 | 0.7658 | 12: | 2.0856 | 2.5157 |
| 1: | 1.1784 | 1.2544 | 13: | 1.9824 | 2.3850 |
| 2: | 3.3060 | 3.8929 | 14: | 2.0088 | 2.4698 |
| 3: | 1.8120 | 1.9883 | 15: | 0.5634 | 0.6614 |
| 4: | 1.5006 | 1.5996 | 16: | 0.5675 | 0.6632 |
| 5: | 2.1444 | 2.3896 | 17: | 0.5148 | 0.5838 |
| 6: | 1.7826 | 1.9870 | 18: | 1.1142 | 1.3463 |
| 7: | 1.6188 | 1.7550 | 19: | 3.1008 | 3.8782 |
| 8: | 1.3158 | 1.3878 | 20: | 2.1024 | 2.5746 |
| 9: | 0.9606 | 1.0197 | 21: | 1.6626 | 1.9698 |
| 10: | 2.1402 | 2.3621 | 22: | 1.2474 | 1.5355 |
| 11: | 1.7868 | 1.9929 | 23: | 2.5554 | 3.2072 |

Totals: 39.7098 46.1856

| Peak Time | KW | KVA | KVAR | Power Factor | Load Factor |
|---|---|---|---|---|---|
| 2:30-2:44 | 3.8568 | 4.6765 | 2.6448 | 0.82 | 0.43 |

Print  +Day  -Day  Quit

FIG. 22 a, b: LM339

CT1-CT7: BICRON B5303

T1: 10 VAC, 600 ma.

T2: FERRITE RF TRAN.

U3, U4: LM224A

CT1-CT4: COILCRAFT CS60-8

T1: 10 VAC, 600 ma.

T2: FERRITE RF TRAN.

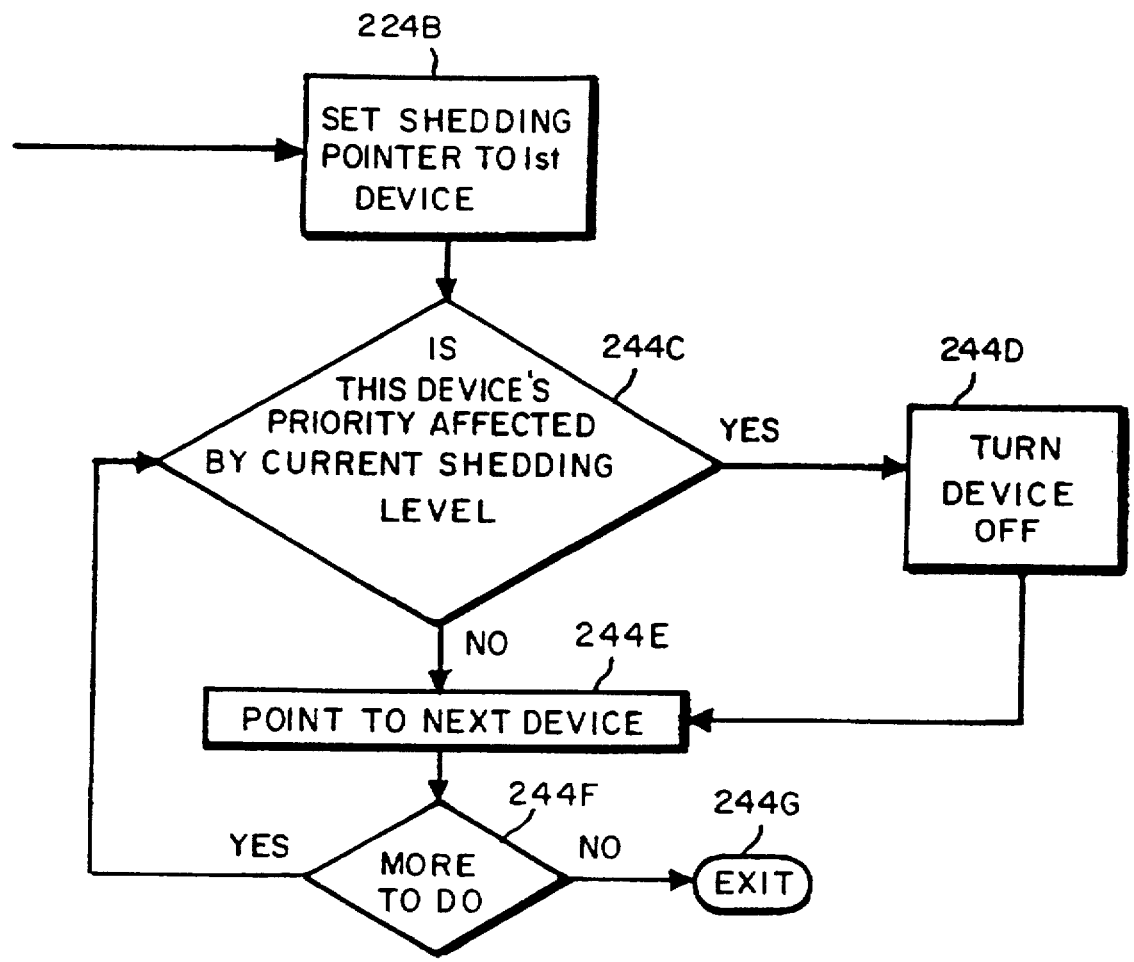
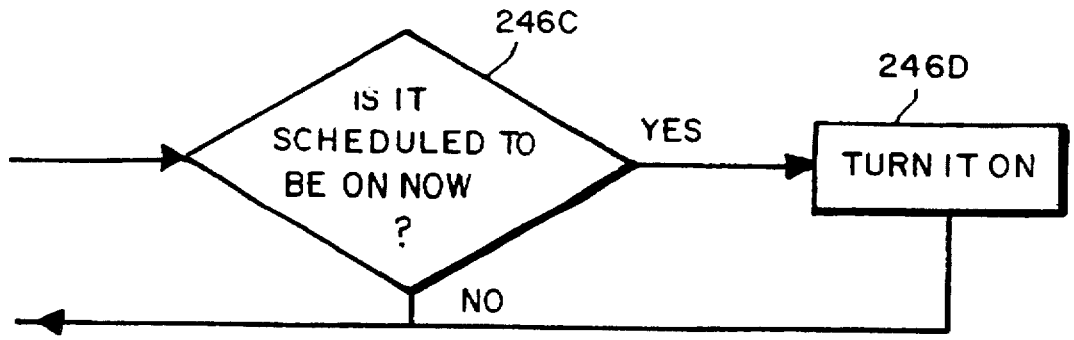
FIG. 28B

ENGERY MANAGEMENT AND BUILDING AUTOMATION SYSTEM

FIELD OF THE INVENTION

This invention relates to the fields of home or business automation and to electrical power distribution system management. More particularly, the invention relates to a computer-controlled system for demand-side management of electrical loads in residential and commercial premises, and for otherwise controlling those loads. The system preferably uses power-line carrier (PLC) technology within the premises for communications between a control computer and the loads, and PLC or RF technology for communications with the facility's (i.e., customer's) local watt-hour meter supplied by the utility company. It may use PLC technology or another communication technology for communications between the utility company and the customer premises. Additionally, the invention relates to the use of such a system for providing a bridge between an external data communication service, appliances, entertainment services and communications devices within a customer premises (e.g., a home).

BACKGROUND OF THE INVENTION

For some years, there has been a great deal of interest in achieving more efficient utilization of electrical power generation capabilities and more sophisticated control of electrical loads by users. With a growing awareness of the ecological impact and economic cost of inefficient utilization of resources, electrical power consumers have become aware of the desirability of altering their usage patterns. Some power companies already offer rates which vary according to the time of day, to encourage customers to operate appliances such as clothes dryers, pool pumps and dishwashers during off-peak times. Generally, a high rate is charged during certain hours of peak demand and a lesser rate is charged during other hours of off-peak demand. An alternative approach would permit extension of time-of-day rate setting to allow more frequent (e.g., hourly) changes in rates. That would require, though, that the customer be advised of each rate change and then decide what appliances the customer is willing to operate at such rate. To automate this process, it is necessary that the power customer be able to monitor and control power usage by the more significant loads in the customer's residence or business.

However, the customer typically sees the benefits of time-managed appliance usage only when studying a monthly bill, which provides very little information. The customer does not really know, under real usage conditions, how much it costs to operate one appliance compared with another. To make these cost comparisons using monthly billing statements probably is not practical because it is not realistic to conduct a multi-month-long controlled experiment wherein all other energy consumption is constant except for the use of a first appliance one month and the use of a different, second appliance another month. Without such a controlled experiment, one cannot determine, from a monthly bill, the cost of operating a specific appliance or even the comparative cost of operating two different appliances, or how much will be saved by operating a given appliance at any specific rate. Accordingly, a need exists for a system which will provide to a customer, on a timely basis, reports on the amount of power consumed by one or more appliances and the cost of operating those appliances.

A need further exists for allowing a customer to make cost-based decisions as to the operation of appliances, and for effectuating those decisions. Many utility customers may wish to control their expenditure for electric power. For example, the customer might be willing to operate a swimming pool heater only so long as the energy cost is below an amount set (i.e., predetermined) by the customer, or only so long as the outside temperature is in a certain range. As yet another example, the decision to replace an aged, inefficient appliance may be deferred by a customer who does not know how quickly a new, more efficient appliance will pay for itself through reduced energy consumption because the consumption by the old, existing appliance is not known. Commercial customers may be enabled to make process selection decisions based on relative energy costs, if those costs can be demonstrated.

Since the rates charged for electric energy are at least in part a function of system-wide demand at the time (as, for example, reflected in fuel cost), a customer with a fixed budget can consume more power when rates are low than it can when rates are higher. Therefore, such a customer may wish to be able to make usage decisions which are rate-dependent. Of course, if rates can be changed by the utility company at any time, the customer is not likely to want to sit around listening to or watching broadcasts of rate information. An automatic response to rate broadcasts would be desirable. Such an automatic response could assume many forms and might be conditioned not only on the newly announced rate, but also on other factors, such as the sensed temperature or time of day or urgency of a task (e.g., appliance priority level). The inability to respond automatically may be one of the factors which has inhibited the development of flexible rate-change broadcasting, existing rate-change broadcasting being limited generally to signaling the beginning and end of peak and off-peak rate periods.

Allowing customers to control their usage patterns and implement usage decisions, though, only deals with one aspect of power management. Sometimes the voluntary. behavior of customers is not enough to avert problems such as excessive power demands. Ideally, a load management system would allow not only the user, but also the power supplier (i.e., utility company), to have at least some degree of control over the loads connected to the power mains.

These interests have lead to a variety of systems for allowing control functions such as "load shedding" (that is, selectively turning off devices, or loads) to be performed. For example, there are numerous home and building automation systems both available commercially and available in the literature. Many of these automation systems allow the user to schedule appliances to turn on, or to be operated, only at defined times. Some allow specially-equipped appliances to be rendered inactive during periods of declared higher rates or demand. Few, if any, though, allow the power supplier (in addition to the customer) also to remove loads from the system selectively (e.g., to target specific loads of specific customers) or allow them only to turn on at or during preset times.

In the event of a power outage, as may occur from a natural event, such as a storm, or the development of an excessive load, as may occur from an extreme weather situation (e.g., a heat wave or unusual freeze), a great problem is presented to electric utility companies. The instant power is restored or a large disconnected load is brought back on line, the energization of all the loads connected to the power distribution grid or the reconnected loads, as the case may be, causes a huge current surge which can induce a large transient voltage spike due to load, line and transformer inductances, and which can destabilize the power distribution network and cause damage to equipment connected to the power mains. Safety features may cause substations and generators to be switched off-line, to protect equipment from damage, at the very moment the substations and generators are needed to be on-line to meet load demands. The prevention of such occurrences is one reason electric utility companies will have radio stations broadcast requests, during such outages, for customers to turn off appliances and other loads until after power is restored. If a utility company were able to control and diversify, from a central location, the restoration of power to loads in its service area, it would be able to greatly reduce the threat of, and problems of dealing with, such transients. A utility company, or a governmental entity, might also wish to distribute power selectively to certain types of loads, or withhold power from certain types of loads, during problem situations. For example, during natural disasters and peak load times such as excessively hot summer days, it may be a valid power system management plan to ration power delivered to specific customers, or to specific appliance types, such as water heaters, pool pumps, air conditioners, or low priority (i.e., non-essential) loads in general, in order to prevent generator or distribution system problems. Employing this approach, it may also be possible for the utility company to avoid the expense of building substation or generation capacity solely to be able to withstand such extreme situations.

Other service providers (e.g., water authorities, gas suppliers and cable television companies) have expressed the desire to interact with their customers, also, but so far the systems for doing so are limited and of limited value in light of the cost of installing a pervasive communications network and flexible control systems.

In view of the foregoing, it should be apparent that there exists a need for an automation system for monitoring energy (power) consumed not only by a residential or commercial utility customer as a whole, but also by specific loads operated by the customer. A need further exists for an automation system which is easily operated by a utility customer to permit the customer to control operation of such loads. Desirably, the system will permit the customer to program loads to function or not function in response to energy rate information supplied by the power company and parameters supplied by the customer. In addition, there exists a need for a system that also permits the power company to control selectively such loads.

SUMMARY OF THE INVENTION

Such an automation system according to this invention includes a local area network preferably based on a home automation data bus such as the CEBus of the Electronic Industries Association, components for implementation of which are marketed by Intellon Corporation of Ocala, Fla. Each load to be controlled by the automation system is connected to the bus via a control module. A control module may contain a relay or switch (hereafter referred to as a "breaker" or "circuit breaker") to disconnect the load from the mains upon command or upon occurrence of a power outage, or in either case. In addition, a control module may contain a current monitor for determining whether a connected load is drawing current or a power monitor for monitoring the power consumed by the load (from which energy consumption may be calculated). The power monitor may place on the bus, in response to a query message, data regarding the power being consumed by the load. Both types of monitors may place on the bus messages to indicate load status or changes in load status. Another type of load control module may contain a dimmer circuit (for a module used with a lamp) or a speed control circuit (for a module used with a motor). Thus, various types of control modules are contemplated. The system further preferably includes a pair of microcomputers. A first microcomputer preferably is placed externally to the customer premises, adjacent to (or even within the housing of) the electric utility power meter. A second microcomputer preferably is placed inside the customer premises. The two microcomputers are equipped to communicate with each other and with the various load control modules via the network/data bus (e.g., using CEBus transceivers implementing the CEBus protocol); additionally, at least the first microcomputer preferably is equipped to communicate with the utility company via any appropriate communications link (such as a power line carrier system, radio, telephone, optical fiber or by use of a cable television network). Preferably the electric utility meter is of a type which can be remotely read; for this purpose, the meter preferably is provided with a CEBus interface unit which includes a bus transceiver, so that the meter can be read using commands sent over the bus. Thus the utility's watt-hour meter preferably is readable by at least one of the microcomputers via the network/data bus. Any implementation of the CEBus protocol can be used, including the power-line carrier version, RF version or infrared transmission version. The use of CEBus power-line carrier technology is preferred. Networks of design other than the CEBus can be used, as well, though, with appropriate modifications; one example would be Echelon's LONWORKS. When the network/data bus is the CEBus system or other power-line carrier technology, all data communication within the customer premises may occur over the ac. power lines. This means the system can be installed in any existing, already-wired premises without the need for installing special or extra wiring. However, the design of the system is sufficiently flexible that in new construction it is possible to separate switches from loads; the two need not be in series, so switching circuits can be operated at low voltages and currents, for enhanced safety and cost savings. That is, since appliances can be turned on and off via breakers in their control modules and those breakers are controlled via CEBus signals on the power mains, any circuit that can impose the right signals on the mains can effectuate operation of the appliances. In addition, significant savings in wiring of new residential and commercial facilities can be achieved as CEBus-compatible lighting and appliances come on the market The second microcomputer inside the premises serves, in part, as an input/output terminal for the system, allowing the customer to set parameters and query the system as to power usage information. It displays reports requested by the customer and also displays messages transmitted by the utility company and by either microcomputer. The first microcomputer acts as a master controller, communicating with the world outside the premises and being the primary data collector and operator of load control modules, with the second microcomputer acting as an input/output subsystem (accepting customer input, and providing or displaying messages and reports to the customer), providing certain backup functions, and, if desired, acting as a secondary controller. Optionally, the first microcomputer may be used, as well, as a server for devices communicating with it via the network/bus. These devices may be "dumb" terminals or intelligent units. As one example, the devices may be communications ports for various media, with the first microcomputer acting as a router between those ports or between any of those ports and one or more dumb terminals or intelligent units. Another example may be a handheld device which interacts with the first microcomputer, the latter providing programs, computational support and communications or other functions which would allow the cost of the handheld device to be reduced; that is, the handheld device can utilize capabilities already present in the first microcomputer. An illustration of such a handheld device might be a game player or a cable television controller. For example, the cable television signal, particularly when it is a compressed or scrambled digital signal, may be routed into the first microcomputer for decompression and/or descrambling, then converted to analog video by a board (such as the TV Coder from Creative Labs, Inc.) on the first microcomputer's internal bus. The analog television signal can then be distributed to the household television sets. When a digital television set is available, a compressed or scrambled digital signal may be routed into the first microcomputer for decompression and/or descrambling, then the decompressed, descrambled digital video signal may be fed to the digital television set. A handheld controller may interface to the first microcomputer via the PLC or RF CEBus or other communications channel, to indicate to the first microcomputer the channel (program) the user desires to view or the service the user desires to obtain. The first microcomputer may execute a program to verify the user's authorization and communicate with the cable television company's computer to provide billing or other information. This allows great flexibility in both ordering and providing cable television programming; for example, a pay-per-view system is readily created as the first microcomputer can send to the cable television provider a message as to the channel selected by the user, the time covered by the selection and other information the provider may desire. Private text messages may also be exchanged between the user and the cable television (or other information) provider, allowing the customer to view his or her account information either on the television or on the display of the second microcomputer. The handheld controller may also be used to select from among available functions which can be implemented at the first microcomputer, such as generation of a picture-in-picture display, and the first microcomputer can then execute the necessary processing to provide the selected functions.

By monitoring power consumption of not only the premises as a whole, but also of individual loads, the customer can be and is provided a great deal of information which allows the customer to make decisions about load utilization. Some of these decisions may be conditioned on the rate(s) charged by the electric utility, which may be broadcast by the utility to the customer from time to time. The utility company can also access selected utilization data and can also control at least some of the customer's loads via messages to the first microcomputer when the customer subscribes to or authorizes the utility company to perform such services.

The system of this invention also has uses independent of load management. Quite independently, it can be used as a communications interface between devices in a residential or commercial premises on the one hand and an information or service provider or utility on the other hand.

As used below, the term "utility company" shall, unless it appears otherwise from the context, be understood to include a utility that distributes electric power and which may or may not be the direct generator of that power. However, many aspects of the invention will have value to other utility and non-utility service providers, as well. The foregoing and other features, advantages and object of the present invention will become more apparent and be more readily understood from the following detailed description, which should be read in conjunction with the accompanying drawing.

BRIEF DESCRIPTION OF THE DRAWING

In the drawing,

FIG. 5 is a diagrammatic illustration of a first data structure according to the aforesaid embodiment;

FIG. 6 is a diagrammatic illustration of a second data structure according to the aforesaid embodiment;

FIG. 7 is a diagrammatic illustration of a third data structure according to the aforesaid embodiment, particularly for use in commercial premises;

FIG. 8 is a diagrammatic illustration of a fourth data structure according to the aforesaid embodiment;

FIG. 9 is a diagrammatic illustration of a fifth data structure according to the aforesaid embodiment;

FIG. 10 is a diagrammatic illustration of a sixth data structure according to the aforesaid embodiment;

FIG. 12 is an illustration of an exemplary input screen according to the invention, for allowing a customer to enter certain device-specific information;

FIG. 13 is an illustration of an exemplary input screen according to the invention, for allowing a customer to schedule certain events;

FIG. 14 is an illustration of an exemplary input screen for allowing a customer to delete load devices from the system;

FIG. 20 is a pictorial illustration of an exemplary screen showing meter readings in response to the user selecting the Read Meter function on the screen of FIG. 19;

FIG. 22 is a pictorial illustration of an exemplary screen showing a Daily Load and Demand report when the user chooses that type of Report on the screen of FIG. 21;

DETAILED DESCRIPTION

Figure 1:
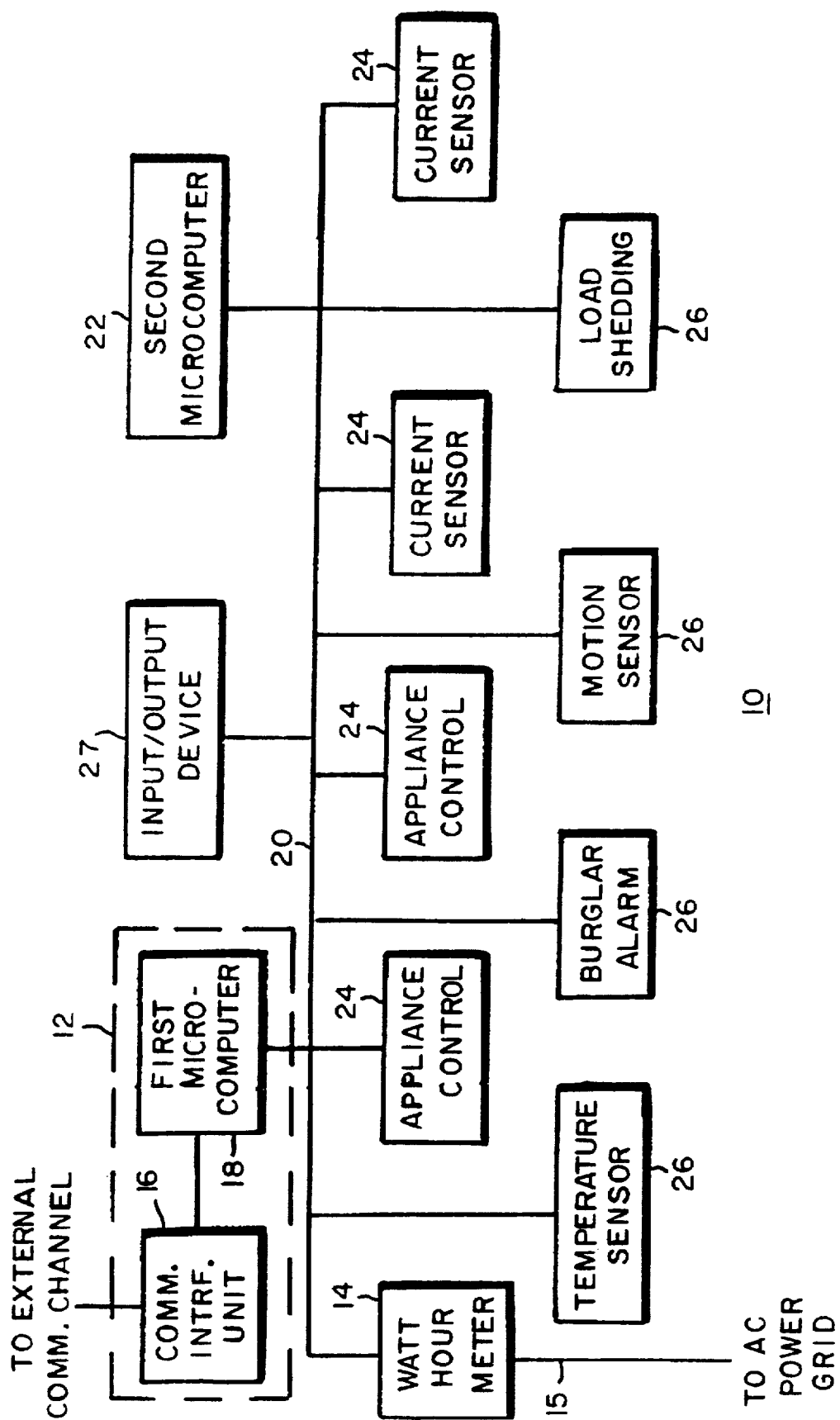
FIG. 1 is a block diagram of an illustrative embodiment of a system according to the present invention.

Turning now to FIG. 1, there is shown a block diagram of an exemplary implementation of an energy management system according to the present invention. The system 10 includes a customer premises external unit (CPEU) 12 which includes a communications interface unit 16 and a first microcomputer 18; a local area network communications medium 20, which in the exemplary form discussed below is a power line carrier (PLC) bus; a second microcomputer 22; a plurality of load sensing and/or load control modules 24; one or more condition detectors 26 (e.g., temperature sensors, motion sensors, burglar alarms, and so forth); and computer programs (hereinafter detailed) executed on the two microcomputers for implementing a variety of functions including, but not limited to, one or 'more of the functions explained below. Preferably, the system also includes an electrically-readable watt-hour (i.e., energy usage) meter 14 through which electric power is supplied to the rest of the system from ac distribution mains 15. The load control modules 24 may be of differing types; for example, some may be simple on-off switches, while others may include current or power sensors. Additionally, the system optionally may include one or more other dedicated, single- or multiple-purpose input, output or input/output devices, shown generically at 27, all using the bus 20 to communicate with the first microcomputer and using the computing capacity of the first microcomputer, on which any desired program may be executed. These additional devices can meet the customer's communication and information needs in a variety of diverse areas.

In all cases, the supply of ac power to the computers, loads and other devices on the bus is omitted for clarity. Also, each computer or other device must have a bus interface unit to connect to the bus and implement the bus protocol; these interface units are implied, not shown explicitly, to avoid obfuscation.

Figure 2:
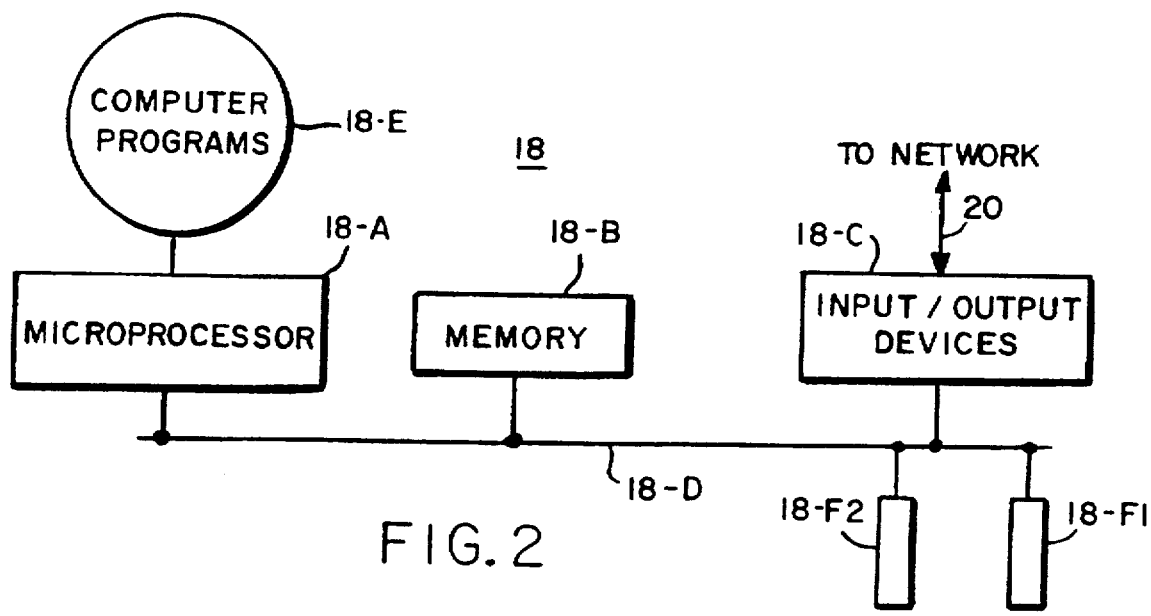
FIG. 2 is a block diagram of a first microcomputer according to the illustrative embodiment of FIG. 1.

The two microcomputers may, for example, both be IBM-compatible personal computers running a version of the DOS operating system of IBM or Microsoft on an Intel x86 family processor, PowerPC family microprocessor, or equivalent. In an exemplary embodiment, it is contemplated that the first microcomputer will employ as a processor a Power PC 403 GA embedded controller from International Business Machines Corporation of Armonk, N.Y. and Research Triangle Park, N.C. (IBM) and that the second microcomputer will employ any Intel x86 family processor or equivalent. Both processors may run a version of the DOS operating system and be interrupt-driven; however, it is preferred, particularly when the first microcomputer is to act as a server, as herein discussed, that the first microcomputer run a multitasking operating system such as the OS/9 operating system from IBM, with the programs described herein being written in the Ultra C programming language from Microware Systems Corp. of Des Moines, Iowa. Of course, other processors and operating systems may be employed; the choice of processor and operating system is not a critical aspect of the invention. However, the use of an industry-standard microcomputer architecture has the advantage of reducing costs and making readily available a variety of input/output accessories such as modems, routers, brouters and other communications products. A block diagram of the first microcomputer is shown in FIG. 2. As shown there, microcomputer 18 includes a microprocessor 18-A, memory 18-B; at least one input-output (I/O) device 18-C, one or more computer programs 18-E executing on the microprocessor 18-A; and one or more internal busses 18-D over which these elements communicate. The computer programs 18-E interact with data in data structures stored in memory 18-B to control the operation of the first micrcomputer. The input-output devices 18-C include at least one device for communicating with the utility company and one device for communicating with the second microcomputer and the load control modules and one device for interrogating the watt-hour meter. If power-line carrier technology is used to perform all of these communications, it may be possible to use a single I/O device 18-C; otherwise, a separate I/O device may be needed for one or more of these communications services. Connectors may be provided on one of the busses 18-D, for example, to receive plug-in circuit cards for I/O devices. The bus and connectors preferably will conform to an industry standard interface such as the ISA or PCMCIA standards. For example, an ISA radio-frequency network interface (including a transceiver and control logic) card may be plugged into one connector 18-F1 for use in communicating between the system and the utility company, while a CEBus interface node (i.e., transceiver and control logic) may be plugged into another connector 18-F2 for use in communicating between the first microcomputer and the load control modules. The memory 18-B preferably includes some amount of non-volatile memory in which there may be stored data structures including, among other things, historical data which is desirably retained even during power outages and interruptions; flash RAM is believed appropriate for this purpose, though other memory types would suffice. The first micrcomputer requires no keyboard and no display (except that they may optionally be provided for installation and diagnostic use). Preferably, it is contained in a waterproof and weather-tight housing on or immediately adjacent the customer premises' exterior wall, next to the watt-hour meter, at the electric service entrance to the premises.

Figure 3:
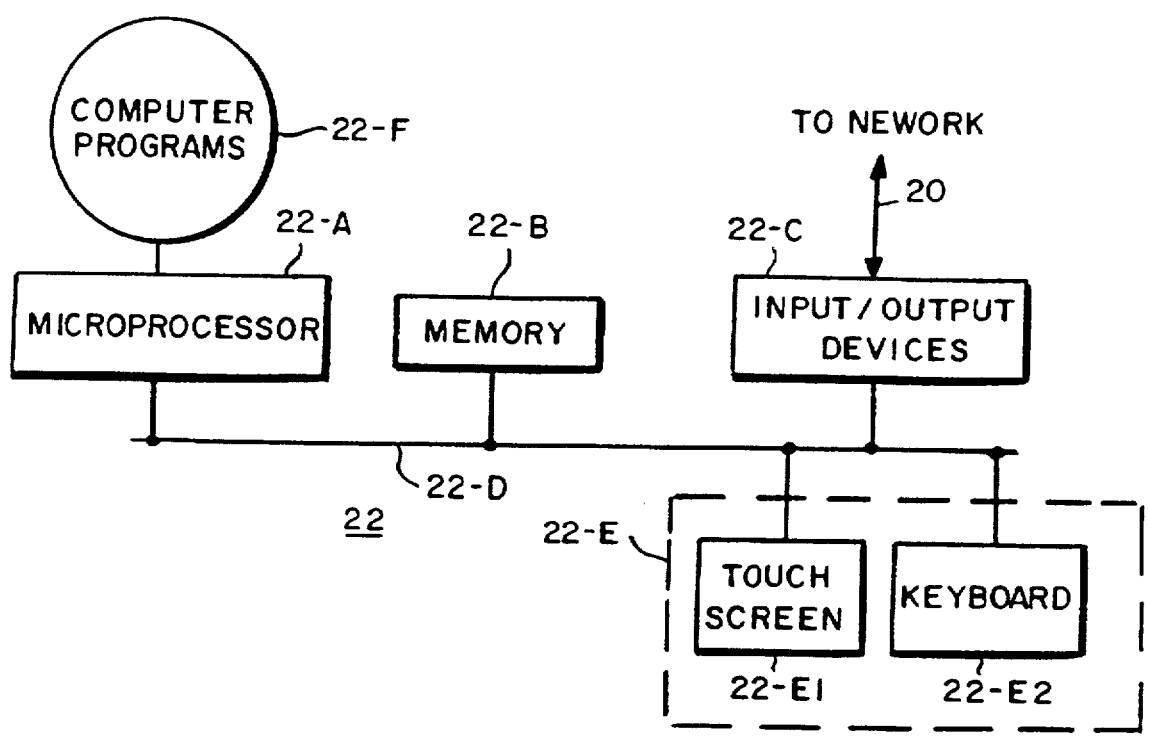
FIG. 3 is a block diagram of a second microcomputer according to that embodiment.

A block diagram of the second microcomputer 22 is shown in FIG. 3. As shown in FIG. 3, the second microcomputer 22 includes a microprocessor 22-A, memory 22-B, a user-interactable I/O subsystem 22-E and a further I/O subsystem or device 22-C, all communicating via one or more internal busses 22-D. Computer program(s) 22-F is(are) executed by microprocessor 22-A to implement the functionality of microcomputer 22. The second microcomputer may be located at any convenient place in the customer premises. It may, in fact, be a microcomputer that the customer already owns, provided it has or is provided with an appropriate network/bus interface (e.g., a CEBus PLC interface) for communicating with the first microcomputer, and appropriate computer programs as explained herein.

The user-interactable I/O subsystem 22-E may include, for example, a touch screen 22-E1 for displaying visual output and for receiving input selections from the user. If desired, a keyboard 22-E2, voice-recognition or other input device (not shown) may be added, as well. (Though all I/O subsystems are shown communicating via the bus(ses) 22-D, it should be understood that it is common practice for keyboards to communicate with microprocessors via special keyboard handlers which are not shown to avoid details irrelevant to an understanding of the invention.) I/O device 22-C includes at least one device for communicating with the first microcomputer; as stated above, preferably power-line carrier technology is used to perform all of these communications. A connector (not shown) may be provided on one of busses 22-D, for example, to receive a plug-in circuit card for the I/O device. The bus and connectors preferably will conform to an industry standard interface such as the ISA or PCMCIA standards. For example, a CEBus interface may be plugged into one such connector for use in communicating with the first microcomputer.

The system of FIG. 1 employs a first computer program, CPEU_PGM, running on the first microcomputer and a second computer program, USER_PGM, running on the second microcomputer. The CPEU_PGM program is the main control program. It initiates load (current and power) monitoring, stores historical data, performs watt-hour meter reading, executes requested load turn-on/turn-off events and monitors communications from the utility company. Also, it may perform a variety of other functions as specified herein; or these other functions may be implemented by other programs which may be concurrently executed under a multitasking operating system or selectively executed in response to appropriate interrupt signals. The USER_PGM program is the customer's interface to the system; it assembles historical data from the CPEU_PGM program and formats that data into reports for the customer, permits the customer to schedule timed turn-on/turn-off events and transmits those events to the CPEU_PGM program for execution. Given this allocation of roles, it is also foreseen that some customers may desire to employ multiple second microcomputers, each executing the USER_PGM program. In this arrangement, the first microcomputer executing the CPEU_PGM program acts as a file server and becomes the hub of an information and control system, with both internal and external (to the premises) sources of information and communications services.

Figure 4:
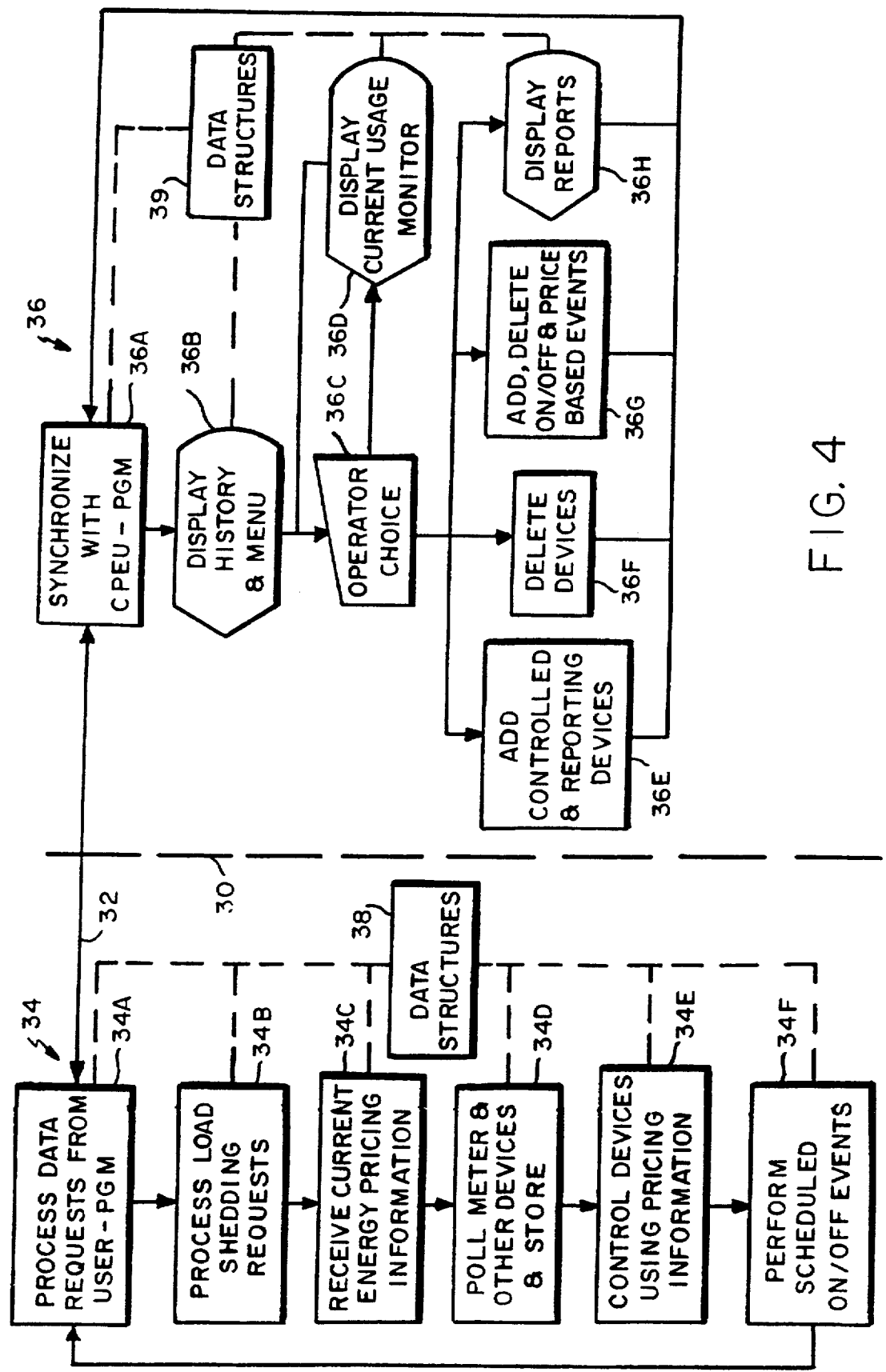
FIG. 4 is a combination block diagram and high-level software process diagram/flow chart for a first embodiment of the programs executing on the microcomputers of FIGS. 2 and 3.

In greater detail, a high level software process diagram/flow chart is shown in FIG. 4. There, the structure of the CPEU_PGM program 34 is shown to the left of dashed line 30, while the structure of the USER_PGM program 36 is shown to the right of dashed line 30. Communication between the CPEU_PGM program and the USER_PGM program is indicated by line 32.

The CPEU_PGM program 34 comprises six modules: Process Data Requests module 34A, Process Load Shedding Requests module 34B, Receive Current Energy Pricing Information module 34C, Poll and Store module 34D, Control Devices module 34E and Perform Scheduled Events module 34F. These six modules are executed sequentially, in a loop, as shown. During each execution of the modules, however, the entire task that is assigned to the module is not completed but, rather, a segment of the task is completed. The segment generally completes the module's operations with respect to one device, event or other appropriate quantum. For example, the Poll Meter module, 34D, initiates a reading of the watt-hour meter by issuing a CEBus inquiry message during the first pass through the module, starts a timer and leaves (i.e., sets) a status flag (not shown) in a predetermined memory location, to indicate that the reading was initiated. On successive passes through the module, the status flag is checked and upon determining it is in the set condition, the reading is completed and the data retrieved; then the flag is reset. Similarly, the Control Devices module, 34E, deals typically with only one entry in the DEVICES data structure on each pass. In this case, a devices pointer, as explained below, is recorded in a predetermined memory location and is used to control the module's operation from pass to pass. The devices pointer identifies the device to be processed by the module on the next pass. It is updated after each pass through the module. Pointers are also used for segmenting the controlling of scheduled events and load (device) shedding. This segmentation of the modules' tasks avoids the processing delays that would occur in the case of tasks that require several seconds to complete once they are initiated, allowing control to pass to potentially more urgent tasks such as the timely receipt of a load shedding command. The operations of modules 34A–34F are further described below.

The USER_PGM program 36 comprises eight modules 36A–36H in a more complex interrelationship. Synchronize with CPEU_PGM module 36A manages all communications with the CPEU_PGM program 34. From Synchronize with CPEU_PGM module 36A, control flows to a Display History and Menus module 36B. From Display History and Menus module 36B, control flows to Operator Choice module 36C. The Display Current Usage Monitor module 36D operates from or within the Operator Choice module and shows, in a portion of the display screen, the current power usage and other selected information; at least a portion of the remainder of the screen displays operator choices which are available from the Operator Choice module. Following receipt of operator input obtained by the Operator Choice module 36C, one or more off our modules 36E–36H are executed to take appropriate action in response to the operator input. Add Controlled and Reporting Devices module 36F adds to the system a device (i.e., load) which is to be controllable by or which is to report to the system. Delete Devices module 36F removes from the system (i.e., from the data structures discussed elsewhere) a device (i.e., load) which is to be controllable by or which is to report to the system. Add/Delete On/Off Events module 36G records in the system control store any changes as to timed or conditional events for turning loads on or off. If the device is one which can, in addition to being turned on and off, also be dimmed (such as certain X10 type lighting controllers and CEBus dimmer modules, for example the Intellon TCM1036 module), then an on/off event also can include a field to set the dimming level (e.g., percentage of full scale) for the device. (The X10 protocol is a commercially-established standard for PLC-controlled devices and is an alternative to the CEBus protocol.) Finally, Display Reports module 36H displays on the output device of the second microcomputer any reports requested by the user. From modules 36E–36H, control reverts to the Synchronize with CPEU_PGM module 36A to send data to or receive data from the CPEU_PGM program 34, if there is information to exchange.

Before returning to a description of the CPEU_PGM modules, it should be understood that information about the loads at the customer premises and about the energy and power usage of those loads and of the premises as a whole is maintained in a data structure or structures indicated collectively at 38 (FIG. 4) and physically located in memory 18-B. When it is turned on, the second microcomputer maintains a substantially duplicate set of data structures 39 in its memory 22-B. (Memory 22-B preferably includes a hard disk drive or other nonvolatile storage media for holding data structures 39, in addition to RAM or other temporary storage. ) In discussing these data structures, the following convention will be used: in the text, the names of data structures will be given in upper case (though in the drawing, lower case will be used); the names of parameter fields will be given in the text using italics (though roman type will be used in the drawing).

Turning now to FIG. 5, a first data structure 42, CUSTOMER, contains several fields for receiving and storing information (parameters or variables) about the customer, such as the energy rate or rate code under which the customer is charged, cost_kwh, field 42A; the customer's name, name, field 42B; the customer's address, addr, field 42C; and the customer's account number, acer, field 42D. (The size of each field is a matter of design choice; indeed, a given field, such as the addr field, may be subdivided into smaller fields for constituent information such as the street, city, state and zip code portions of an address.) If multiple rates apply to the customer's charges, such as different rates for power consumed at different times of the day, there may be multiple cost_kwh fields; to switch between applicable rates, the utility company may broadcast a command to switch to another field for selecting a rate or the CUSTOMER data structure may also have fields for relating the cost_kwh fields to the associated times they apply.

A second data structure 44 (FIG. 6), DEVICE, is arranged as a table having one entry per load device to be monitored or controlled. For each load, the data structure preferably maintains substantially the following information in separate fields: the power the device normally consumes when it is turned on, watts, 44A; the current the device normally consumes when it is turned on, amps, 44B; the voltage across the device when it is turned on, volts, 44C; the power factor for the device if it is a reactive load, power_factor, 44D; a code indicating the kind of load the device is—e.g., resistive, inductive or fluorescent, load_type, 44E; the priority code for the device, to be used in load shedding operations (explained below), priority, 44F; a first address code, code_number, 44G, which may be used as the "number" field of the device address for an X10 type of device; a second address code, code_letter, 44H, which may be used as the "letter" field of the device address for an X10 type of device; a third address code, cebus_hc, 44I, which may be used as the house code for a CEBus type of device; a fourth address code, cebus_unit, 44J, which may be used as the unit number for a CEBus type of device; a description of the device (text) supplied by the customer, desc, 44K; a textual statement of the device location as supplied by the customer, location, 44L; the current on/off or other status of the device, status, 44M; a count representing how long (cumulatively) the device has been turned on for the current day, current_hours, 44N; a count representing how long (cumulatively) the device has been turned on for the current month, mtd_hours, 44O; a count representing how long the device was turned on during the prior month, last_month, 44P; a count representing how many hours the device has been turned on for the year, to the current date, ytd_hours, 44Q; and a flag to designate, for a CEBus device, whether it will give an ACK signal, cebus_noack, 44R. Additional fields may be added as required and any of the foregoing fields not required in a particular embodiment (other than the illustrated embodiment) may be omitted, of course, the data structures shown in the drawing being illustrative only. For example, multiple instances of pairs of fields 44A and 44B may be provided for those devices which are capable of multiple consumption levels (e.g., multispeed motors). Those skilled in the field of computer programming will recognize the data structures to be shown using the notation of the C programming language. However, the use of the C language is not intended as limiting; any convenient programming language can be employed for implementing the processes and data structures of the invention.

In an exemplary embodiment, the data in fields 44N–44Q may be quantized in units of any convenient size, it being only a matter of design choice as to how frequently the data should be sampled and stored. An interval of thirty seconds per storage event is believed to provide a reasonable tradeoff between the amount of memory needed to store the data and the information that will be available in reports. That is, watt-hour meter output "ticks," which occur once per a predefined amount of energy consumption, are accumulated and the meter is read and its reading stored to a data file once every interval—e.g., once per thirty seconds.

For commercial customers or others who have significant reactive loads, the DEVICE data structure may be supplemented with (or if desired, perhaps even replaced by) a COMMERCIAL data structure 48 (FIG. 7). This data structure may have, for example, fields 49A–49N containing information such as the consumption calculations for the device over a chosen interval in terms of kwh (48H), kvah (48I), and kvarh (48J); an identification of the interval by interval number or by time (e.g., year, 49A; month, 49B; day, 49C; hour, 49D; and location within the hour, 49E); the interval size, in minutes, 49G; the number of minutes the load was turned on during said interval, 49L, or, equivalently, the time(s) the load was turned on or turned off during the interval; the demand during the interval (i.e., kwh times 60 minutes divided by the interval length, in minutes), 48K; the relevant meter identification number, in the event there are multiple meters at the premises, 48F; the meter reading at the end of the interval, 48M; and if the interval length is not fixed, the length of the interval, 48N. The date and time fields are optional because the data structure can be made self-indexing as to date and time. If a recording is made, for example, every fifteen minutes, using a flash memory as a circular queue, then the position in the queue (i.e., the address in memory of an entry relative to the current entry) indicates unambiguously how old the entry is relative to the current date and time. Using fifteen-minute recording intervals, only about 2MB of storage is needed to record two-years' data.

Referring to FIGS. 8–10, additional data structures maintained by the system include a meter history table (METER) 52, a device history table (DEVICE HISTORY) 54 for at least each device whose power consumption is monitored, and a TIMED (i.e., scheduled) EVENTS list 56 (also called an Event table).

The METER table 52 may contain fields 53A–53H, for example, recording information pertinent to each meter reading. This information may include some or all of the following: the CEBus house (or commercial premises) code, cebus_hc, 53A, which forms a first part of the meter's electronic address; the CEBus unit code, cebus_unit, 53B, which forms a second part of the meter's electronic address; the last meter reading recorded, current, 53C; in a first table having twenty-four entries—one for each hour of the day, the first meter reading for the corresponding hour, current_start, 53D; in a second such table, the last meter reading for the corresponding hour, current_reading, 53E; in a third such table, by hour, the accumulated energy used that month, exclusive of the current day, mtd, 53F; in a fourth such table, the total energy used, by hour, for all of the previous month, last_month, 53G; and in a fifth such table, by hour, the total energy used for the entire year to the current date but exclusive of the current day, ytd, 53H.

The DEVICE HISTORY table 54 (FIG. 9) (one per monitored device, which preferably is named in the table at 55A) stores, per measurement interval, a record containing data arranged in a predetermined pattern. To more graphically illustrate the data structure's configuration, it is shown diagrammatically, rather than using C code. Following the device name, device no. (55A), two consecutive records 54A and 54B are shown. Each record includes fields in which are recorded one or more of the following: the measured voltage, volts, 55B; in-phase current, current(in-phase), 55C; reactive current, current(reactive), 55D; kwh consumed in the interval, kwh, 55E; kvah consumed in the interval, kvah, 55F; and, for reactive loads, kvarh consumed in the interval, kvarh, 55G. If the address in the table for the record (i.e., the first entry thereof) correlates (via an indexing scheme, for example) with the date and time of the table entry, it is not necessary to record explicitly as part of the record the date and time, as they can be calculated. For example, if a table entry is made every fifteen minutes and consecutive entries are made in consecutive locations, it is readily ascertainable that the tenth entry before the current entry was made in the interval associated with one hundred fifty minutes ago. If the device voltage may be presumed constant, then the field volts need be provided only once in the table, instead of in every record. Accordingly, if the measurements for a device consume eight bytes per field (a reasonable number) and a set of measurements (comprising kwh, kvah and kvarh) is stored every fifteen minutes, then two years' history on a device can be stored in about 1.7 MB. This can be reduced by not storing kvah and, instead, calculating it from the relationship $(kvah)^2=(kwh)^2+(kvarh)^2$. If the record addresses in the table are not indexed in the aforesaid manner, it may be necessary to include in the record fields containing the date and time of the interval, as well. Each field recorded in each record will consume a little over one-half megabyte to cover a two-year interval.

The organization shown for each of the data structures discussed herein is exemplary only; other appropriate data structure organizations will readily occur to those skilled in the art and computer scientists assisting them. Other suitable data structures can be created and maintained, including various hybrids of the DEVICE and COMMERCIAL data structures, it being understood that different customers will have different informational needs.

Figure 11:
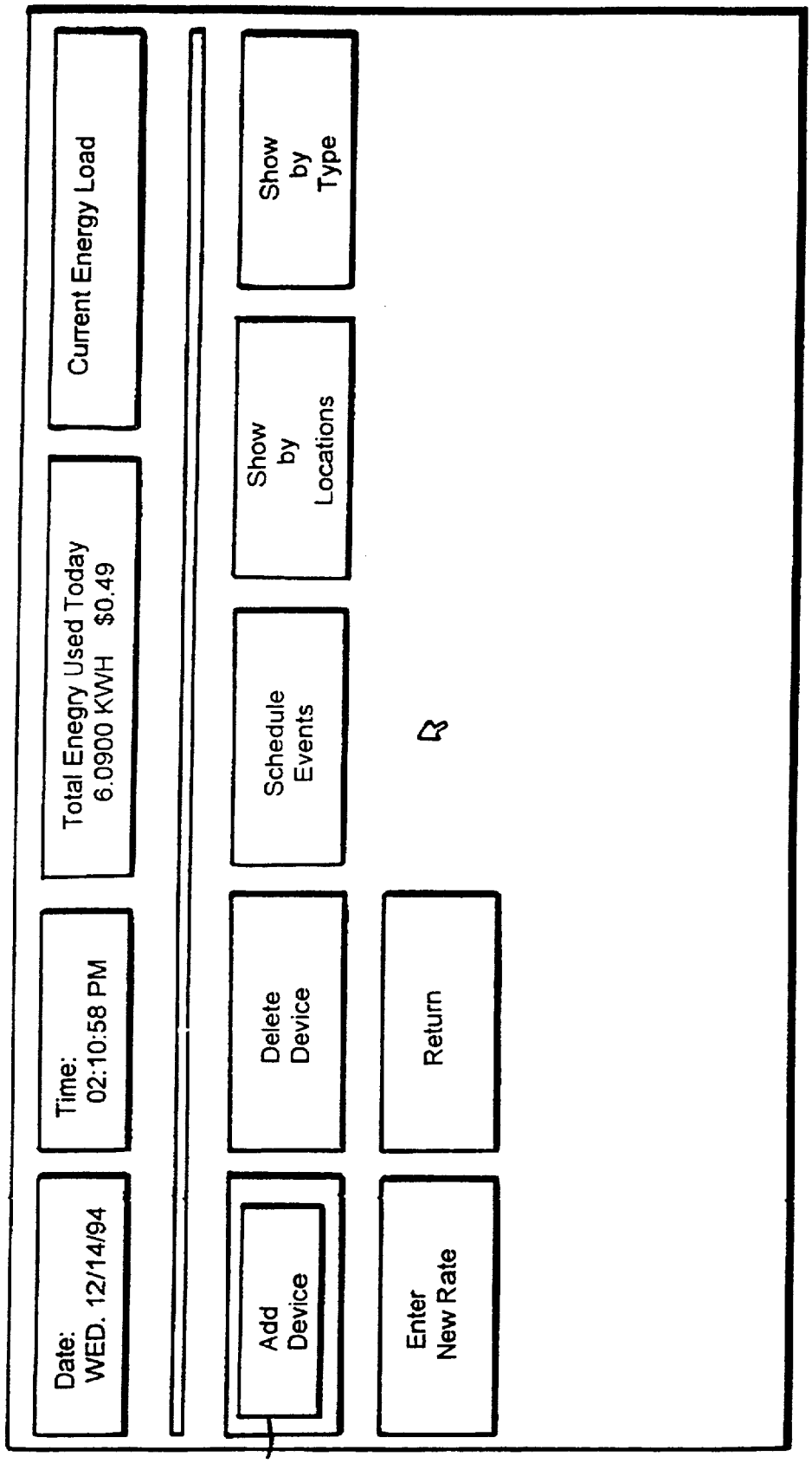
FIG. 11 is an illustration of an exemplary input screen according to the invention, provided by step 36C of FIG. 4 for allowing a customer to make certain functional selections.
Figure 15:
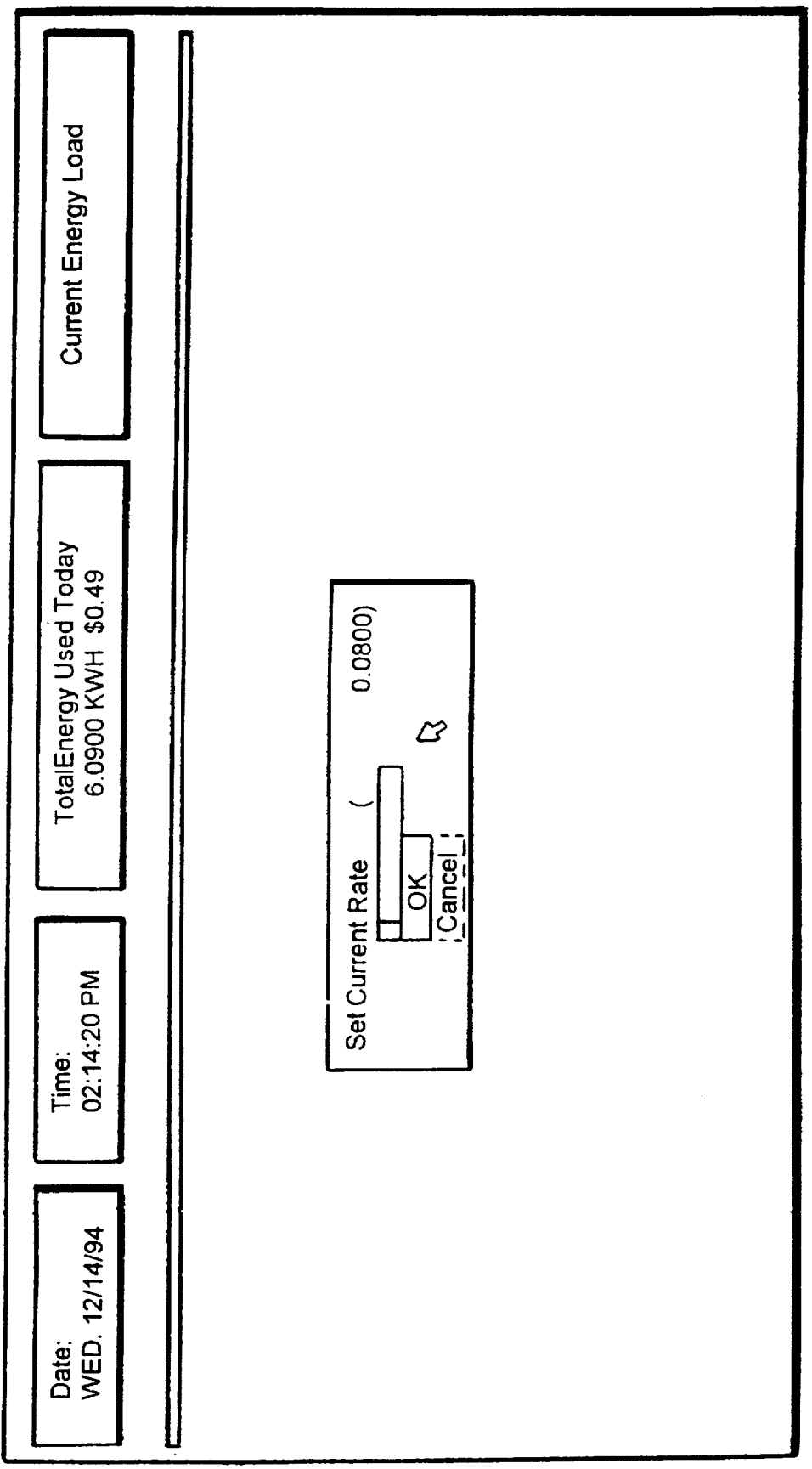
FIG. 15 is an illustration of an exemplary input screen for allowing a customer to enter an energy rate.

FIGS. 11–15 are illustrative of some of the screens presented to the customer on the display of second microcomputer 22 to obtain entry of user-assignable parameters. The display of FIG. 11 is provided by step 36C (FIG. 4), inviting the customer to select an option by choosing a "button," such as the "Add Device" button 62. If the Add Device button is selected, the customer is next presented with the screen of FIG. 12, where there are various data to be entered in a conventional manner, following which the customer is to use the F10 key to save the entries. If the customer selects the Schedule Events button on FIG. 11, the screen of FIG. 13 is next be presented and the customer is allowed to enter appropriate data. If the customer selects the Delete Device button on FIG. 11, the screen of FIG. 14 is next presented and the customer is allowed to select and delete a device. If the customer selects the Enter New Rate button on FIG. 11, the screen of FIG. 15 is next presented and the customer is allowed to enter a new energy cost, cost_kwh.

The two microcomputers 18 and 22 communicate via a power line carrier (PLC) link established over the premises power wiring, preferably based on the CEBus spread spectrum protocol, using CEBus interfaces which are commercially available from Intellon Corporation of Ocala, Fla. The first microcomputer also communicates, using the same PLC system, with load (appliance) control modules that can enable or disable, for example, an electric water heater, and with sensors which can detect when an appliance is operating; it also may communicate with other sensors and actuators, as well. In particular, the watt-hour meter can be interrogated by the first microcomputer to monitor the premises' energy consumption. The first microcomputer 18 also can communicate with the power company via a suitable communications interface 16 and associated channel to receive real-time energy rate broadcasts, load shedding requests and the like, and to send to the utility company power outage reports, low voltage condition reports, customer usage reports and selected other data. The communications channel may, for example, be the telephone system, cable TV system, or a radio-frequency link; it may also be a power-line carrier (PLC) system such as a modification of the technology marketed by Elcon.

In the CPEU_PGM program 34, the Process Data Requests module 34A manages the handling of, and response to, data input and output requests from inside the second microcomputer 22. These requests include scheduling changes, device additions and deletions, and requests for historical data. Module 34A also supplies to the second microcomputer 22 such information as it requests for generating reports to the customer. The Process Load Shedding Requests module 34B processes load shedding requests as they arrive from the utility company and generates corresponding control messages over the CEBus system to the loads which are to be instructed to turn off or to resume normal operation. The Receive Current Energy Pricing Information module 34C receives energy pricing information from the utility company or from the customer, by keyboard entry from, e.g., the screen of FIG. 15. The Poll and Store module 34D polls the watt-hour meter to get a current reading of demand and accumulated energy consumption since the last prior poll; it also polls monitored devices and stores the results. The Control Devices Using Pricing Information module 34E implements the conditional device-controlling operations which are utility-rate-dependent (see FIGS. 38–40 and related discussion, infra). The Perform Scheduled Events module 34F, as its name suggests, performs scheduled on/off events based on a user-provided timing schedule or price-driven customer-set conditions, unless the performance of those events is countermanded by load-shedding operations in progress. Scheduled events include, for example, turning loads on, turning loads off, resetting thermostats, and changing the brightness of lighting by altering dimmer settings.

The order in which modules 34A–34F are executed is interchangeable to a significant degree when the total time to execute the loop is short.

The USER_PGM program 36 asks for historical data from the CPEU_PGM program 34, and then formats that data into reports (preferably including graphical presentations). Also, the customer can input to the USER_PGM program 36 schedules for on/off events, which schedules are then sent to the CPEU_PGM program 34 for execution by module 34F. The Display History and Menus module 36B displays the currently selected screen.

Figure 16A:
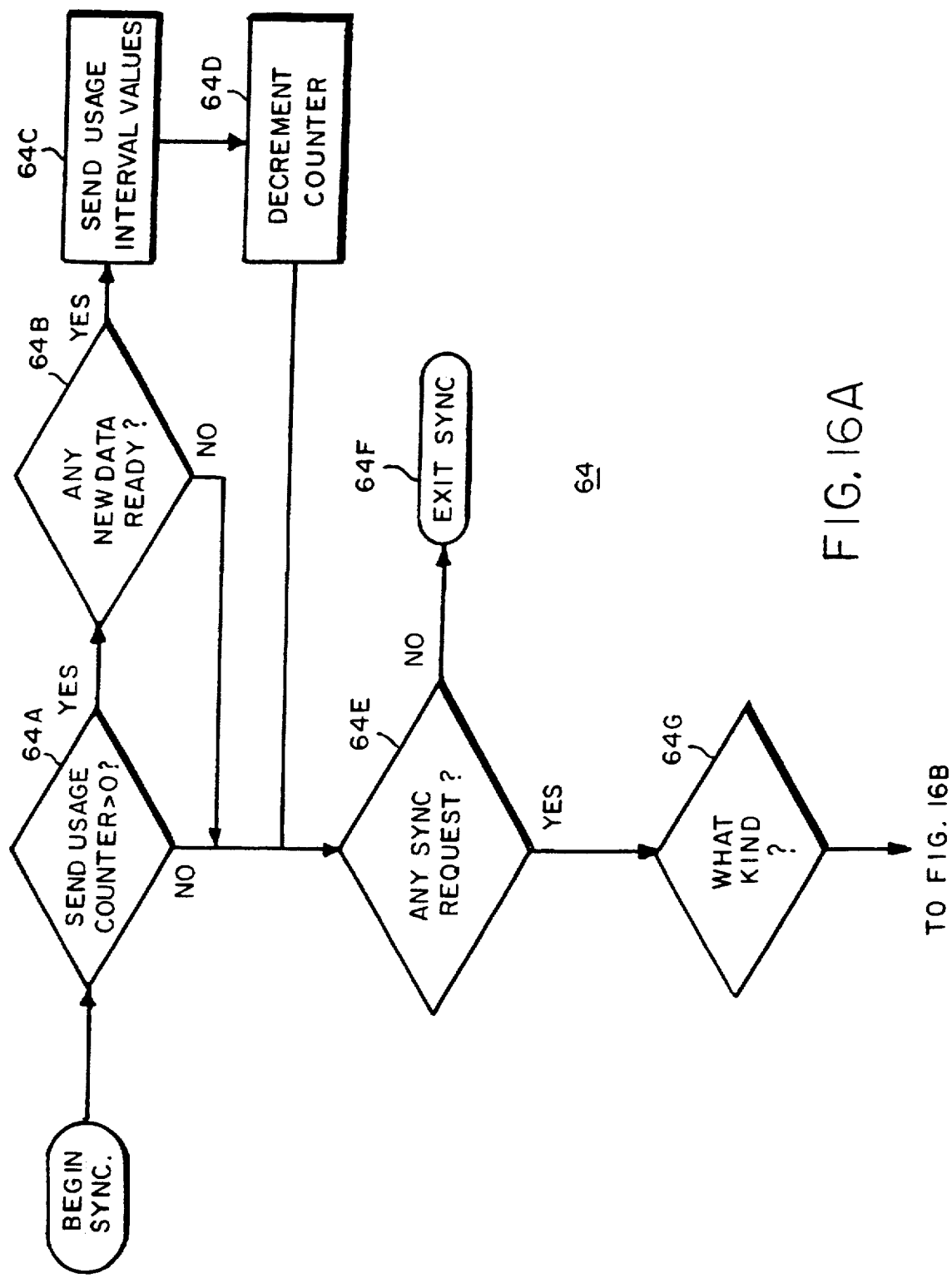
FIG. 16 is a flow chart for steps to be executed at the first microcomputer to synchronize the data structures of the first and second microcomputers.
Figure 16B:
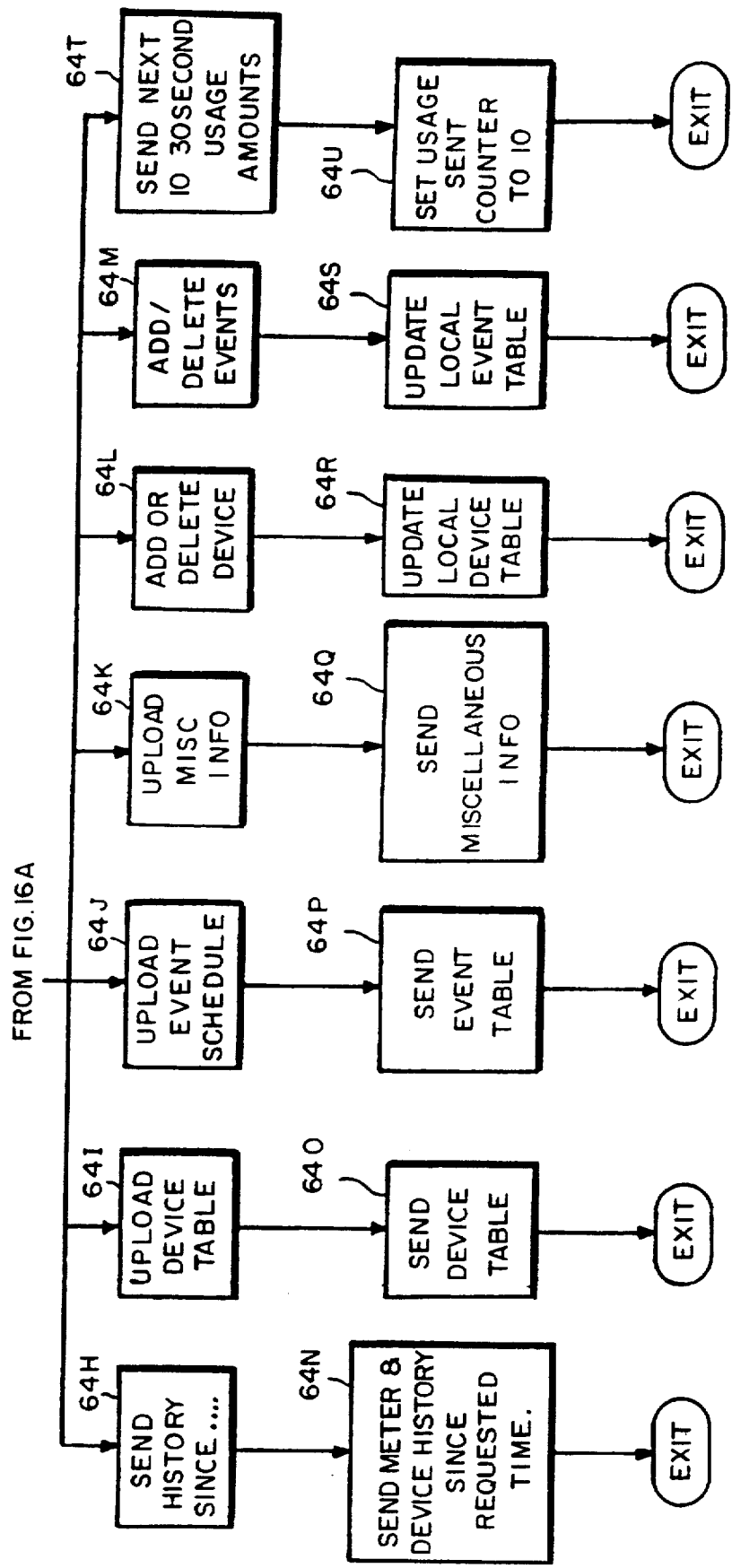
Figure 17A:
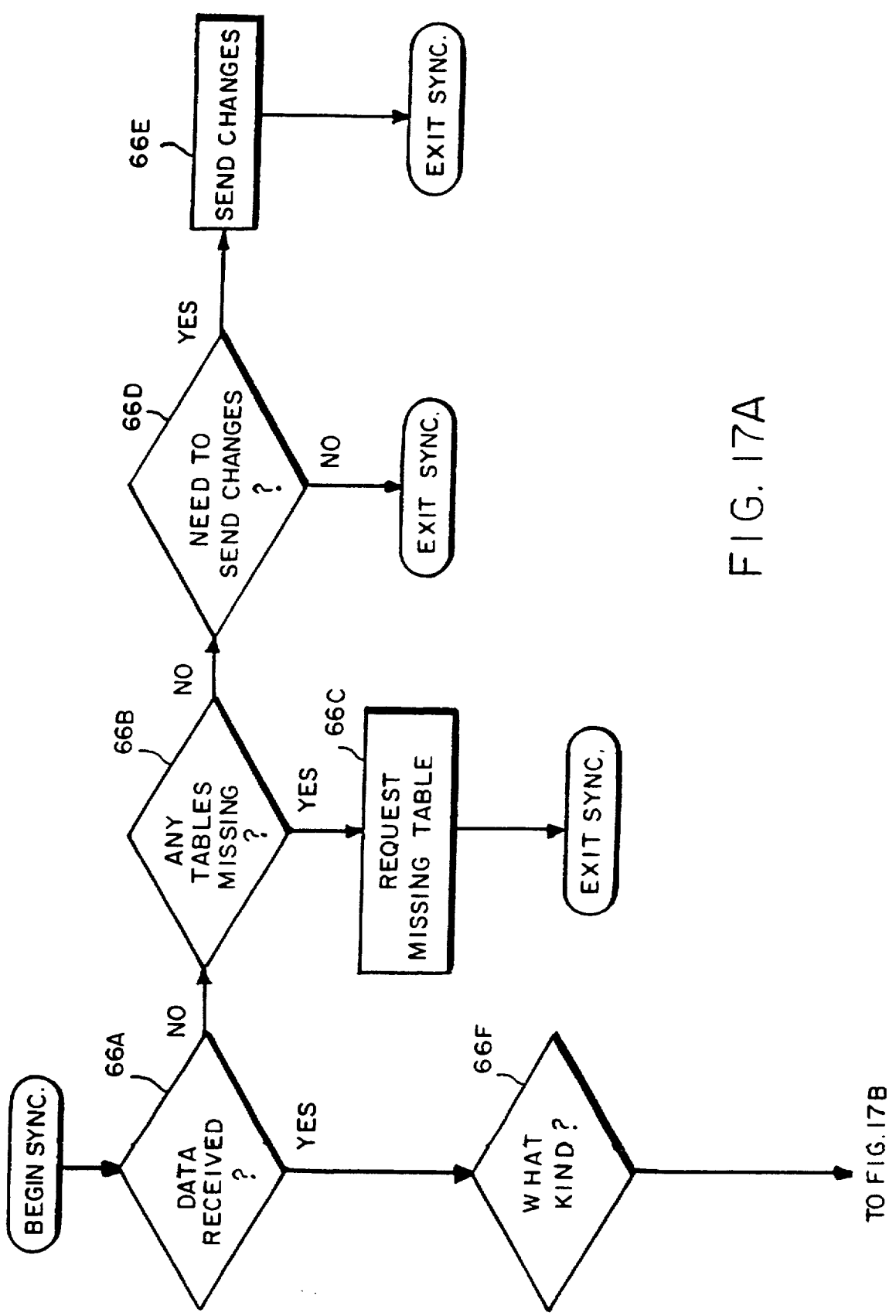
FIG. 17 is a flow chart for steps to be executed at the second microcomputer to synchronize the data structures of the first and second microcomputers.
Figure 17B:
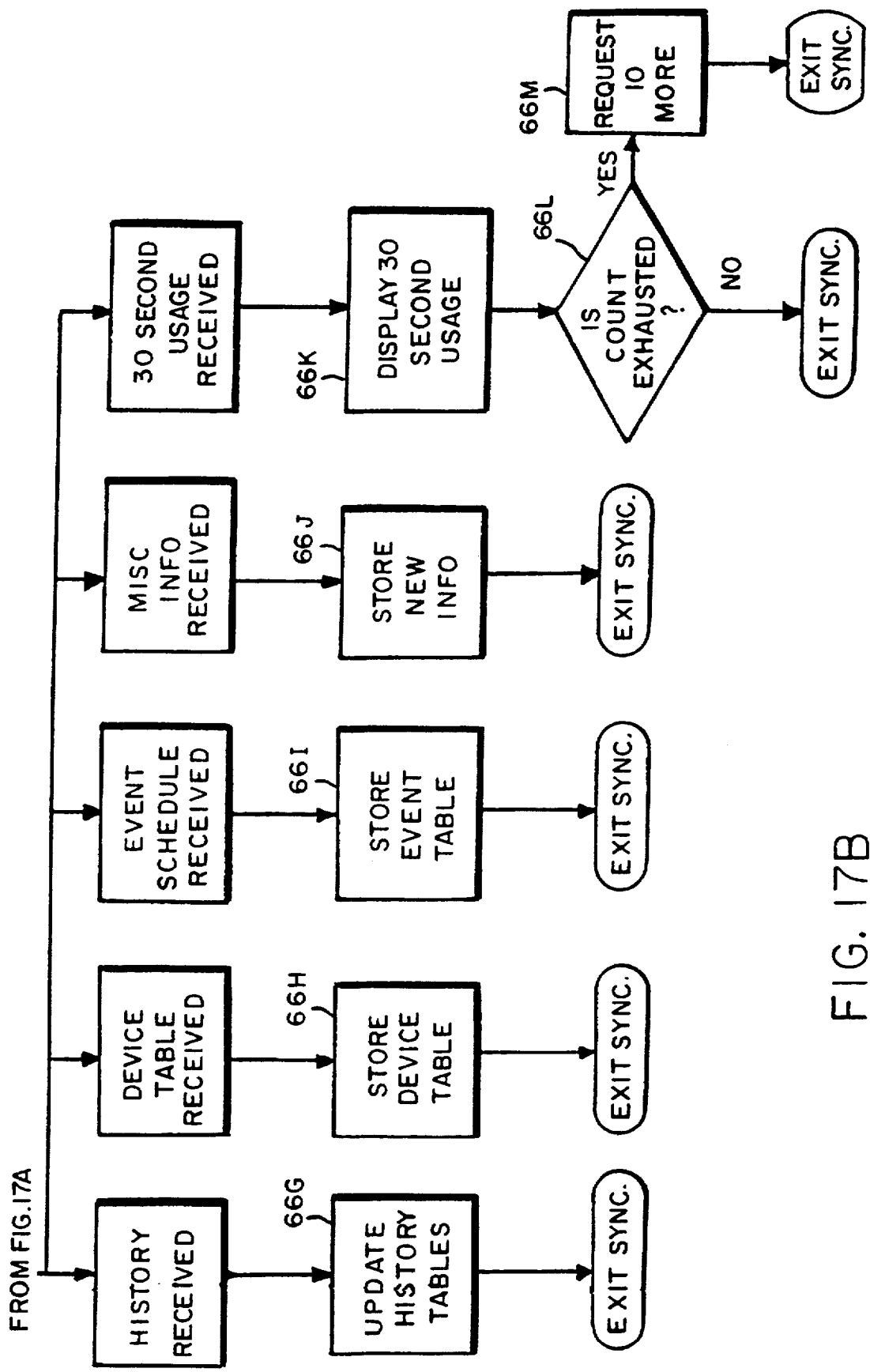

The first and second microcomputers 18 and 22 differ in one important respect. The first microcomputer is always powered (i.e., "on") whenever there is voltage present on the ac service cable to the premises. Preferably it receives its power directly from the utility company's lines outside the premises. By contrast, the second microcomputer may be a conventional personal computer which may be turned on or off at will by the customer. This means that at times the second microcomputer does not have up-to-date data compared with that maintained at the first microcomputer. Consequently, synchronization program modules are executed in the first and second microcomputers to ensure that the reports generated by the second microcomputer, from its data structures, are based on the correct information. FIGS. 16 and 17, respectively, provide flow charts for an exemplary synchronization process executed at the first and second microcomputers. To avoid creating unnecessary traffic on the bus 20, a decision was made to update the second microcomputer's data structures incrementally and mostly on demand. The second microcomputer can request data for ten (or another predetermined number of) usage intervals at a time. It begins doing this as soon as it is booted up and continues to do so while running. If the second microcomputer aborts, is turned off or "hangs up", the first microcomputer will soon stop sending data since the first microcomputer is not capable of receiving it. To implement this approach, the second microcomputer maintains a counter, called the Send Usage Counter (not shown), in which it records a count of the meter-reading intervals for which data was not sent to the second microcomputer. The first microcomputer periodically examines its Send Usage Counter, step 64A, and if the contents of the counter are non-zero, it checks to determine whether a new interval's data is ready to be sent, step 64B. If there is data to be sent, it is transmitted, step 64C, and the Send Usage Counter is decremented, step 64D. If the contents of the Send Usage Counter were zero or there was no data to send or the data was sent and the counter decremented, the first microcomputer checks to see whether any synchronization requests have been received from the second microcomputer, step 64E. For example, the second microcomputer 22 may request to inform the first microcomputer of an event or device change entered by the customer. If there is no request from the second microcomputer 22, the synchronization process terminates for the moment, step 64F. If a synchronization request was received, the system then must determine what kind of request it was, step 64G. The following possible requests are illustrative of those that might be received: The second microcomputer might request history data (including dates, times, and power and current measurements—whole premise and/or individual devices) since its last information. Step 64H. Or it might request a whole Device table to be sent, if the second microcomputer cannot find its Device table or the Device table has been corrupted, step 64I. Similarly, if the Event table in the second microcomputer is missing or corrupted, a new Event table may be requested, step 64J. A miscellaneous information request may be made, step 64K, if the second microcomputer finds any other information missing. If the customer has added or deleted any devices or events, requests to supply that information to the first microcomputer may be generated, steps 64L and 64M, respectively. Following each of requests 64H–64M, appropriate actions are taken to supply the indicated information in corresponding steps 64N–64S, following which the synchronization routine at the first microcomputer is exited. Finally, the second microcomputer can indicate it has begun running or that it is continuing to run by requesting the next ten (or some other number) usage interval amounts, step 64T, in response to which the Send Usage Counter is set to 10, 64U, and the routine exits. The usage interval amounts sent in step 64T include the number of kilowatt-hours consumed at the premises over the interval and the actual length of the measurement interval, in seconds; optionally, the usage interval amounts may include data on individual device consumption. While a measurement interval is nominally thirty seconds, the actual length of each measurement interval may vary from the nominal value because the microcomputer may be engaged at other tasks when an interval nominally would terminate or when an interval nominally would begin.

Figure 18:
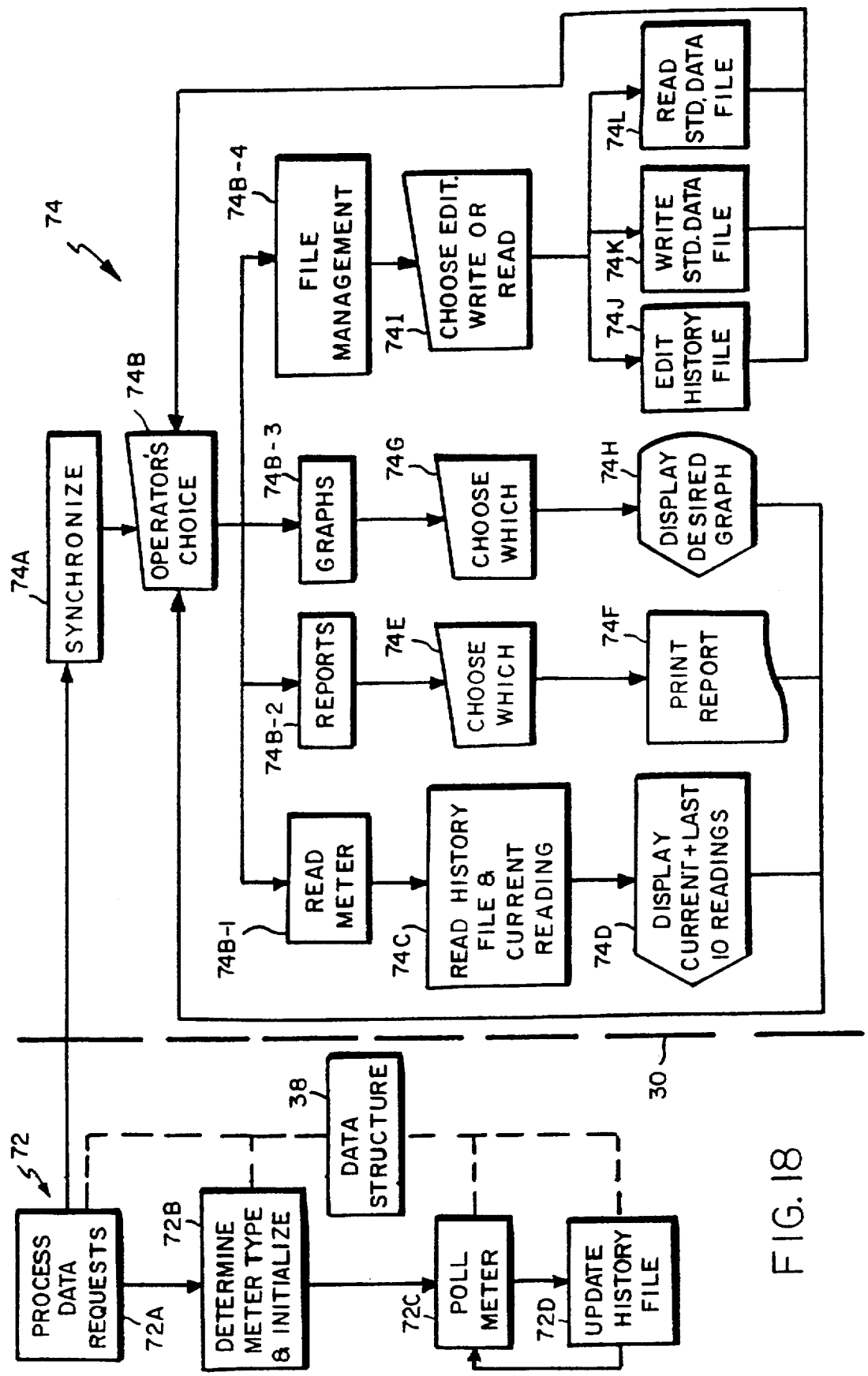
FIG. 18 is a combination block diagram and high-level software process diagram/flow chart for a second embodiment of the programs executing on the microcomputers of FIGS. 2 and 3.

An exemplary synchronization program 66 for execution at the second microcomputer 22 is shown in FIG. 17. First, the second microcomputer looks for any data coming in from the first microcomputer, step 66A. If there is none, the second microcomputer looks for missing tables, 66B, and if any are found missing, requests that they be sent to it, step 66C. If all tables are present, the second microcomputer determines whether the customer has made changes to the Device table or the Event table, step 66D, and, if so, sends the changes to the first microcomputer, step 66E. If in step 66A, incoming data was found present, a determination is made, step 66F, as to the nature of the data. If the data represents recent history, the History table(s) is/are updated, step 66G; if it is device table information, the Device table is updated and stored, step 66H; if it is event schedule information, the event table is updated and stored, step 66I; if it is miscellaneous information, appropriate memory locations are updated, step 66J; and if it is (thirty-second) usage data, the information is sent to the screen for display or put into temporary storage, step 66K, following which the count is checked, step 66L, and another group is requested, 66M, if the count was exhausted Turning to FIG. 18, there is illustrated another embodiment of the invention. This embodiment is particularly intended for use at commercial premises where detailed, device-by-device, information is not desired but where multiple watt-hour meters may be in use. It is assumed each watt-hour meter includes non-volatile memory which records and stores meter readings. Again, the system executes on two microcomputers 18 and 22 executing two different programs, 72 and 74. Program 72 has four modules, 72A–72D. Module 72A is analogous to module 34A (FIG. 4). For each meter, determine Meter Type and Initialize module 72B reads the meter type code and performs any required initialization, particularly initialization which may depend on the characteristics of the watt-hour meter. Once initialization is complete, a loop is executed, comprising modules Poll Meter, 72C, and Update History File, 72D). The Poll Meter module 72C polls each watt-hour meter periodically, via the CEBus, and makes the reading available to the Update History File module 72D. In turn, the Update History File module 72D updates the history file for the meter then awaits the next poll. The program 74 can read the history file, maintained in data structures 38, at any time.

The use of multiple meters is not limited to commercial premises, of course. Thus, the approach of program 72 can be incorporated into the first embodiment of the invention, as well. Similarly, the multiple communications systems disclosed in connection with the first embodiment of the invention also may be used in the second embodiment of the invention.

Figure 19:
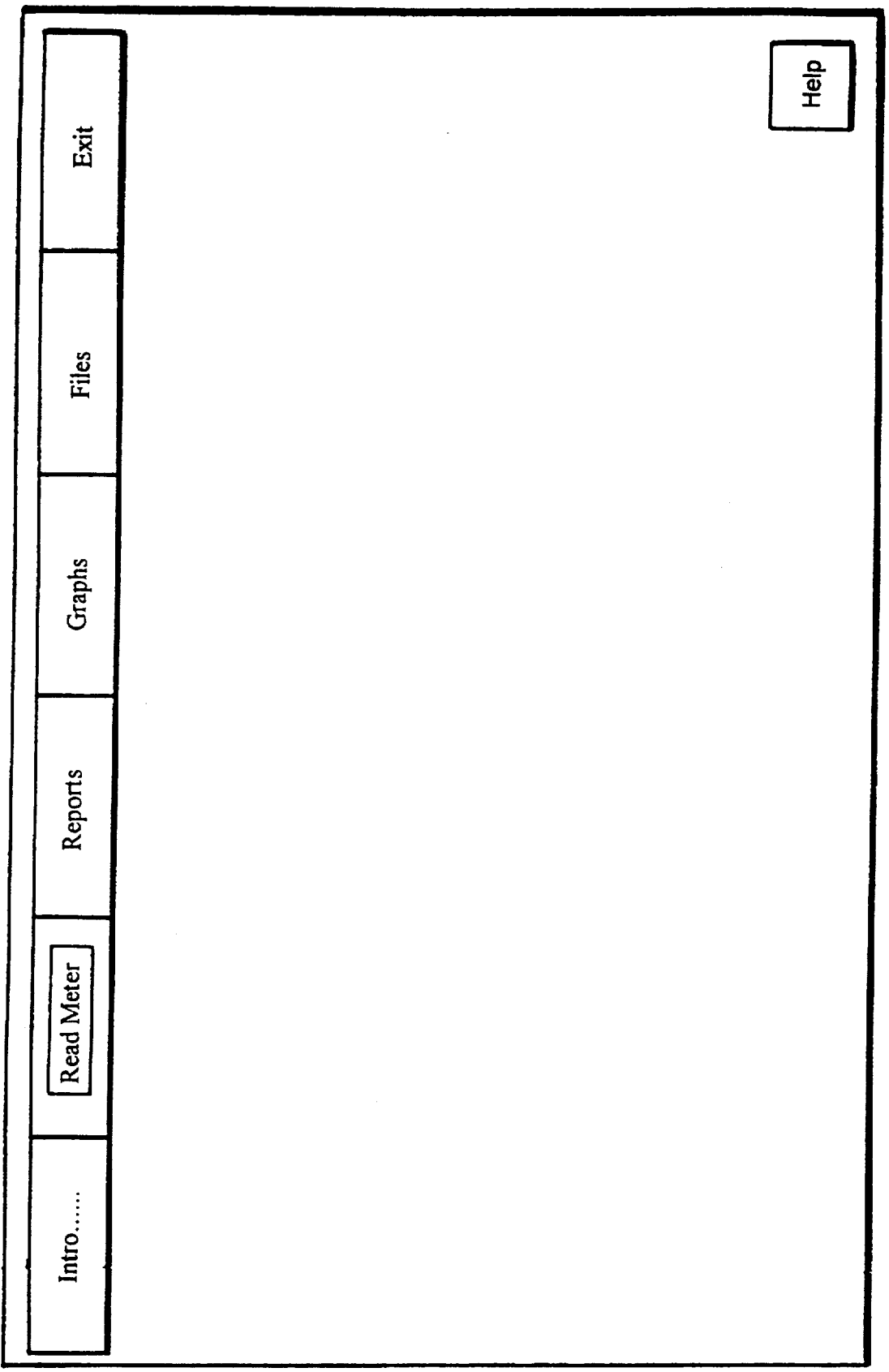
FIG. 19 is a pictorial illustration of an exemplary screen for use by a user of the invention to select among available functions in the Operator's Choice module of FIG. 18.
Figure 21:
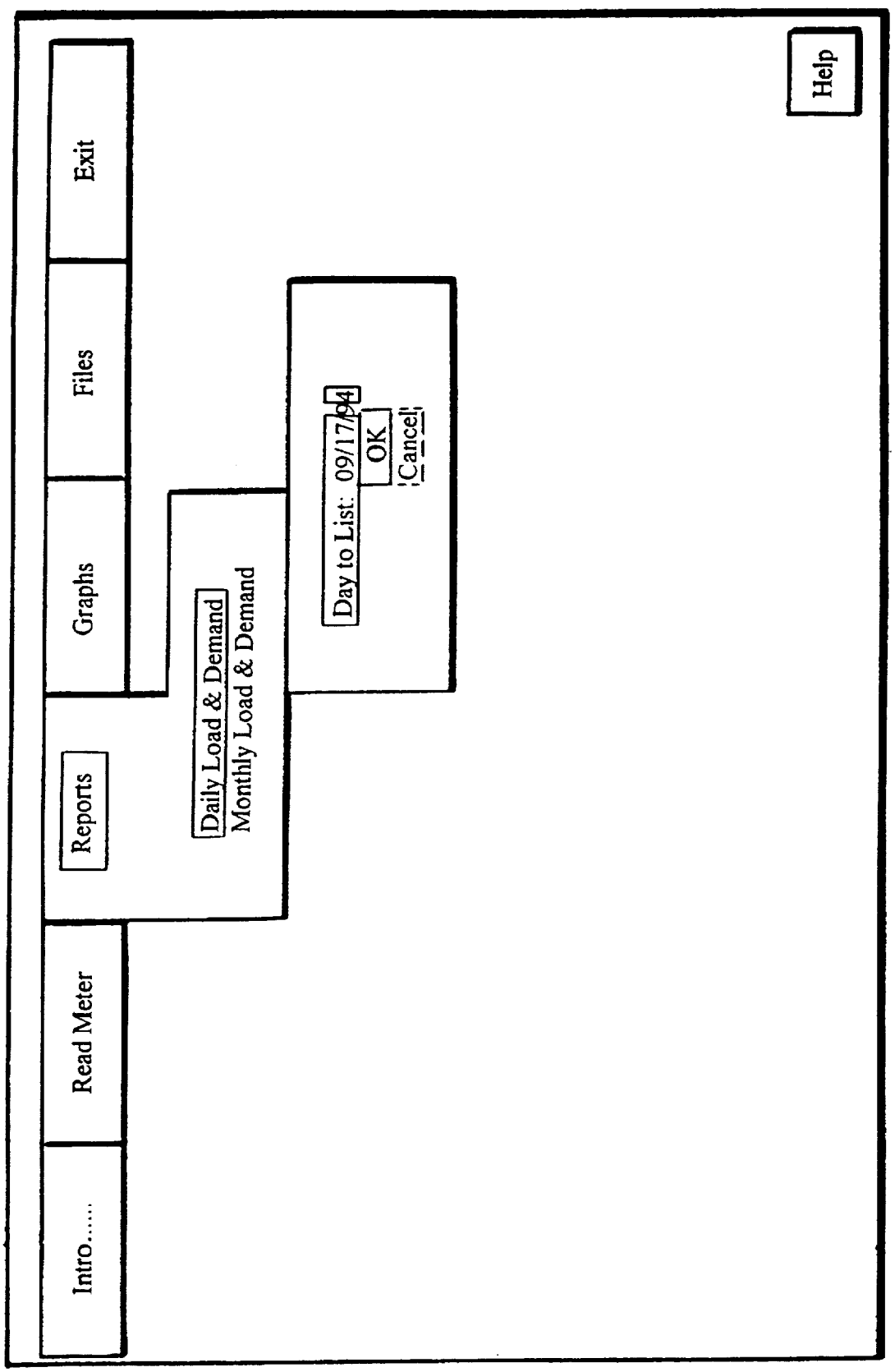
FIG. 21 is a pictorial illustration of an exemplary screen showing selections available when the user chooses the Reports function on the screen of FIG. 19.
Figure 23:
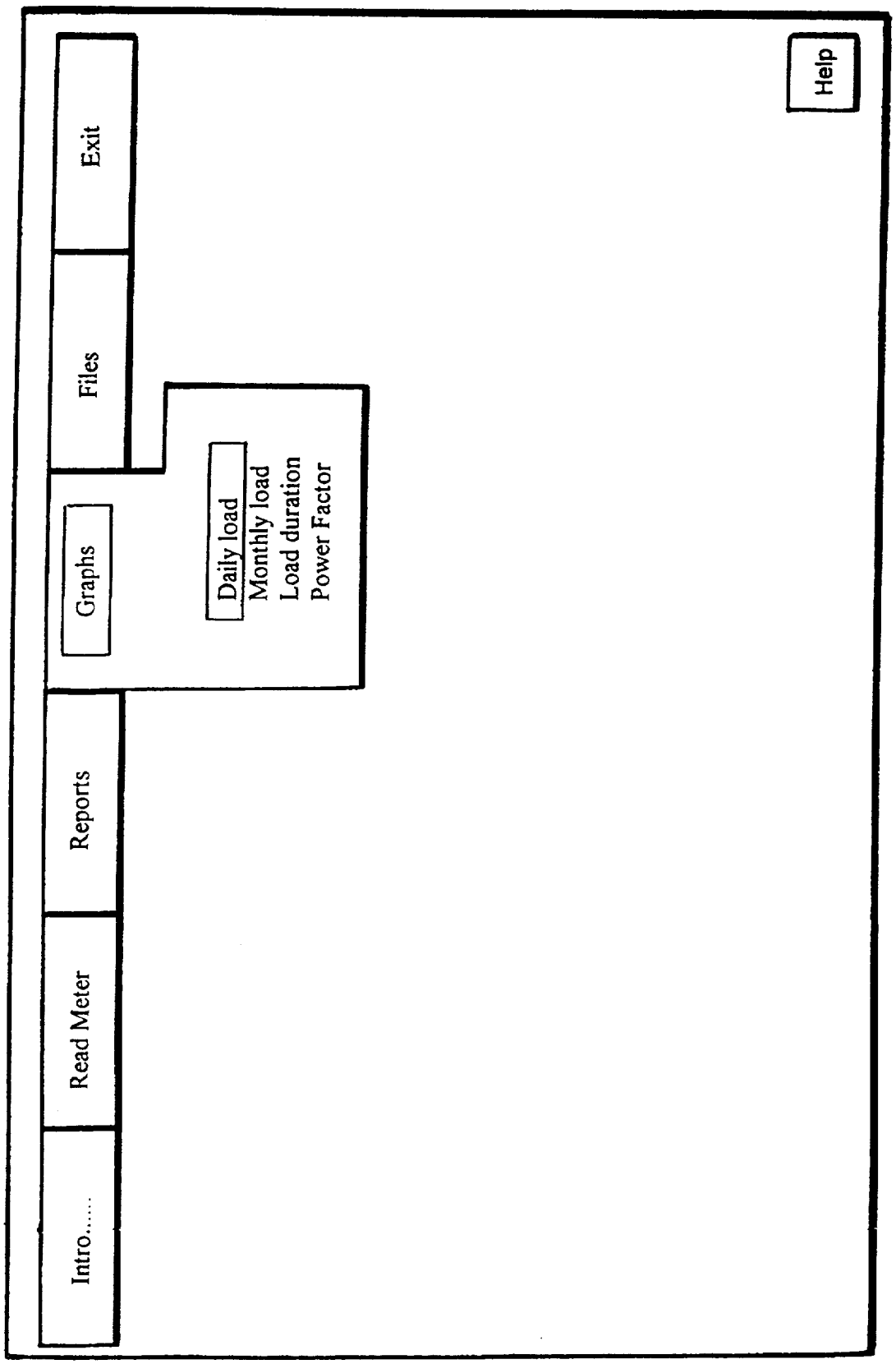
FIG. 23 is a pictorial illustration of an exemplary screen showing selections available when the user chooses the Graphs function in the screen of FIG. 19.

The program 74 is assembled of sixteen modules, 74A–74P. Module 74A communicates with data structures 38, via program module 72A and provides to the program 72 power consumption history on the meter. The Operator's Choice module 74B is executed after the synchronize module 74A; this module allows the customer to select one of four categories of operations: reading the meter, 74B-1; generating a report, 74B-2; graphing data, 74B-3; or managing files, 74B-4. A typical screen presented by the Operator's Choice module is shown in FIG. 19. When the meter reading option is selected, control next passes to the Read History File module 74C. Read History File module 74C reads the history file for a predetermined number of readings, such as the last ten readings, and acquires the current meter reading. Display module 74D then displays on the screen the information read by the module 74C, as illustrated, for example, by the screen shown in FIG. 20. When the report option 74B-2 is selected, control passes to the Choose Which module 74E, which displays to the user a list of available report types and requires the user to input a selection (see, e.g., FIG. 21). The selection having been made, Print Report module 74F prints the report, using the current data. As but one example of the reports available at this stage, FIG. 22 illustrates an hourly report of daily load and demand for one day. When the Graphs option 74B-3 is selected, control passes to the Choose Which module 74G, which displays to the user a list of available graph types and requires the user to input a selection (see, e.g., FIG. 23). The selection having been made, Display Desired Graph module 74H displays the graph, using the current data, and allows the operator to choose to print the graph on an attached printer, if one is available. When the File Management option 74B-4 is selected, control passes to the Choose Edit, Write or Read module 74I, which displays a message requiring the operator to choose from among the available options: editing a History file, writing (i.e., exporting) an existing History file in a standard data format or reading (i.e., importing) an existing file History file from the utility company. When the user chooses the edit option, Edit History File module 74J displays a history file from memory and allows the user to edit the data. When the user chooses the writing (i.e., exporting) option, Write Standard Data File module 74K displays a screen requiring the user to select an output data format and then writes a file containing the History data in a form which can be accepted by, for example, a standard spreadsheet or database program. When the user selects the read (i.e., importing) option, Read Standard Data File module 74L allows data currently saved on the power company's computers to be put into the history file for use by the programs 72 and 74. After the selected option has finished executing, control reverts to the Operator's Choice module.

Load Control Modules

Three types of load control modules are specifically discussed herein, though it will be appreciated that the invention is not restricted to these exemplary modules. The three modules discussed below are current sensing modules, or monitors, power sensing modules and circuit breakers. A circuit breaker may be a stand-alone module or it may be incorporated into one of the other types of modules. In the examples next discussed, a circuit breaker is provided as part of a current sensing module; a separate description of a stand-alone circuit breaker would be redundant and therefore is not provided.

Current Monitor

Figure 24A:
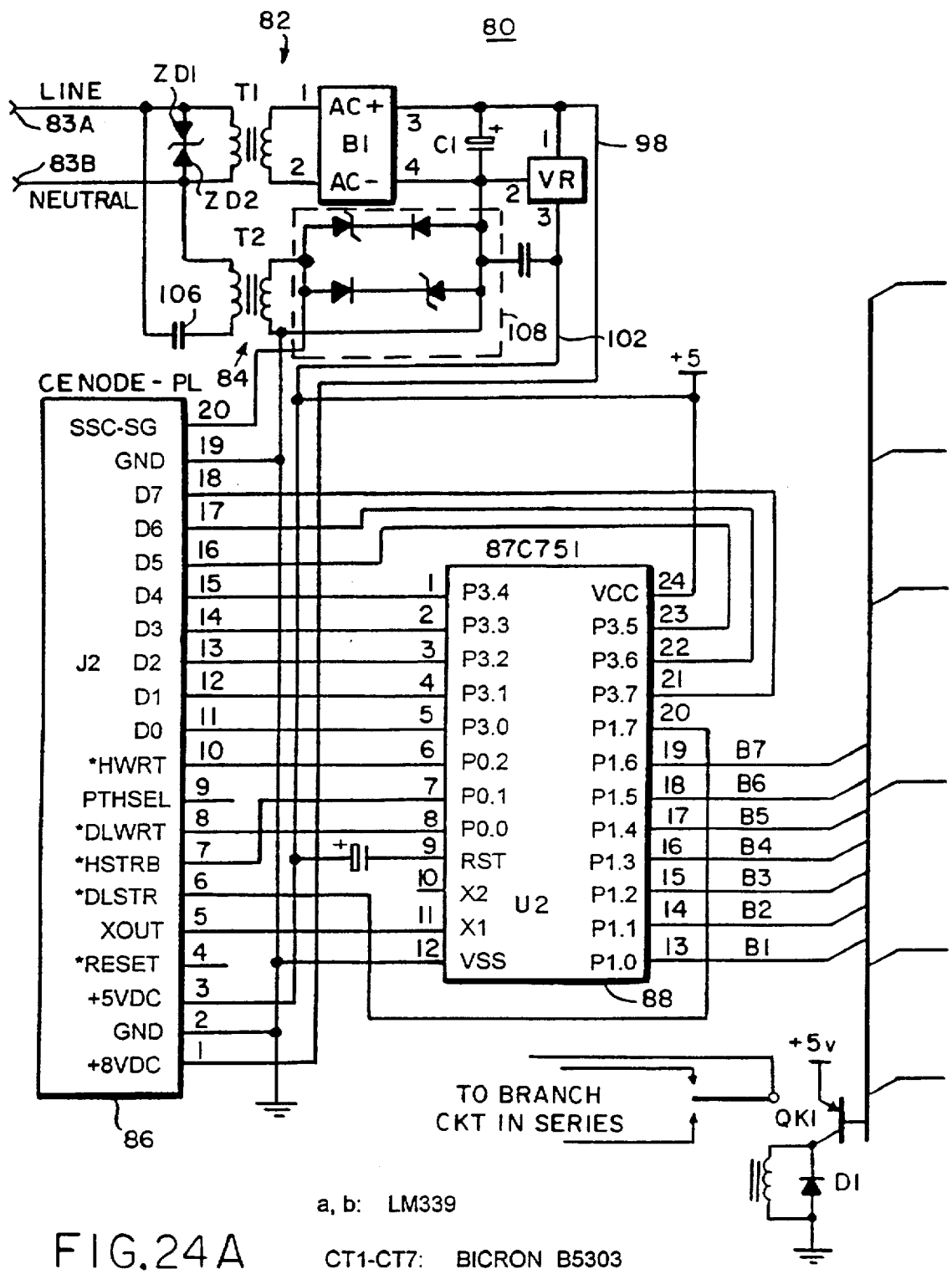
FIG. 24 is a schematic circuit diagram for a load control module according to the invention, for monitoring current in a multiplicity of branch circuits and for turning a load device on or off remotely.
Figure 24:
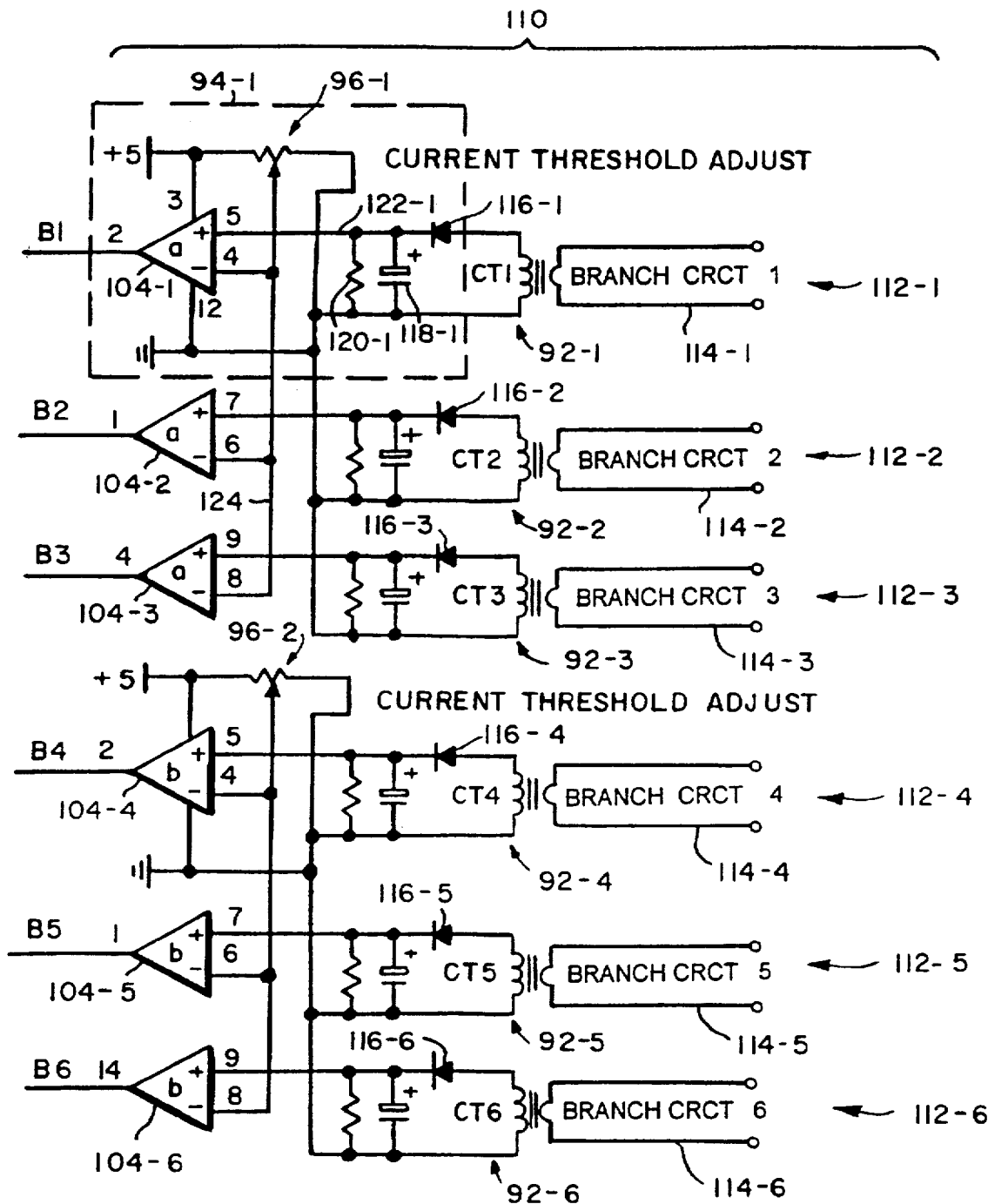

An exemplary current sensor is shown in FIG. 24. The current sensor 80 comprises: a power supply 82, a power line carrier coupling circuit 84; a PLC bus interface 86; a microcontroller 88; and for each current level to be sensed, a processing channel comprising a current transformer 92-i (the variable "i" denoting the channel identifier) and a current sensing circuit 94-i, each having or sharing a threshold setting element 96-j (only one current sensing circuit 94-1 being labeled in the drawing). The output of the current sensing circuit is read by the microcontroller. The microcontroller also implements the CEBus Common Application Language (CAL); the microprocessor firmware (not illustrated) thus determines the behavior of the sensor, such as whether it must be polled to determine its state and take a measurement or whether it autonomously reports changes in state or observed value.

Such a current sensor is used to determine whether the current in a branch circuit exceeds a preset threshold. The threshold for the current sensing circuit may be fixed or variable. It will typically be fixed if the current monitor is built into an appliance and variable if the current monitor is marketed as a general-purpose product adaptable for use with various load devices. A branch circuit is a power distribution circuit which has its own circuit breaker (or, in older settings, fuse) in the premises' electrical distribution panel. A major appliance such as a clothes dryer, cooking range or oven, refrigerator, air conditioner, hot water heater or pool pump usually will have its own branch circuit. In some situations, as explained below, for purposes of monitoring currents a single branch circuit may be treated as multiple branch circuits. In a basic setting, the threshold may be set relatively low and the sensor will then indicate, if there is only a single load on the branch, whether the load is drawing current—i.e., whether it is turned on. On the other hand, if there is only a single load on the branch but the load can be operated in different modes, such as a low power mode and a high power mode, the threshold can be set to a level between the current that will be drawn in the two modes. The sensor output will then indicate whether the load is being operated in the high power mode. The monitor is not intended to provide a quantitative measurement of the current in the branch circuit.

The circuit 80 can monitor up to six branch circuits (112-1 through 112-6), one per each of the microcontroller ports P1.0–P1.5. Through another port, P1.6, it can control the on/off state of a load. The current sensor 80 is designed to communicate using CEBus power line carrier signaling. For this purpose, sensor 80 is equipped with a CENode PL (i.e., power line) interface module 86 from Intellon Corporation. A model 87C751 microcontroller 88 from Signetics Corporation of Sunnyvale, Calif. controls and generates the signals sent to the CENode PL module and receives and performs operations in accordance with signals received from other CEBus devices. Circuit 80 preferably is mounted in or adjacent to the premises' electrical distribution panel. For monitoring a single load, a subset of the monitor 80 can be packaged either for inclusion inside the load's housing or in a module which is plugged into an ac power receptacle, with the load device then being plugged into the module.

The power supply 82 provides from the ac power mains, connected at terminals 83A and 83B, +5 volts dc (VDC) power for the current monitor. The power supply has a transformer T1, preferably with a pair of Zener diodes ZD1 and ZD2 connected in series across the primary as a surge protector; a full-wave rectifier B1; an electrolytic filter capacitor C1; and a voltage regulator VR. Transformer T1 provides a 10 volt, 600 ma. output; an unregulated 8 VDC output appears on line 98 from the supply for the PLC bus interface 86 and a regulated 5 VDC output appears on line 102 for the microcontroller 88 and for the comparators 104-i, which are discussed below.

The power line carrier coupling circuit provides the connection between the PLC bus interface 86 and the power line itself. The PLC coupling circuit includes a transformer T2 which has a first winding connected to the power line through a series capacitor 106 (the purpose of which is to filter out the relatively low frequency ac power signal from the relatively high frequency PLC signal). A second winding of transformer T2 is connected to the signal I/O port SSC-SG of the PLC interface module. A protection circuit 108 also is connected between the second winding and ground.

The PLC bus interface unit may, for example, be a model CENode-PL CENode Network Interface Board from Intellon Corporation of Ocala, Fla., or equivalent. (If RF communication is used between nodes, instead of a PLC system, for example, one may substitute as equivalent a CENode-RF Network Interface Board, also from Intellon; or the network can be based on a standard other than Intellon's and suitable network interfaces can then be substituted).

The microcontroller 88 may, for example, be a model 87C751 microcontroller from Signetics Corporation.

The actual current sensing is performed in current sensing stage 110. The current sensing stage has a minimum of one channel per branch circuit variable to be monitored. If the condition, or variable, to be monitored is the simple on or off status of a load, one channel will suffice. If the load condition to be monitored is its operating mode and (in addition to "off" there are low-power and high-power modes, two channels will be required. The operation of a single channel will now be explained, using channel 112-1 as exemplary. A B5303 wound torroidal core current sensor CT1 from Bicron Electronics Co. of Canaan, Conn. is used to create a transformer 92-1; the torroidal core sensor comprises the secondary winding of the transformer and the branch circuit conductor 114-1 is wound through the core to provide a one-turn primary winding. The voltage generated in the secondary winding by the current in the branch circuit (primary winding) is half-wave rectified by diode 116-1 and filtered by electrolytic capacitor 118-1 and resistor 120-1. A comparator 104-1 compares the rectified voltage on line 122-1 with a reference voltage provided on line 124 by potentiometer 96-1 (one end of which is connected to the +5 volt supply and the other end of which is connected to ground). The output of each comparator is connected to one of the input ports P1.0–P1.5 of microcontroller 88. When the current in the branch circuit generates a rectified voltage greater than the reference voltage connected to the associated comparator, the comparator yields an output voltage interpreted as a logical high signal; when the current in the branch circuit generates a rectified voltage less than the reference voltage, the comparator yields an output voltage interpreted as a logical low signal.

In the embodiment illustrated in FIG. 24, as a matter of convenience, two threshold adjustments are provided, one shared in common by channels 112-1 through 112-3 and the other shared by channels 112-4 through 112-6. At greater cost, each channel can be given its own independent threshold adjustment. The threshold adjustment can be made remotely controllable, also, by using a digital-to-analog converter, receiving a digital value from the microcontroller, to provide an analog value directly to the comparator input.

To illustrate the use of the current monitor to sense the operating mode of a load having multiple modes, assume the load is a pool pump which has a high speed and a low speed. Referring to FIG. 24, to monitor the high speed, channel 112-1 will be used and to monitor the low speed, channel 112-4 will be used. The branch conductor goes through coils CT1 and CT4 in series. The potentiometer 96-1 is set to a voltage that will allow the comparator 104-1 to "trip" when the pump is operating in any mode (that is, low speed operation will be enough to trip the comparator). However, the potentiometer 96-2 is set to a voltage that will not allow the comparator 104-4 to be tripped except when the pump is operating at high speed. The definition of "tripped" used herein is that the comparator output goes to a logical one state.

Figure 25:
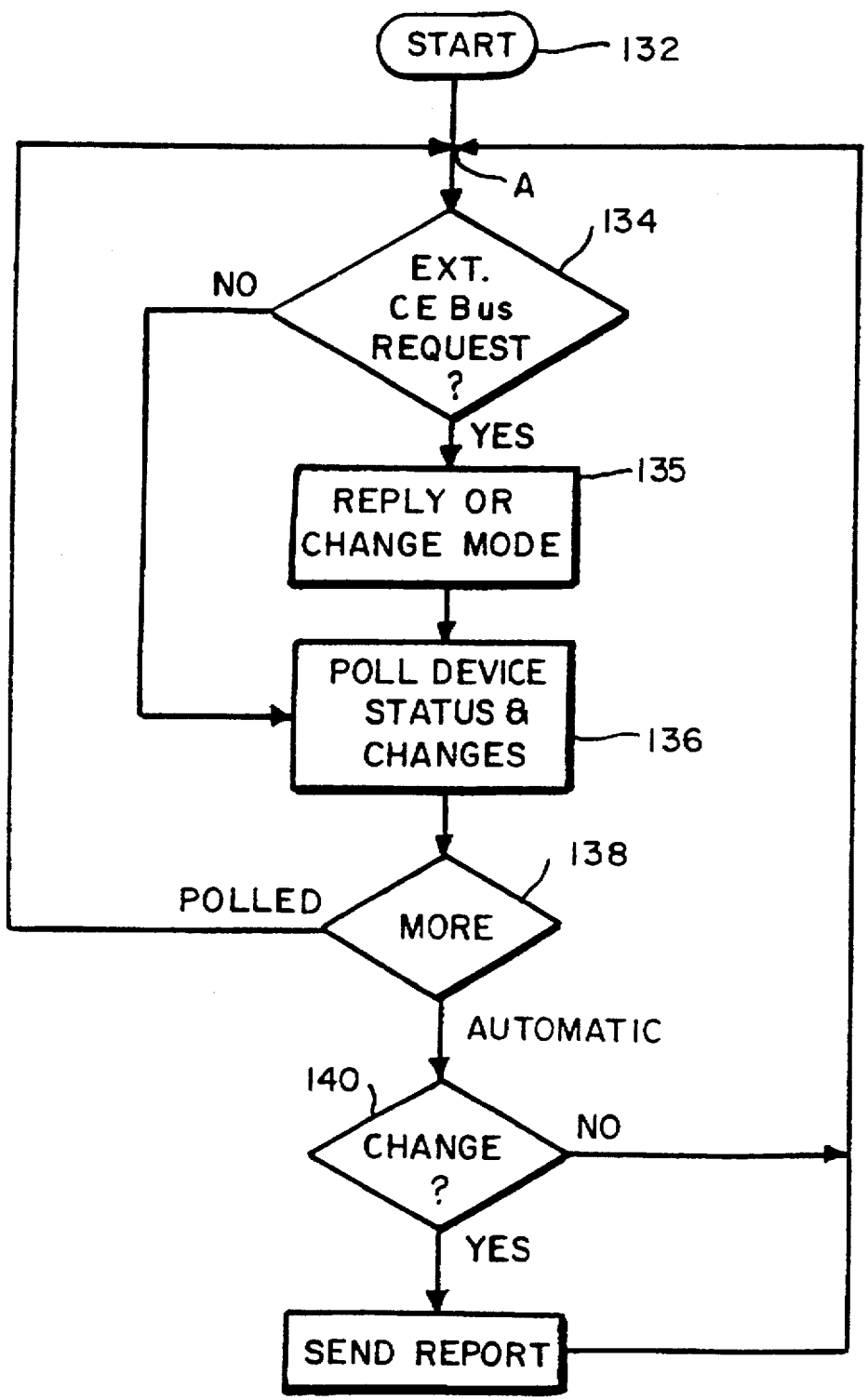
FIG. 25 is a flow chart for an exemplary program to be executed in the microcontroller of FIG. 24.

FIG. 25 provides a flow chart of the operations executed by microcontroller 88. Block 132 represents the entry, or starting, point for the operation of the microcontroller. First, the microcontroller determines whether it has received a request from an external node, via the PLC bus (CEBus), step 134. If not, control branches to step 136 wherein the microcontroller polls its input ports and internal registers for branch circuit status signals. The microcontroller then checks its mode of operation, step 138. If the microcontroller is operating in a so-called "polled" mode, wherein it is basically monitoring the branch circuits, control reverts to point A and the process repeats itself However, if the microcontroller is operating in a so-called "automatic" mode, control advances to step 140 wherein the currently read values are compared to the previously read values to determine whether there has been a change of status of any branch. If there has been no status change, control reverts to point A. Though if there has been a change of status, control advances to step 142, which generates a suitable report and sends that report via the PLC bus and returns control to point A.

If in step 134 it is determined that an external request was received, the next step to be executed is step 135. In step 135, a reply message is generated if the original message seeks a reply. If the received message, on the other hand, requests or commands some action on the part of the microcontroller, that action is executed.

Thus the microcontroller 88 polls the comparators 104-1 through 104-6 in some sequence on a periodic basis. When a change of state is detected in one of the comparator outputs, the microcontroller notes the event, generates a time-stamped entry in an event log, and sends a message, via the bus interface, to one or both microcomputers. The microcomputers and any other suitably equipped devices on the bus also can send condition request messages to the microcontroller, via the bus interface, to request the condition of one or more devices or circuits monitored by the current monitor; the current monitor will, in turn, send an appropriate reply message. If the requesting device knows the load connected to each of the monitor's channels, a single byte reply will tell the status of up to eight loads.

In the terminology of the CEBus protocol, each comparator state is a "binary sensor object" and the current monitor of FIG. 24 provides seven binary sensor objects, conforming with the Draft EIA Home Automation (CEBus) Specification ISA 60.

Advantageously, as an option, the microcontroller 88 may also be connected to energize a relay K1 through which ac power is supplied to a load (i.e., the relay contacts may be placed in series with a branch circuit). In this way, only a relay is needed to also provide load-shedding capability. The relay coil is energized by the microcontroller 88 through a transistor driver QK1; a diode D1 protects the transistor from inductively-generated voltage spikes when the transistor is turned off. If the microcontroller receives a command to shed the load, all it need do is deenergize the relay coil. If the relay contacts are normally open in the absence of coil energization, the load will automatically be shed when a power outage occurs. Appropriate firmware programming in the microcontroller interacting with programs executing in the microcomputers can delay reenergization until a predetermined time or random time after power is restored, to reduce stress on the power system.

Consequently, using the current monitor of FIG. 24 (i.e., so much of it as is necessary) as a single branch monitor, and assembling it as a module which plugs into an ac receptacle and has a receptacle for the load to plug into it, an older appliance can be adapted to be monitored and to be sheddable by remote command. If it is desired to provide multiple priority levels for selective load shedding, the priority of an individual load can be set by the microcomputer in the data structure 38 (see also FIG. 6) or another appropriate data structure, based on user input. Alternatively, the load control module can be provided with a user-settable means for recording a priority level, such as a set of switches which can be read by the microcontroller.

Power Monitor

Figure 26A:
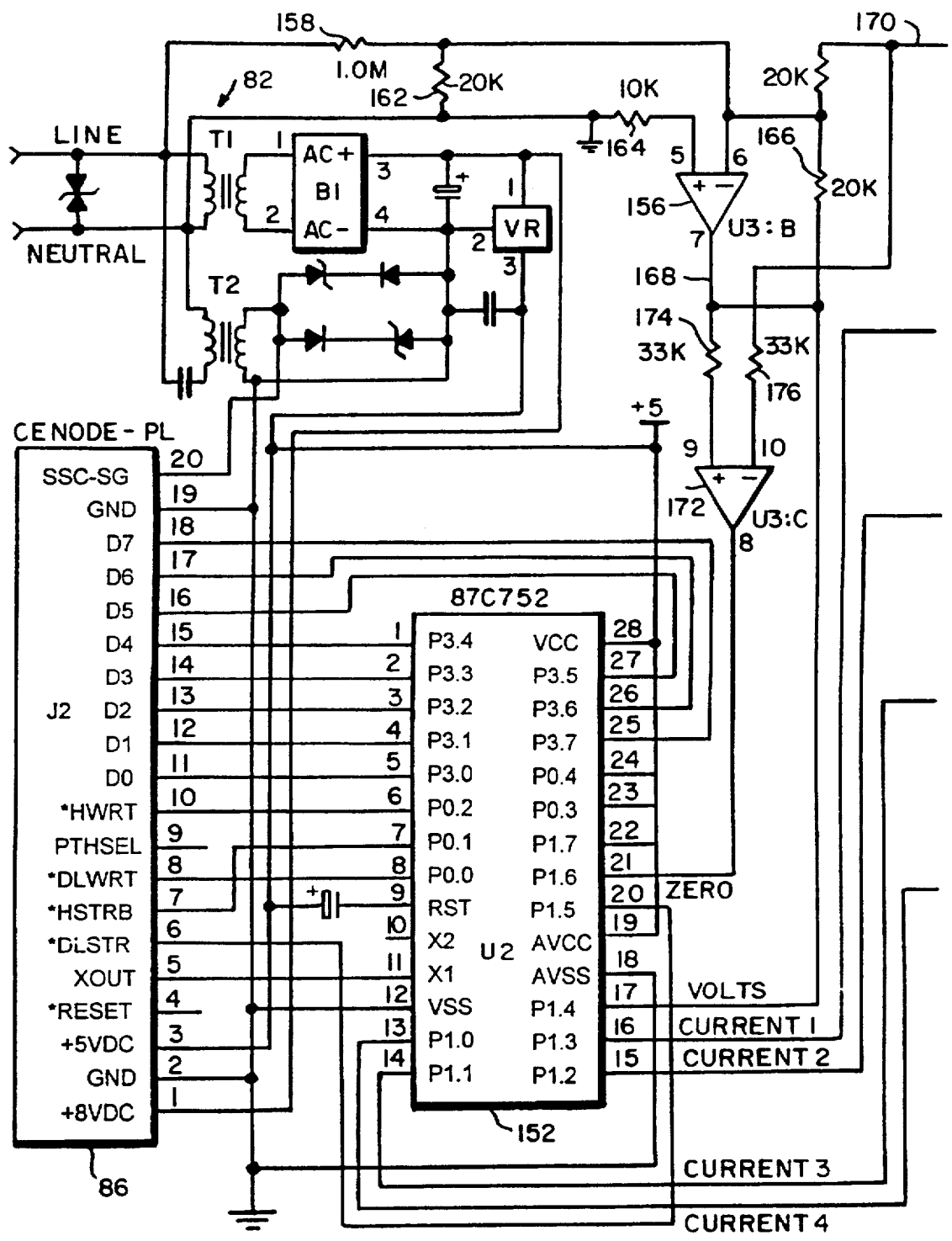
FIG. 26 is a schematic circuit diagram for a load control module according to the invention, for monitoring power consumed in a multiplicity of branch circuits.
Figure 26B:
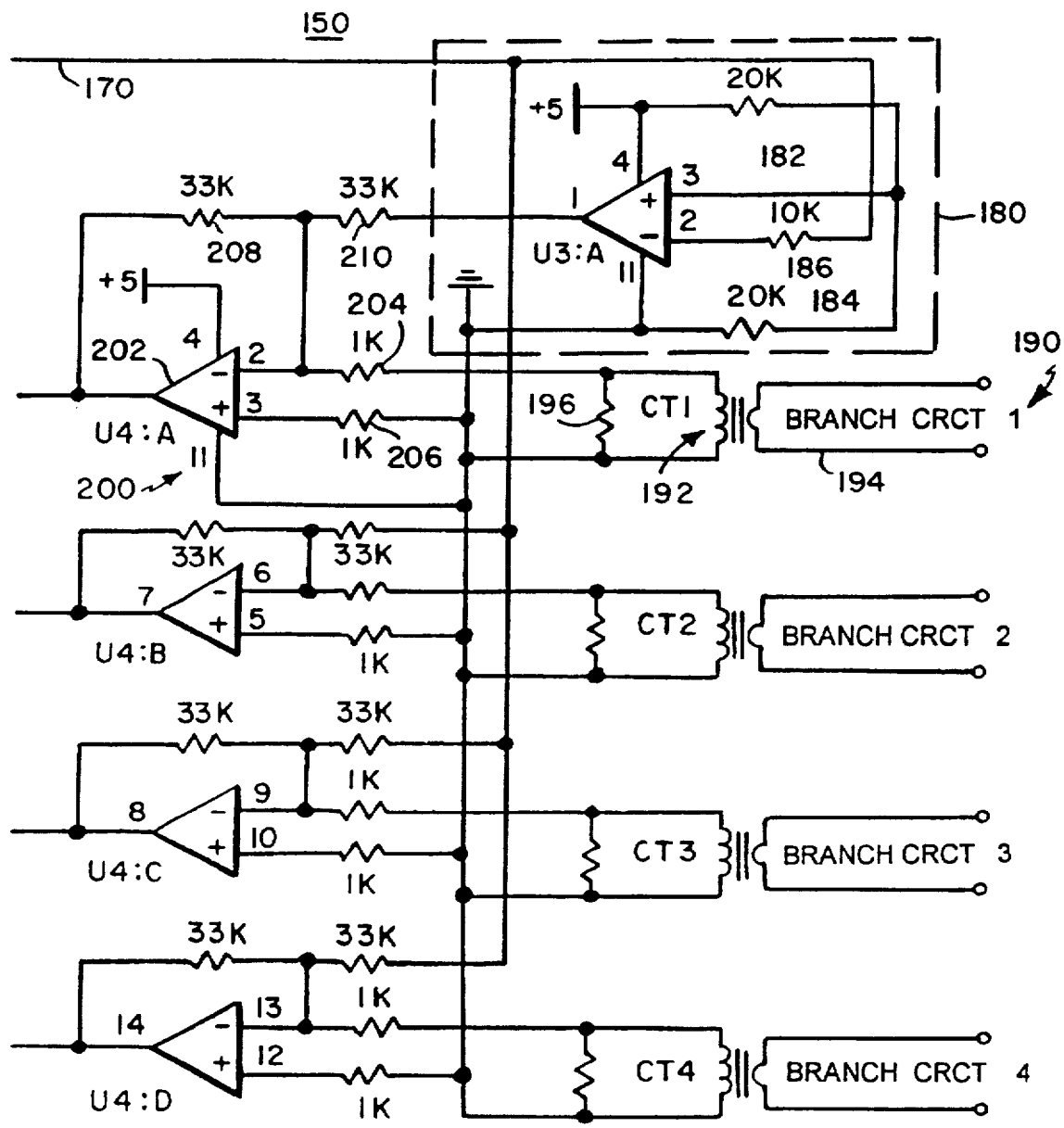

Of course, on/off/mode monitoring alone does not afford the user much useful information from which decisions can be made about reducing energy cost or usage. Power and energy consumption monitoring of individual loads is needed for this purpose. Referring now to FIG. 26, an exemplary illustration of a power monitor according to the invention is shown. The power monitor 150 uses the same power supply 82 and the same PLC bus interface 86 as in the current monitor. The microcontroller 152 is a Signetics 87C752 microcontroller which, while similar to the Signetics 87C751 microcontroller of the current monitor, also has internal analog-to-digital converters (ADCs), the use of which is explained below.

In the embodiment of FIG. 26, in which one module is used to monitor multiple branch circuits (it being assumed there is only one appliance per monitored branch), an assumption is made that all branches receive the same voltage. Under some circumstances this assumption can introduce error into the measurements, in which case measures can be taken to measure the voltage across each monitored load; that is, a power monitor circuit then should be placed close to the load. In contrast, the power monitor 150 can be placed in or adjacent an electrical service panel where access to multiple branch circuits is convenient. Consequently, the concern about unequal branch voltages is raised for completeness only and will not be further mentioned. The line voltage is sensed with a voltage divider, or attenuator, indicated generally at 154, and comprising amplifier 156 and resistors 158, 162, 164 and 166. The line voltage is attenuated by a factor of approximately 50, yielding on line 168 at the output of amplifier 156 an ac signal which is about 5 volts peak-to-peak. A 2.5 volt dc level is introduced at node 170 and added to the attenuated line voltage to bias the ac output of amplifier 156 to be in the range 0 to 5 volts dc. The output signal from the amplifier 156, labeled VOLTS, is supplied to one input port of the microcontroller, where it can be sampled by an ADC. The VOLTS signal is also supplied to one input of a comparator 172, via resistor 174. The other input of the comparator 172 is connected via resistor 176 to the 2.5 VDC level on node 170. Thus, comparator 172 operates as a zero-crossing detector, changing output state each time the line voltage passes through zero. The comparator output signal, named ZERO, is supplied to the microcontroller as an interrupt signal.

Circuit 180 generates the 2.5 VDC bias level for node 170. Resistors 182 and 184 provide a voltage divider which establishes a voltage mid-way between ground and the +5 volt supply. The feedback resistor 186 servos the amplifier output to this voltage.

In the illustrative embodiment of FIG. 26, four channels are shown, each for measuring the current in one branch circuit. Since the four channels are identical, only one will be explained. Channel 190 will be taken as exemplary. The current in the branch circuit is sensed using a torroidal-core coil 192 such as a Coilcraft CS60-0 current sensor as the secondary winding of a transformer which has as its primary winding a single turn of the branch circuit conductor 194 threaded through the core. The current through the branch circuit primary winding induces a voltage on the secondary winding; in the case of the CS60-0 current sensor, this is approximately 8–10 millivolts peak-to-peak per ampere (rms) in the branch circuit, using a 50 ohm load resistor 196. An amplifier circuit 200 comprising operational amplifier 202 and resistors 204, 206 and 208 provides a gain factor of about 33. Additionally, the 2.5 VDC bias from circuit 180 is added via resistor 210 to the output of operational amplifier 202, to place that amplifier's output in the in the range 0 to 5 volts, with 2.5 volts corresponding to a zero current signal. The output signal, CURRENT1, is supplied to one ADC input of microcontroller.

The ADC or ADCs in the microcontroller convert the VOLTS signal and the four current signals CURRENT1 . . . CURRENT4 into eight-bit digital numbers. These conversions are performed under control of the firmware which operates the microcontroller. Each conversion requires about 40 microseconds. To obtain voltage, current and power in each of the branch circuits, the controller is interrupted at each power line voltage zero crossing. A timer is then started in the microcontroller and one of the branch currents is read. At the end of one-quarter of an electrical cycle at the power line frequency (i.e., 1/240 seconds for 60 Hz power line frequency), as determined by the microcontroller timer, the current in the same branch is read again and the line voltage is read, as well. Designating the first current as IR, the second current as IP and the voltage as V, the power P and the reactive volt-amperes are then calculated as P=V(IP) and VAR=V(IR). On successive cycles, the currents in successive branches are read and the power in each of the circuits is thereby computed.

The power levels in each of the branches are accumulated by the microcontroller to determine the energy consumed in each branch circuit (appliance). Both the power and energy are retained for reporting to inquiring devices via the CEBus (or equivalent) communications link.

The foregoing method, of course, is an approximation that assumes that there are no non-linear loads on the branch circuit. This is a justifiable assumption in the case of motor, heating and resistive loads. However, the assumption is invalid for electronic loads such as computers, television sets, and so forth. When the load is non-linear, energy and power may be obtained by making more frequent measurements of current—perhaps 100 or more measurements per cycle of the line voltage. This, of course, requires analog-to-digital converters that operate far faster than those in the 87C752 microcontroller; but such ADCs are commercially available. Also, if the 87C752 microcontroller is not fast enough, faster microcontrollers are available and electrical engineers and technicians will know how to substitute another microcontroller for the 87C752 shown in the drawing.

The examples so far disclosed are not intended for revenue applications. Greater accuracy of measurement is required for customer billing. This accuracy is achievable by using higher quality current sensors such as the Bicron current sensors, and by using ADC's of higher resolution than those in the 87C752. Additionally, non-volatile memory is needed for storing the energy consumption figures.

In accordance with the ISA 60 Specification discussed above, the power monitor shown in FIG. 26 incorporates four analog sensor objects conforming to the specification (each channel providing one object). Pursuant to the Specification, the monitor can be polled by another CEBus node (such as the first microcomputer node); or another node may request that state changes (e.g., power consumption rising above or falling below a predetermined level) be reported spontaneously to the requesting device. Preferably, the microcontroller 152 also spontaneously reports when power consumption rises above or falls below predetermined thresholds or changes more than a predetermined percentage, so such events can be logged and energy consumption calculations can be based on new power levels.

Figure 27:
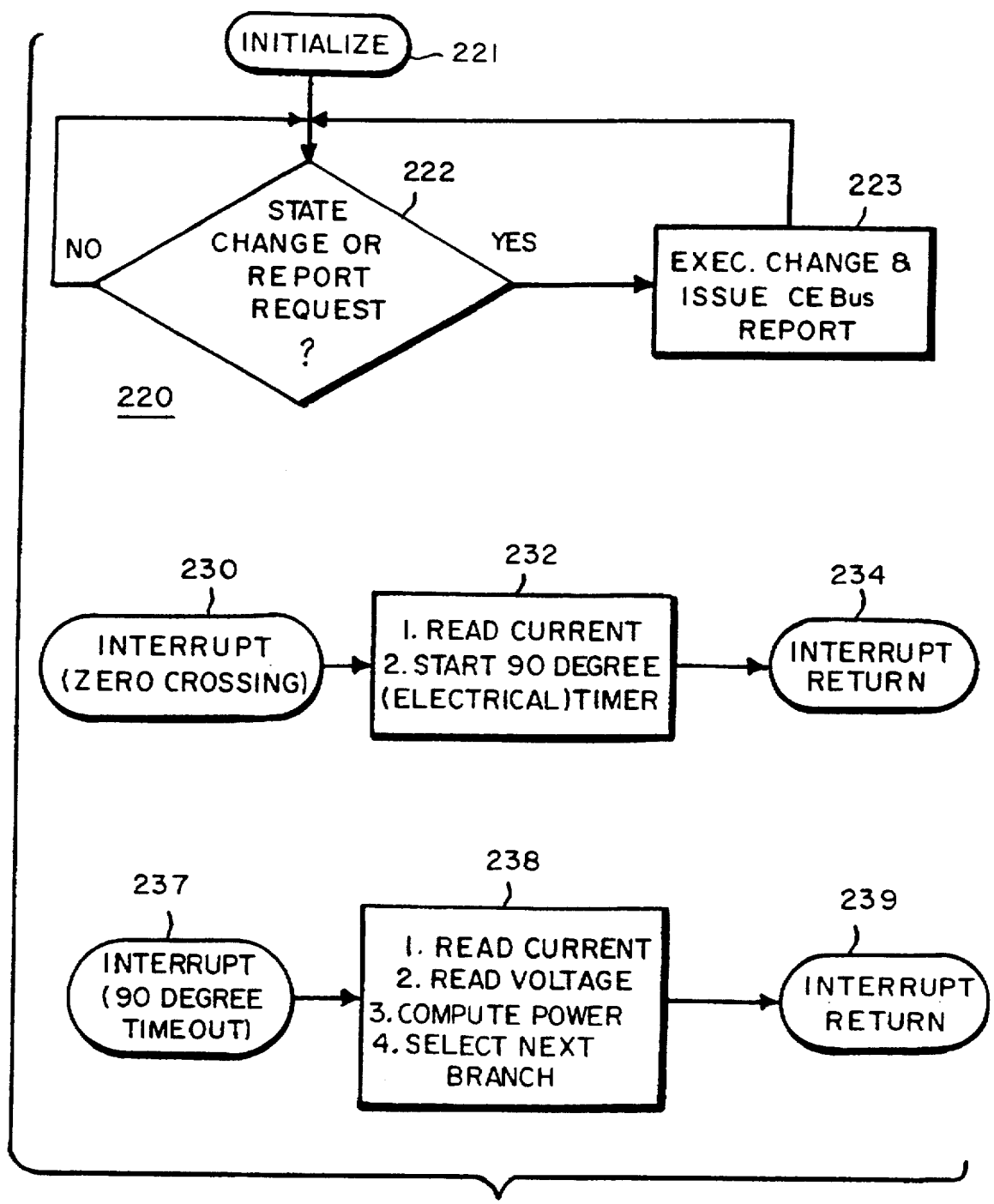
FIG. 27 is a flow chart for an exemplary program to be executed in the microcontroller of FIG. 26.

The operation of the power monitor microcontroller 152 is illustrated by the flow chart in FIG. 27. This flow chart includes three procedures, two of which are interrupt-driven. The procedure 220 executes continuously except when interrupted. First, it is initialized in step 221. Next, in step 222, the microcontroller looks for requests for changes to the state of the controlled device or a request to report on the controlled device. If a request/instruction for a state change or report is received, the controller complies in step 223 and control loops back to the entry of step 222. If there is no such message received, step 222 keeps looping on itself. When a zero-crossing occurs in the ac carrier signal, an interrupt request is issued, as stated above and as shown at step 230. To service the interrupt, step 232 is executed. In step 232, the reactive current for one of the branches (selected by a pointer—see below) is read. A one-quarter cycle (i.e., ninety electrical degrees) timer also is started. Then control is returned, step 236, from the interrupt service. When the timer times out, step 237, it generates an interrupt request which is serviced in step 238. In that step, the voltage and the in-phase component of the current in the selected branch are read. The power calculations are also made and stored, preferably with an implicit or explicit time stamp. A pointer is then set to select the next branch circuit at the next zero-crossing; this ensures a continuous cycling through the branch circuits. Finally, the interrupt service routine returns control to the procedure 220, which it left when the interrupt request was serviced, step 240.

The power monitor is adaptable for load shedding applications in the same manner as is the current monitor, by the similar addition of a relay, not shown.

Three-Phase Systems

In a commercial environment, the electrical power distribution system is often three-phase. This presents certain challenges with respect to the need, in a system according to the invention, to communicate data and commands via a power-line carrier communication system. One solution is to impose the same PLC signal on all three phases. It is only necessary to receive data signals on one phase, though, the others being redundant.

However, some facility meters for measuring watt-hour consumption in a three-phase system are driven via transformers. The inductance in the transformer may block the PLC signal. If a single-phase 110 volt line is run to the meter, though, sensor circuits in the meter can transmit readings via this 110 VAC line, back to a microcomputer.

The Communications Subsystem

As previously illustrated, the first microcomputer preferably is equipped with the capability of having one or more communications subsystems. Preferably this capability is achieved by equipping the first microcomputer with an industry standard bus and a variety of sockets on the bus for receiving therein circuit boards, cards or other modules. The bus may, for example, conform to the ISA, PCI, PCMCIA or other standard specification. The communications subsystems which can then be installed would include any communications device conforming to the standard. Thus, among the potential communications subsystems would be modems (wired or wireless), RF transceivers, fiberoptic data communications links, and packet transceivers (e.g., for use over the telephone system), to name a few possibilities.

Other communications devices can be added readily, as they become available. Moreover, several communications boards and cards can be installed in a customer's system. In addition to allowing the system to communicate with others via these boards and cards, the communications services can cross-communicate with each other through the customer's microcomputer, if it is suitably programmed.

Load Shedding

To shed a load, all that is necessary is to broadcast a command for a device at a specific address to turn off or for all devices of a particular priority level or levels or type to turn off. Since the system possesses distributed intelligence in the form of a programmable microcontroller in each load control module, the controller can determine whether its associated load meets the criteria established in the message and, if so, turn off the load. To turn on all shed loads, a predetermined message can be broadcast over the network. Alternatively, messages can be addressed by the first microcomputer to specific devices to be turned off or to which power is to be restored. As yet another alternative, the microcontroller can be programmed to restore power to its associated load after a predetermined time unless the shedding request is renewed. This latter approach is useful in reducing message traffic on the network. It also safeguards against failure to receive a power restoration message. In this manner, it can be assured, for example, that a refrigerator is not turned off for longer than a preset interval (assuming power is not lost). As yet another alternative, the message initiating the load shedding may contain a datum signifying the interval for which the load is to be shed or the time it should be automatically reconnected to the mains.

The status flag in the device table may be set to indicate the shed status of a device. If an "end load shedding" broadcast is received, then for each device on the system, the first microcomputer checks the status flag and generates a command to restore power to the load. The status flag is changed, also, during timed events. If a timed event occurs during a load shedding incident initiated by the power utility, the setting of the flag to a timed-event-in-progress condition will prevent the device from being turned on by a general "end load shedding" message.

Figure 28A:
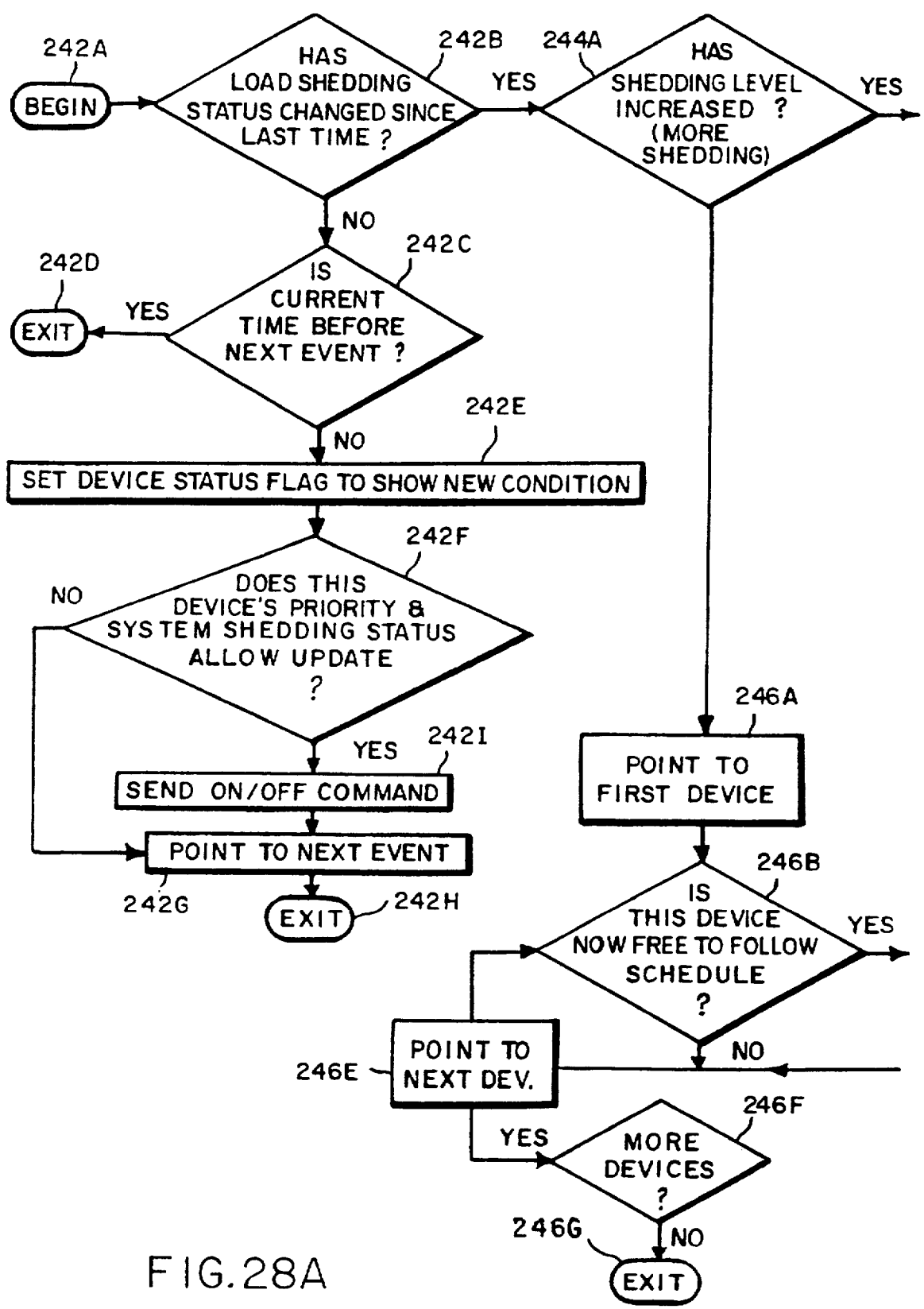
FIG. 28 is a flow chart for an exemplary program to be executed in the first micrcomputer to implement a load shedding function.

A suitable flow chart for a program module 240 to be executed by the first microcomputer is shown in FIG. 28. This program module is for use in the first microcomputer to address specific load control modules to implement load shedding. It is executed frequently (e.g., whenever scanning for keyboard input or input from communications systems), because a load shedding period may be initiated and may be terminated at any time, allowing devices to be turned on after having been turned off. It is also executed from the programs of FIGS. 38 and 39, as explained below, as a final check before turning on a load, to ensure that turning on the load will not violate an extant load shedding request.

The program is entered at block 242A. It first checks a Load Shedding Status flag (not shown) to determine whether load shedding status has changed since the last time it looked, step 242B. The Load Shedding Status flag is the contents of a specified memory location wherein a bit is set by the first microcomputer whenever a load shedding request (command) is received and wherein that bit is reset (i.e., cleared) when a message is received terminating a load shedding interval. In addition, the Load Shedding Status flag includes a number of bits which record the load shedding priority level then in effect. Thus the contents of the Load Shedding Status flag will change whenever the priority level for the shedding changes, as well as whenever a load shedding interval starts or ends. If the Load Shedding Status flag has not changed, control branches to step 242C. In step 242C, the then-current time is compared with the time the next scheduled event is to occur (preferably, each day's events in the Events table are maintained chronologically, for simplifying this comparison). If the then-current time is before the next event to be executed, the program exits, step 242D, and returns control to the calling program. However, if the then-current time equals or is later than that of the next event to be executed, the status flag (field) in the DEVICE table is set to show the new condition for the device connected with the event, step 242E. (Thus, even if the event is not allowed to occur, as next explained, the status flag will nonetheless show the device condition as though the event had occurred.) Next, a determination is made whether the device's priority level and the Load Shedding Status flag allow the event to be executed, step 242F. If the event specifies that the device is to turn on, for example, and there is an ongoing shedding request that would be violated were the device to be turned on, the event will not be executed and the device will not be turned on. If circumstances do not permit the event to be executed, control branches to step 242G. In step 242G, a pointer, called the event pointer, is updated to refer to the next event and then the program exits at step 242H. (The event pointer is simply a location in memory whose contents address the next event in the event table, to facilitate identification of the next event; the use of such pointers is a conventional programming technique.) Assuming the device priority and the Load Shedding Status flag permit the execution of the event, then control flows from step 242F to step 242I and the proper command is issued to execute the event. Following step 242I, steps 242G and 242H are executed as aforesaid.

If the Load Shedding Status flag has changed since it was last examined, control flows from step 242B to step 244A. In step 244A, a determination is made as to whether the load shedding priority level has increased or decreased. If the shedding level has increased, indicating more loads are to be shed, the program branches to step 244B. There, a pointer called the Shedding Pointer is set to point to the first device in the DEVICE table(s). A series of steps 244C–244F are next executed to check each device in turn and to turn it off if its priority level is within the range of those to be shed. The program then exits at step 244G.

If in step 244A it is established that the shedding level has decreased, instead, a series of steps are executed to check each device in the DEVICE table, in turn, and to turn on those devices which are no longer subject to the shedding request and which would, except for the shedding condition, otherwise be in an on condition and free to follow their programmed schedules. These steps are shown at 246A–246F. When there are no more devices to check, the program exits at step 246G.

Power Outage

In the first microcomputer, the state of the machine is stored frequently, such as every thirty seconds. Not only is the data stored, but so also is the then-current date and time. When the first microcomputer is powered up after an outage, it reads the date and time from a CMOS clock (which is conventionally present in a modern microcomputer) and then reads the previous state of the machine, with the date and time of its recording. From the difference between the two times, the duration of the outage is determined, and logged for later reporting to the appropriate utility company.

Reports

The reports this system can generate for both the customer and the utility company have great usefulness. One cannot exhaustively catalog the reports which can be generated from the information available. The data provided by the system's current and power monitors and from all of its data structures can be exported to conventional database programs from which it can be reported and examined in innumerable ways. However, some of the reports which have been generated experimentally or by simulation will illustrate the value of the system.

Figure 29:
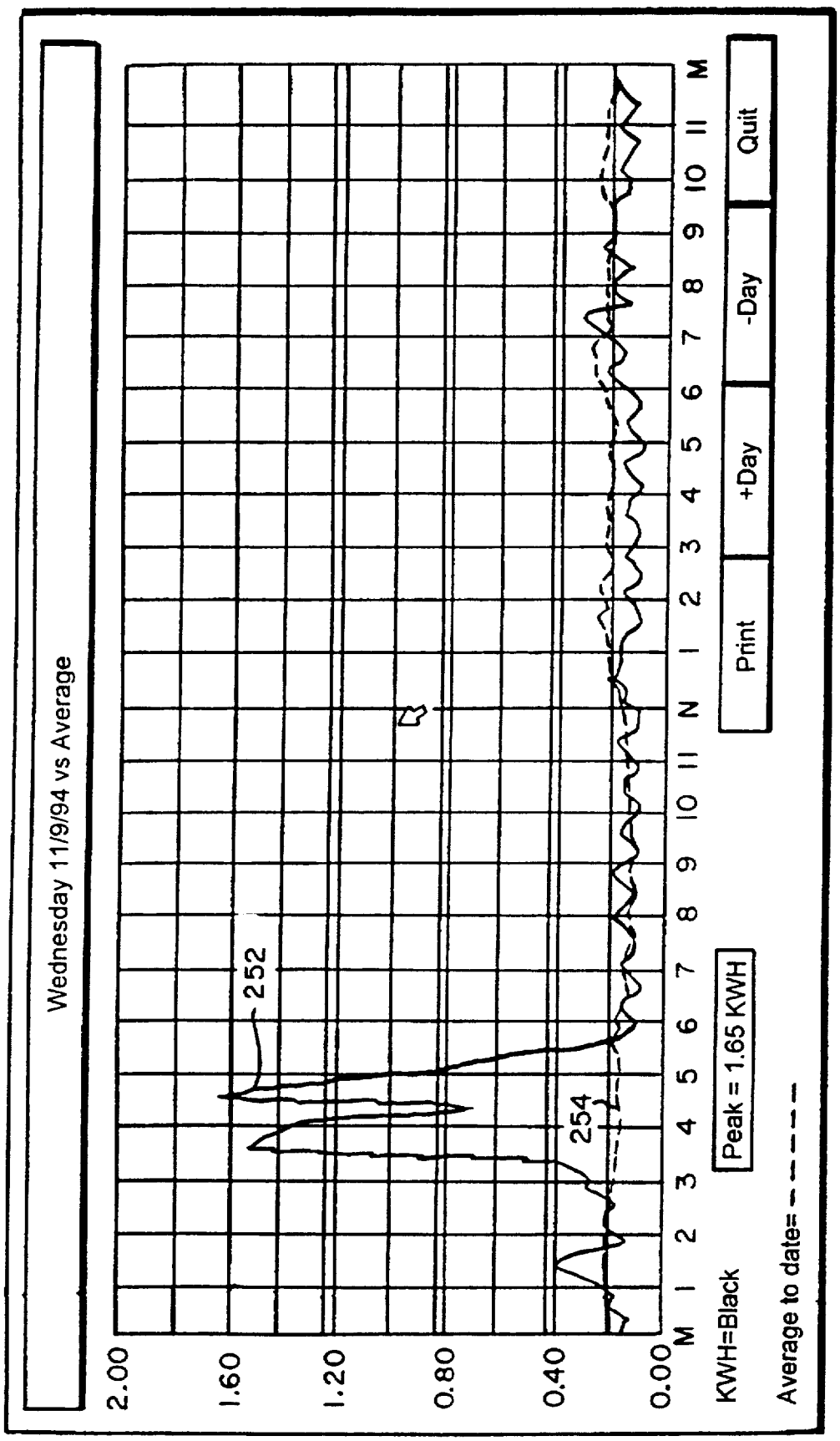
FIG. 29 is a copy of an exemplary output screen according to an aspect of the invention, showing a plot of average energy usage by a customer, as a function of time over a one-day period, measured over an interval considerably longer than one day, matched against a plot of the customer's actual energy consumption during the same day.
Figure 30:
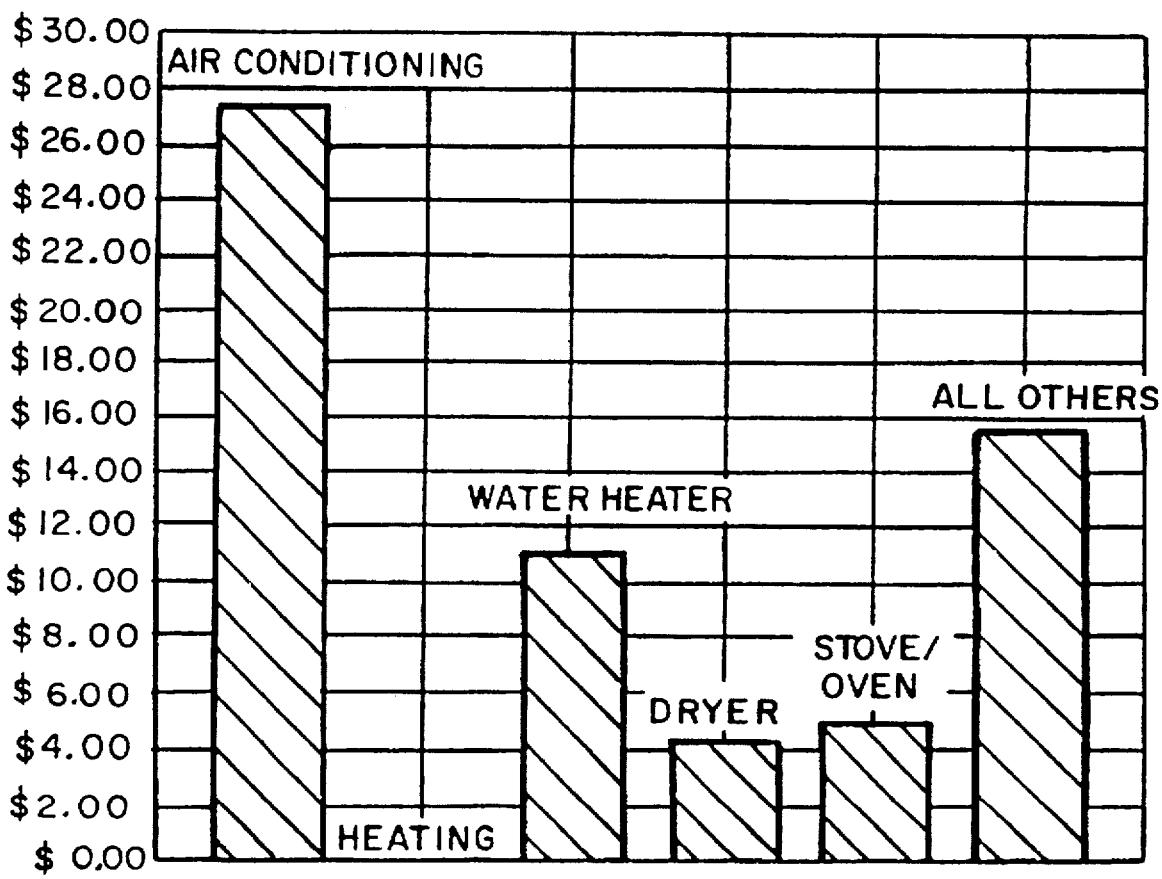
FIG. 30 is an illustration of a graphical report which may be provided by the invention to show, for a given period (e.g., one week), the cost incurred by the customer (e.g., a household), for the electrical energy used by each monitored load and by all non-monitored loads collectively.
Figure 31:
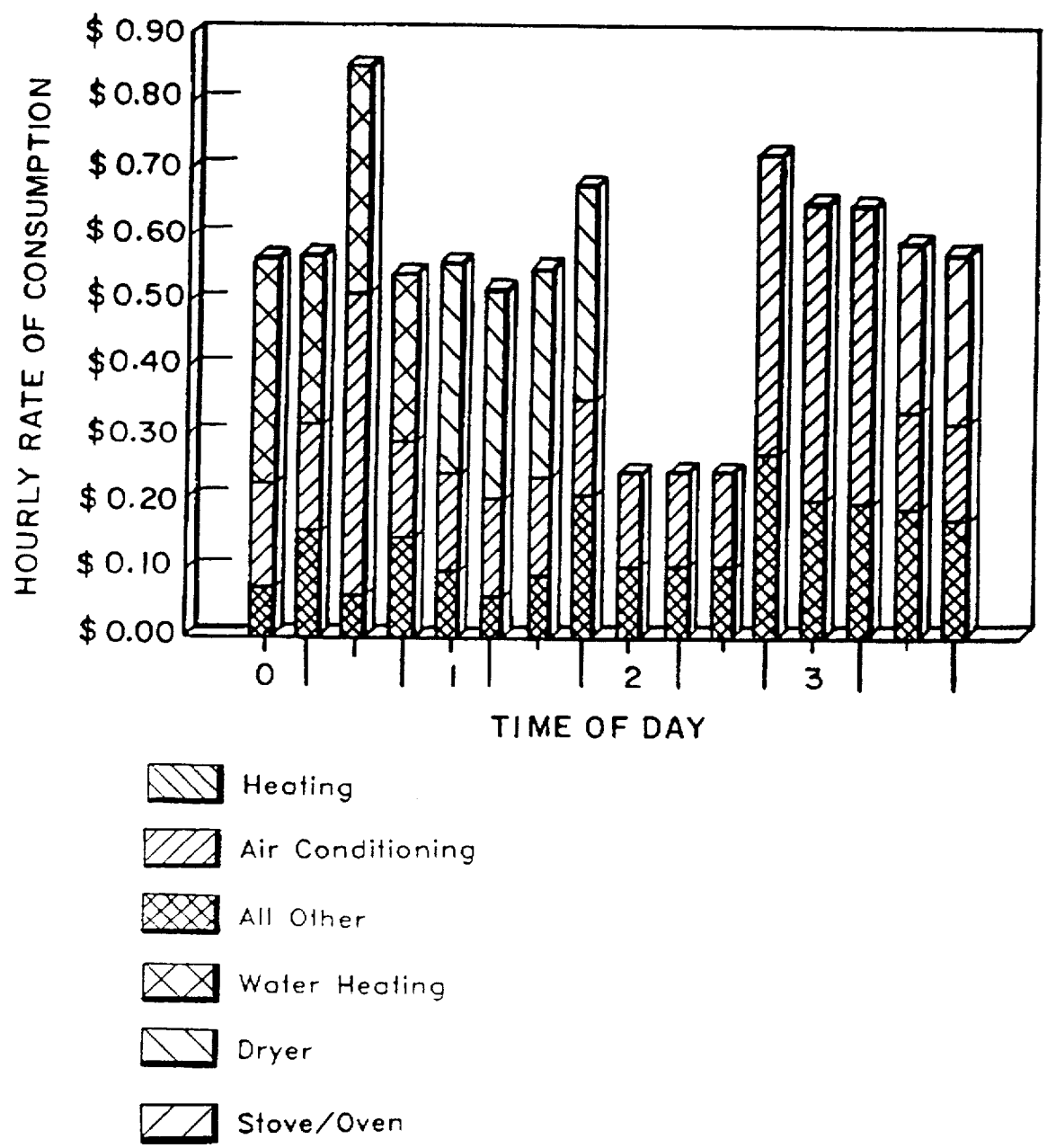
FIG. 31 is an illustration of a graphical report which may be provided by the invention to show, as a function of time of day, the total electrical energy cost incurred by the customer (e.g., a household), and the contribution to that total made by each monitored load and by all non-monitored loads collectively.
Figure 32:
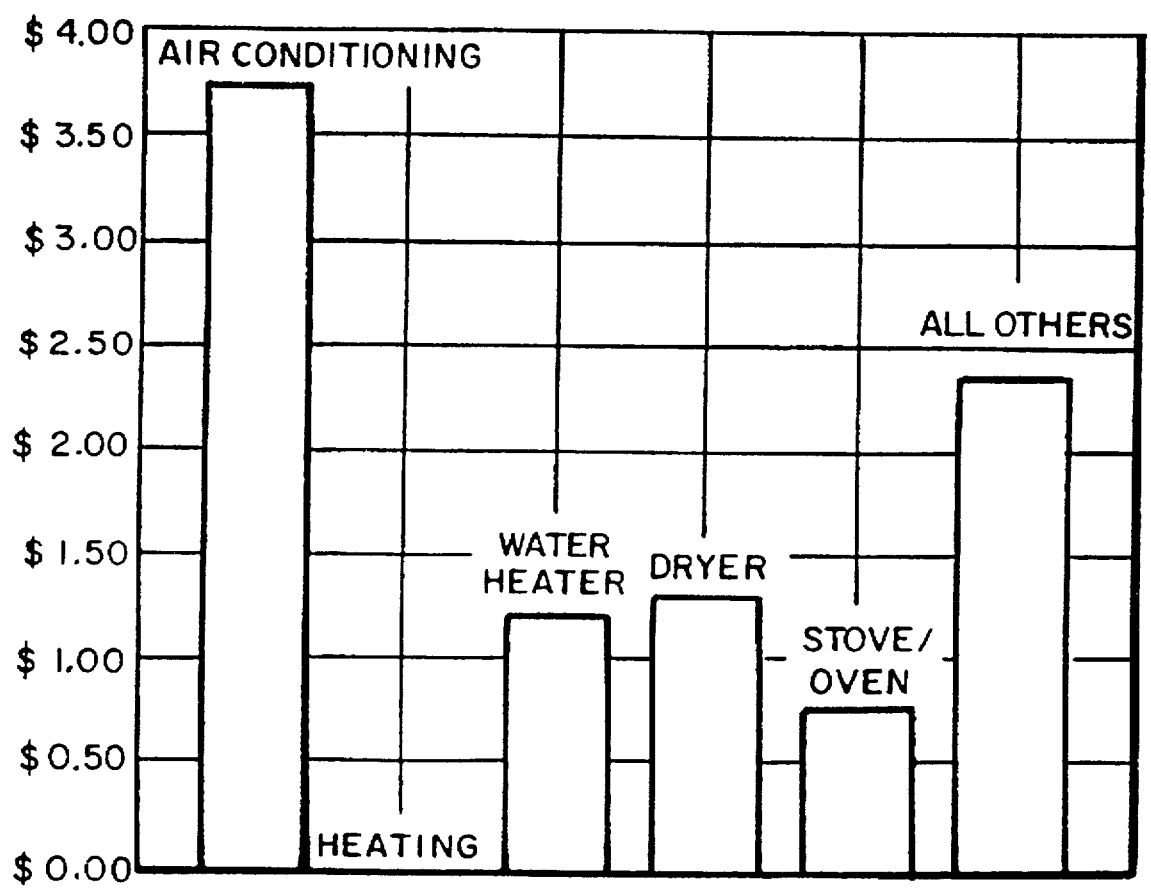
FIG. 32 is an illustration of a graphical report which may be provided by the invention to show, for a selected day, the average cost of electrical energy incurred by the customer (e.g., a household) for operating each monitored load and all non-monitored loads collectively.
Figure 33:
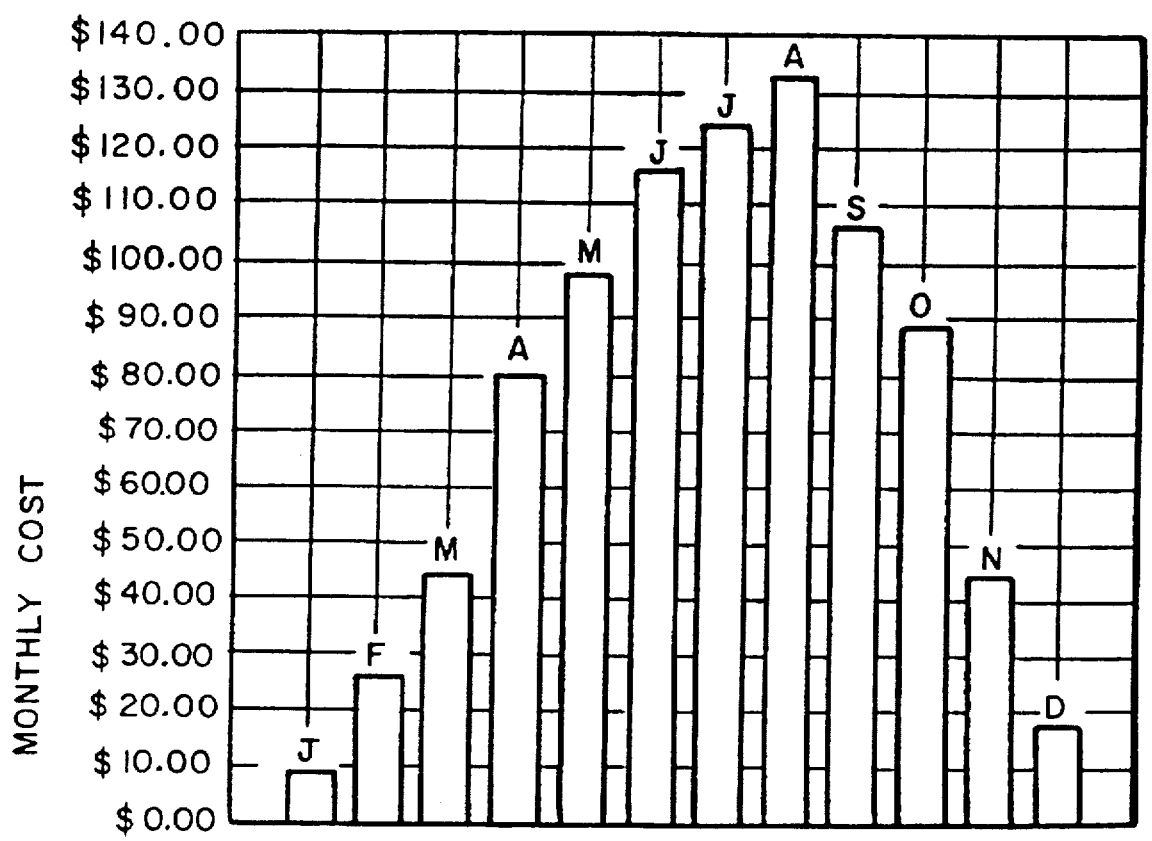
FIG. 33 is an illustration of a graphical report which may be provided by the invention to show, for an entire year, the cost each month for the electrical energy used to operate a selected monitored load, such as an air conditioner.
Figure 34:
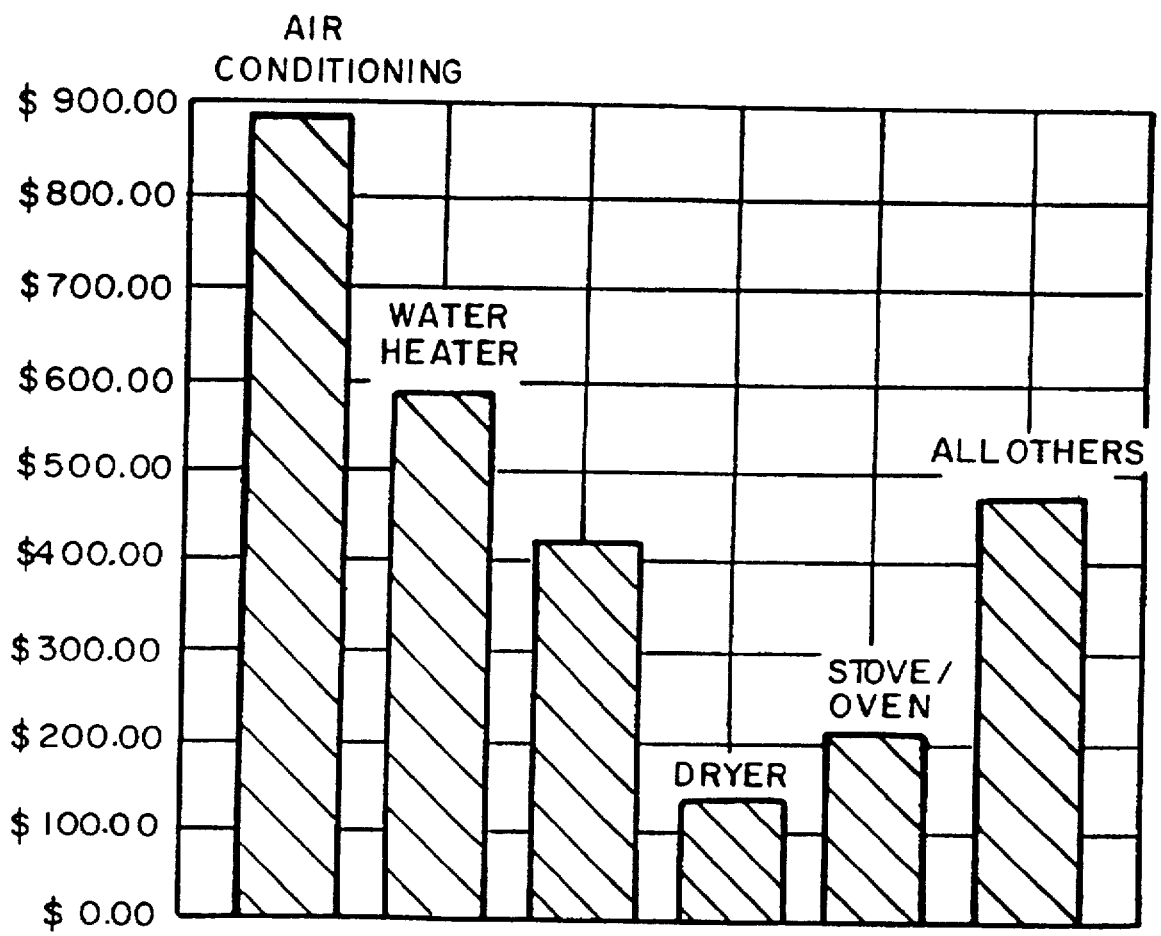
FIG. 34 is an illustration of a report like that of FIG. 30, except that the reporting period is one year.

In FIG. 29, a graph 252 is shown of a customer's total energy consumption over one day, compared with a graph of a running average of the customer's usage, at 254. The horizontal axis is marked in one-hour time units. If the customer wants to know which appliance caused the peaks at about 3:30 and 4:30 a.m., graphs (not shown) for individual appliances can be overlaid the graph 252. In this instance, the peaks are known to have been caused by the running of an electric clothes dryer. The small peak near 1:30 a.m. was caused by all house lighting and a vacuum cleaner being turned on. Another example is shown in FIG. 30, wherein a bar graph has been constructed, showing the cost for operating each monitored load in a single house for one week; obviously such data will change from week to week and from household to household. Another presentation, in FIG. 31, is a bar graph showing how much of the total energy consumption is due to each of the various loads as a function of time of day. Yet another way to look at the available data is the report shown in FIG. 32, which shows a bar graph in which each bar indicates the daily average cost of each monitored load over some selected time interval; by choosing different intervals to report on, seasonal variations will become evident. Seasonal variations are also observable by selecting for one load (e.g., an air conditioner), a report such as shown in FIG. 33. The total yearly cost of operating each load can be seen by a report such as that in FIG. 34. The report generator module contains a spreadsheet program and templates which generate each of the foregoing reports. However, the user can load any of the collected data into a spreadsheet program of the user's choice, which then will allow the user to ask, and obtain answers to, "what if" type questions. For example, the user can then determine how much can be saved by operating a specific appliance on a different schedule.

Figure 35:
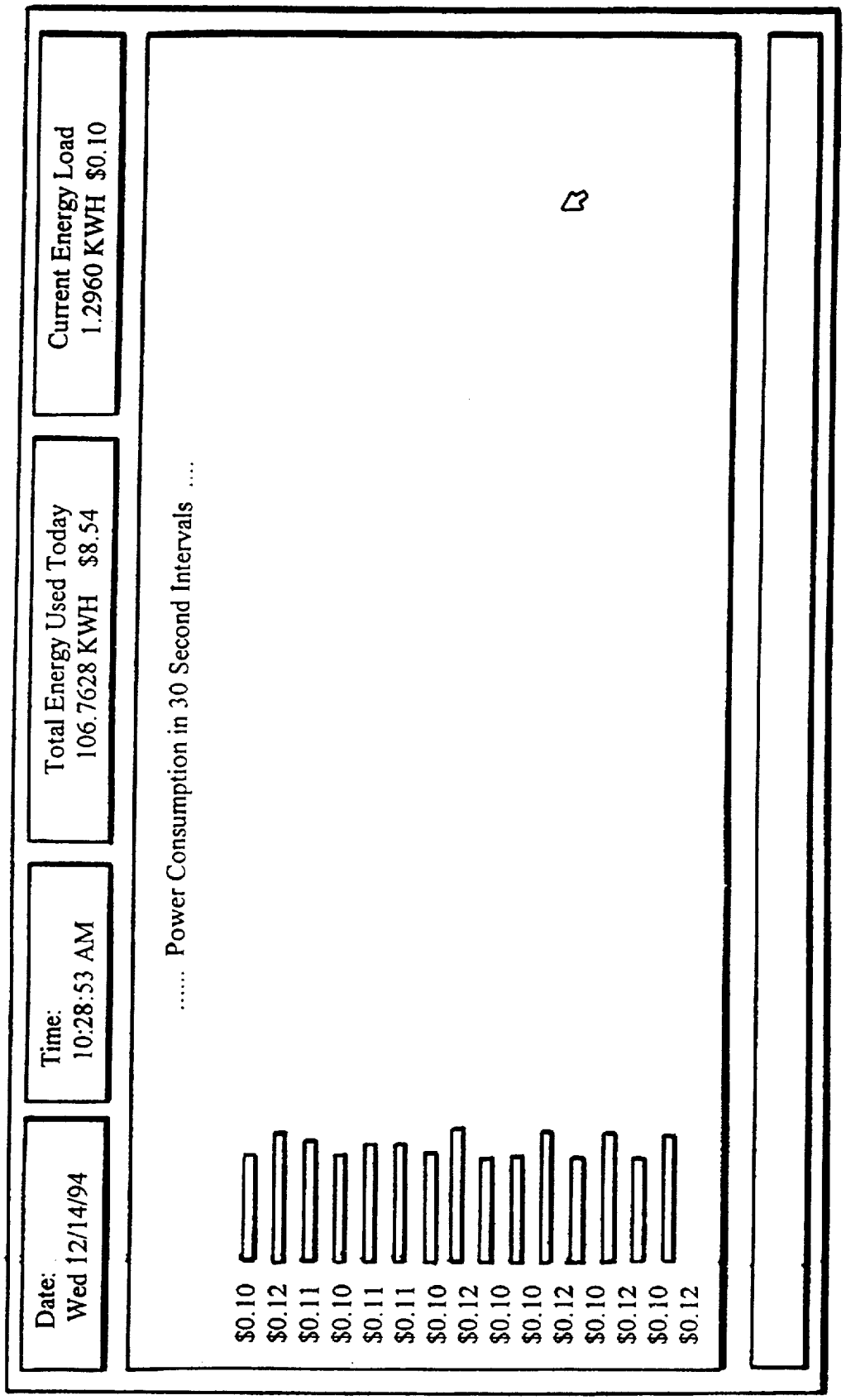
FIG. 35 is a copy of an exemplary output screen according to an aspect of the invention, showing a so-called energy usage speedometer.
Figure 36:
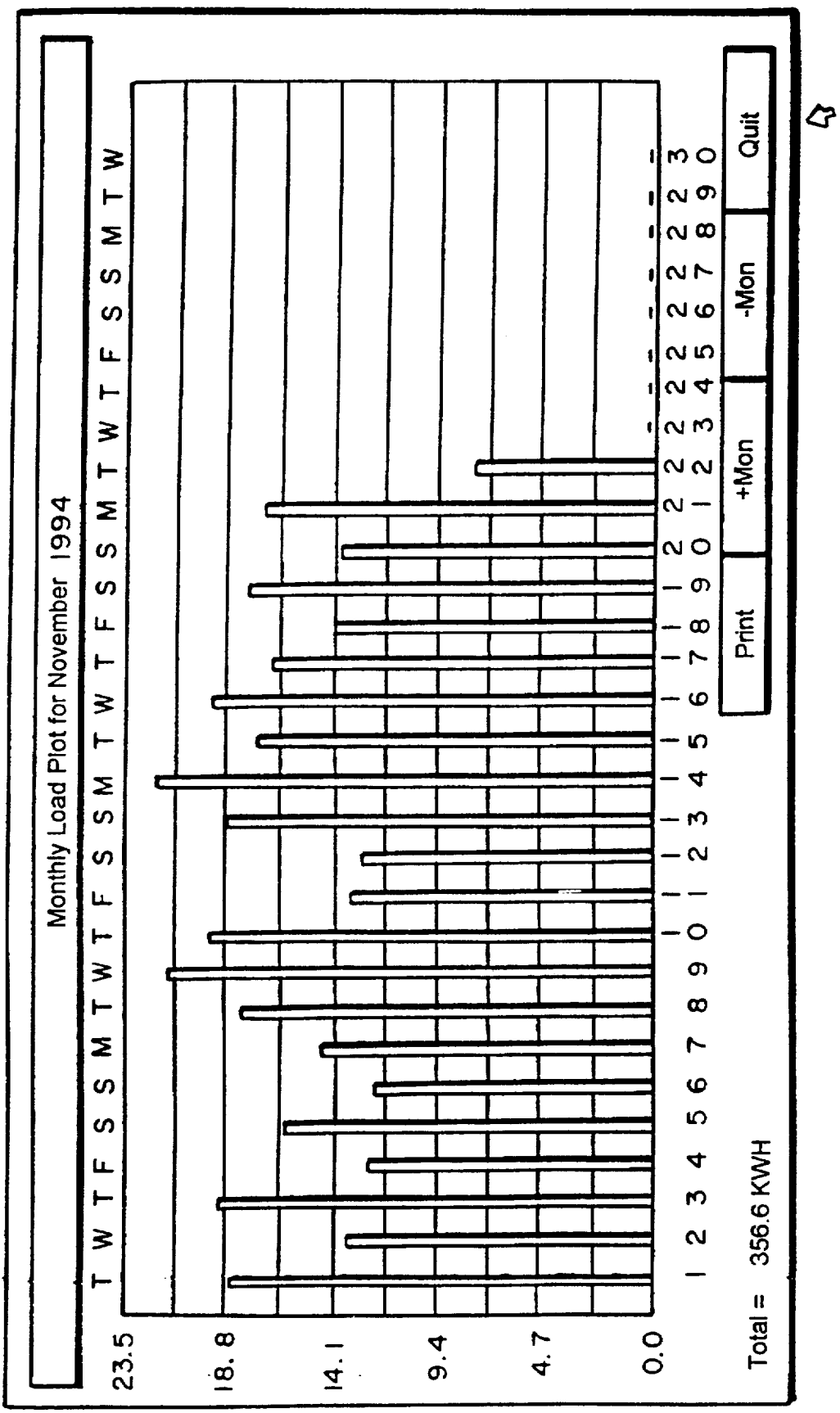
FIG. 36 is a copy of an exemplary output screen according to the invention, showing a customer's daily usage of electric energy.
Figure 37:
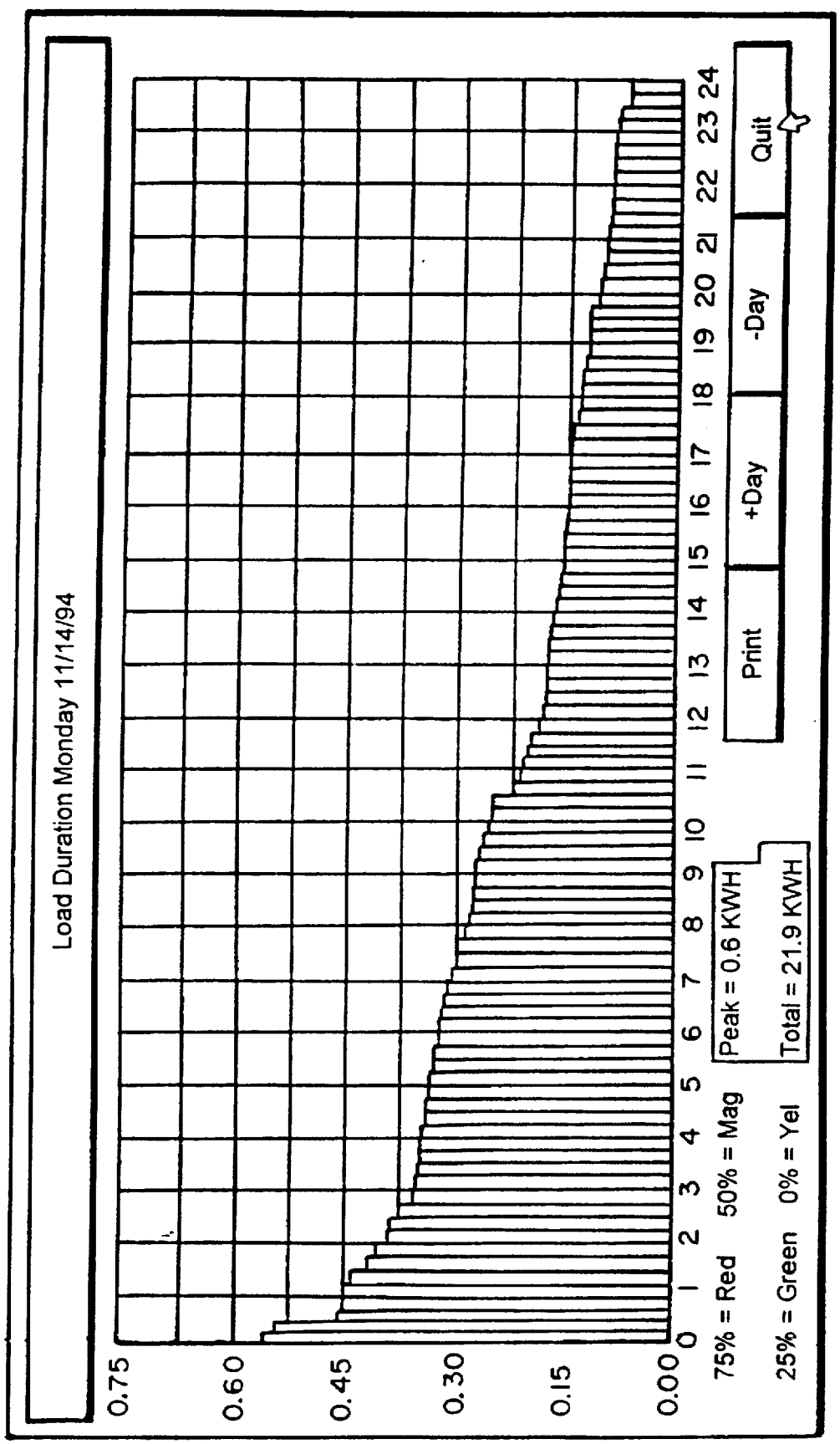
FIG. 37 is a copy of an exemplary output screen according to the invention, showing the distribution of a customer's load duration during the course of a day—that is, how long energy was consumed at a given level (expressed as a fraction of a maximum value)

Similarly, the total energy consumption can be displayed on the monitor of the second microcomputer as a bar graph which constitutes an energy usage speedometer, as shown, for example, in FIG. 35 (which expresses the result in terms of dollar cost) or FIG. 36 (which expresses the result in terms of kwh). In FIG. 35, the box labeled "current energy load" displays the energy cost for the most recent thirty-second meter reading interval normalized to one hour (i.e., assuming that rate were steady for one hour), and the corresponding number of kilowatt-hours. Along the left side of the screen is shown a sequence of several such thirty-second interval measurements and a horizontal bar of length proportional to the energy consumption. Optionally, an alarm can be sounded or the screen color can be changed as a function of the amount of energy being consumed (as shown in FIG. 37, which shows how much time, over the course of a day, a customer consumed energy at a given level—expressed as a fraction of a maximum).

Timed and Conditional Operations

Figure 38:
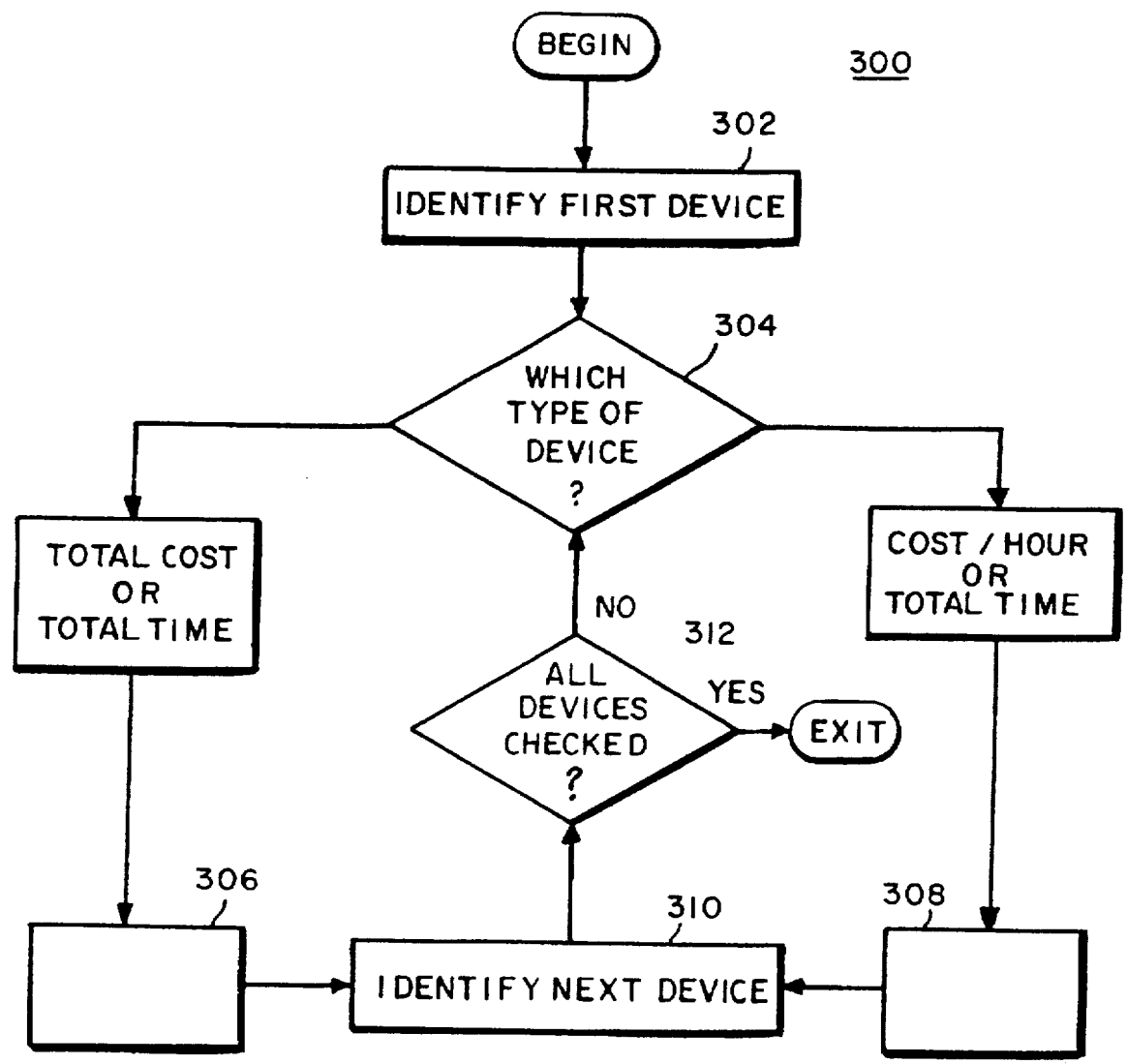
FIG. 38 is a flow chart of a program according to the invention, for execution in the first microcomputer to turn load devices on or off according to established conditions.
Figure 39:
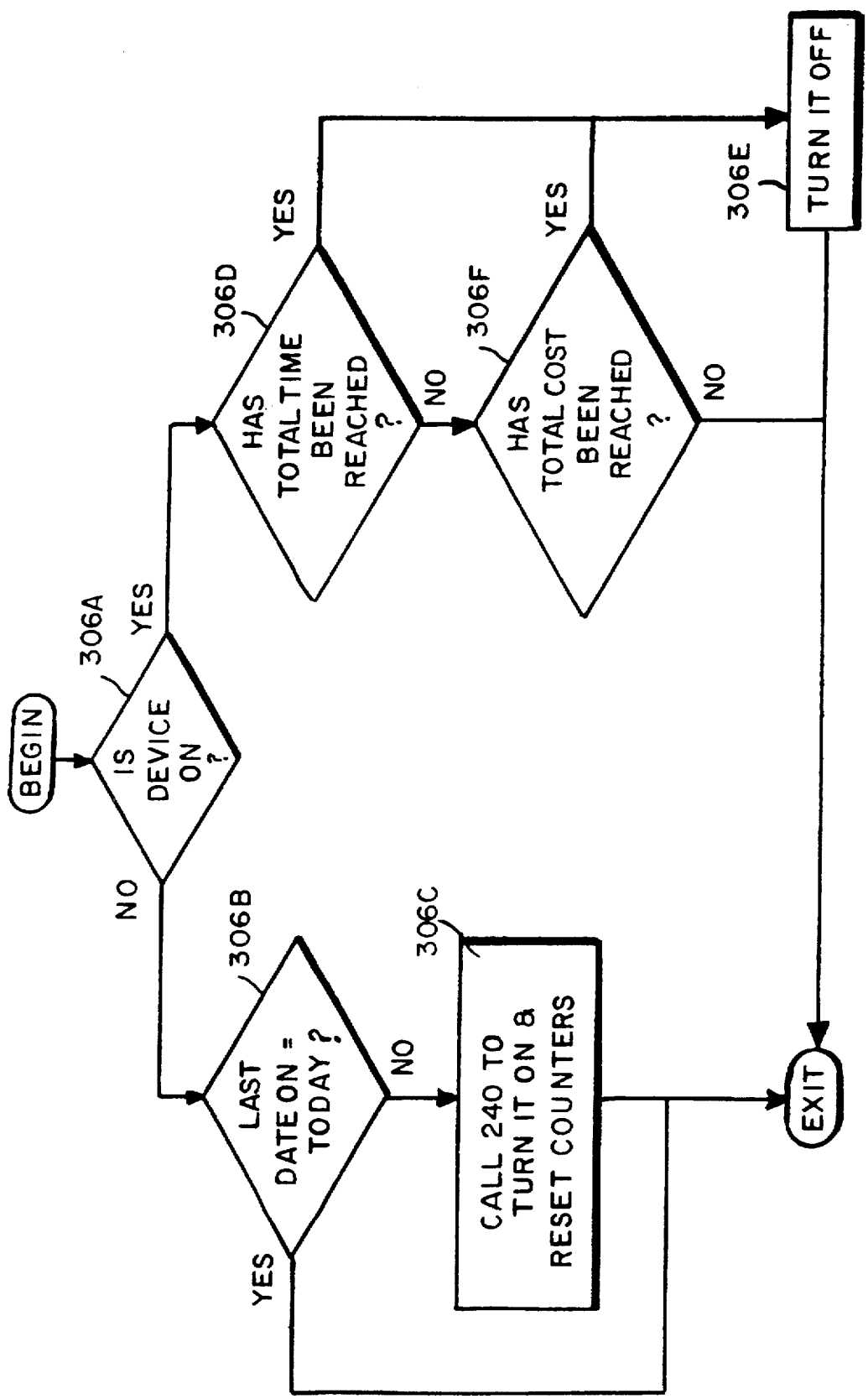
FIG. 39 is a flow chart of a program according to the invention, for execution in the first microcomputer to turn load devices on or off according to total time, date restrictions or cost restrictions established in advance by the customer and/or utility company.
Figure 40:
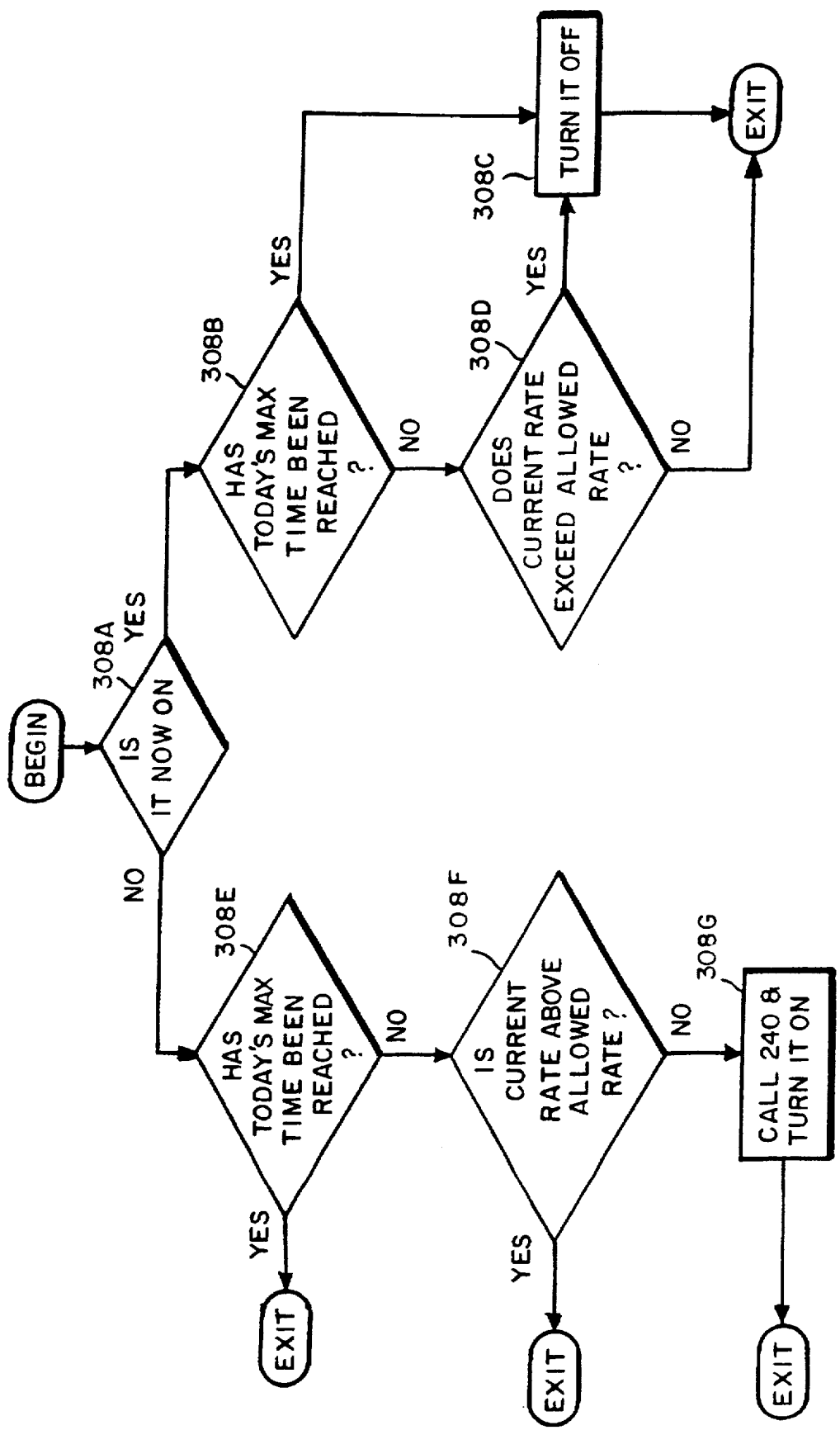
FIG. 40 is a flow chart of a program according to the invention, for execution in the first microcomputer to turn load devices on or off according to total time or energy cost restrictions established in advance by the customer and/or utility company.

Flow charts for program modules to be executed in the first microcomputer for performing conditional on/off device operations are shown in FIGS. 38–40. These program modules are executed before turning on a device as well as periodically (to turn off devices that should no longer be turned on and to turn on devices following rate decreases). A first device to be so controlled is identified, step 302. The device type is next established, step 304; if the device operation is to be controlled on the basis of total cost or total time, control branches to module 306, which is expanded in FIG. 39. However, if the device operation if to be controlled on the basis of energy rate (i.e., cost per kwh) or total time, control branches to module 308 which is expanded in FIG. 40. Following execution of modules 306 and 308, control returns to step 310, in which the next device is identified. A determination is then made, step 312, whether all devices have been checked. If not, the device type is determined in step 304 and the program executes as aforesaid; if all devices have been checked, the module exits.

Referring to FIG. 39, a first check is made, step 306A, to see whether the device already is turned on. If not, the current date is compared with the last date the device should be allowed to turn on, from memory, step 306B. If the dates match, the module exits without turning on the device. If the dates do not match, the device will be allowed to turn on provided this would not violate a load shedding operation in progress. Thus program 240 is called and a "turn on" message is generated if program 240 allows; also the usage counter for the device is reset to begin recording usage during this interval of use, step 306C. On the other hand, if the device already is on, the program next checks whether total time has been reached or exceeded, 306D. If the answer is affirmative, the device is turned off, step 306E. Similarly, if the total time on has not exceeded that authorized, a check is then made (step 306F) to determine whether the total authorized cost has been reached, step 306F. If the answer is affirmative, the device is turned off, step 306E; if not, the module exits.

FIG. 40 shows an illustrative flow chart for module 308. First, the status of the device is checked to see whether it is already turned on, step 308A. If the device is on, a check is made to see whether the current day's maximum time allotment has been reached, step 308B; if so, the device is turned off, step 308C. If not, a check is made to determine whether the then-current rate charged for energy exceeds the maximum allowed charge the customer has set for the device, step 308D. If the answer is affirmative, the device is turned off, step 308C; otherwise, the module terminates. If the device is not on at step 308A, the module checks to determine whether the current day's maximum time allowed for the device has been reached, step 308E. If the maximum time has been reached, the module exits without turning on the device. But if the maximum time has not been reached and a load shedding operation in progress would not be violated, the device is turned on, step 308G, but only if the current energy rate does not exceed the maximum allowed rate set by the customer, step 308F. Step 308G incorporates a call to program 240 to perform the load shedding screening operation.

Uses and Advantages

It will thus be seen that the system of the present invention has a great deal of flexibility and that it can be operated in many different ways to achieve many diverse functions. Included are at least the following operations and advantages:

A. Remote Electronic Meter Reading—The system provides an interface which allows energy consumption information to be forwarded from the customer premises to the utility company. The forwarding operation can be initiated by the customer or by the utility company transmitting to the microcomputers at the customer's premises a request for information. The consumption information can be date- and time-stamped, to facilitate time-of-day and other variable rate billing operations. The information request can be generic or it can specify that the information to be sent should be the contents of the memory address where the watt-hour meter reading is stored. This information could have great value to a utility which can create and use to advantage actual customer energy-usage profiles. Additional advantages include facilitating billing when a property is being sold. The seller can be billed up to a predefined time (the meter being remotely read at that time) and the buyer can be billed thereafter. This feature may be combined with the following two advantages.

B. Remote Connects and Disconnects—By using the system to provide remote monitoring and load-shedding commands, a utility company can deliver energy to a customer on a pre-paid basis (see below). When the utility company detects that the customer has exceeded the prepayment or has exhausted its credit, service to the customer can be remotely disconnected (or later reconnected). For this purpose, remotely controllable watt-hour meter switches already are available; the present invention facilitates operation of such meters, though, as it allows use of CEBus meters rather than meters controlled by radio signals. For example, since usage is being monitored by the first microcomputer, it can be programmed to actuate the meter switch (through an appropriate interface) at a preset time or on preset conditions (e.g., amount of energy consumed). A CEBus-compliant remotely controllable watt-hour meter is available from Landis & Gyr, for example. The utility can remotely check that the meter switch has been actuated to disconnect power by interrogating the first microcomputer for the meter reading a number of times. If the meter reading does not change, power has been disconnected.

C. Revenue Protection Alert—With a base computer in the customer premises monitoring power consumption and controlling appliances during peak usage hours (at which time energy cost also typically increases) or power emergencies, the system of the present invention offers revenue protection features for the utility company. First, when a customer has moved, the system can be used to read the meter, allowing the company to issue a final bill to the customer. Second, it can notify the system at the customer premises to perform a remote disconnection, as explained immediately above. Even if the premises is not equipped with a remote disconnection feature, or if the remote disconnection feature is not actuated, a degree of protection against unauthorized power consumption can be achieved; the inventive system can be used to monitor the customer's usage to ensure that all major appliances are turned off and no significant power is being consumed. This is done by periodically (e.g., daily or even hourly) reading the watt-hour meter. The first microcomputer at the premises can be programmed to do this automatically; the utility company also can issue remote requests for meter information. If the system detects power is being used, it can send a notification to the utility company and the utility can undertake appropriate action. Additionally, the system can monitor or allow the utility to monitor specific appliances to ensure they are not consuming power during specified (e.g., peak rate) periods, if the customer has agreed not to use the appliance under such conditions.

D. Emergency Load Shedding—To improve power system reliability and control distribution system loads during area-wide emergencies, customers are allowed to prioritize their loads and the utility can transmit (both to individual customers and to groups of customers, such as those in a particular area) a message to disconnect loads of selected priorities, or in priority sequence. For example, the customer may be allowed to designate load priorities from level 0 to level 3. The customer might designate one priority 0 appliance to which power would almost never be interrupted, two priority 1 appliances to which power would only be interrupted to avoid a rolling blackout, any number of priority 2 appliances which could be cycled on or off to maintain system stability during an emergency, and any number of priority 3 appliances which are treated as non-essential and can be shed at any time by the utility company. This arrangement can help reduce peaks and allow the utility company to avoid the need to build additional generating capacity or to buy power, helping to reduce energy rates. It further reduces the threat of rolling blackouts during extreme conditions, while providing customers the freedom of setting their own priorities for load shedding and providing the utility company a high degree of control over system loads. Additionally, the customer may be kept informed of such conditions via the display of the second microcomputer in the customer premises. To reduce message traffic, the same message which effectuates load shedding can invoke at the customer premises a display message indicating that a need has arisen to shed loads, as a result of which certain named appliances will be deprived of power.

E. Outage Notification—The system further may provide an outage notification feature whereby the utility is notified when a power outage condition exists at the customer premises. This feature may be implemented in a number of ways. According to one option, the microprocessor in the first microcomputer may incorporate circuitry to detect that the supply voltage is dropping and to generate an interrupt request which is serviced by a routine which sends out a message stating that an outage has occurred at the site. According to another option, if the microprocessor does not incorporate such circuitry, it is separately provided and connected to the microprocessor to supply the interrupt request signal. The power outage message may be transmitted to the utility company via the telephone system or by an RF (wireless) broadcast or via another channel. If the telephone system is to be used, the CPEU must include a telephone autodialer (not shown) or communications program and modem (not shown). If an RF transmission is to be sent, then the CPEU must include an RF transmitter and a program to control the transmitter and broadcast the message. Preferably an auxiliary power source (such as a battery or capacitors; not shown) is provided in the CPEU to ensure there is sufficient power for a time sufficient to allow the power outage message to be sent. The use of an RF broadcast is preferable to the use of a telephonic message to increase the likelihood of the message being received by the utility company; when a telephonic signaling system is employed, there is a danger that the cause of the power outage (which may be, for example, a tree fallen across the power line or fallen utility pole) also may cause an outage of telephone service. By comparing outage notifications from numerous customers, the utility company can locate and direct repair crews to the problem site quickly and at lesser expense, since the repair crew will not have to waste time locating the fault.

F. Community Emergency Alert—Using the same messaging service employed for load shedding, a community alert feature can be provided. This would allow the utility or its designed to broadcast to customers in a selected area news and alert messages (for display) regarding emergency situations such as severe weather warnings. If an audible alarm signal can be annunciated by the customer's computer, it can be sounded; a special alert message can also be displayed on the computer screen. If an interface has been installed between the system and the customer's television or cable TV system, a message can be sent automatically to turn on the television and tune it to a special energy channel for retrieval and display of detailed information and updates as they are broadcast.

G. Bill Payment—Using the communication capabilities of the system, the customer can display his/her/its account information on the screen and authorize payment by electronic funds transfer or credit card. This reduces the utility's direct labor and postage costs.

H. Interruptions Analysis—A major source of service calls to an electric power utility company is momentary interruptions of service. Such interruptions commonly are caused by tree limbs contacting overhead wires, causing protective relaying to activate. These interruptions often irritate customers who must, as a result of the interruption, reset digital clocks and other appliances. Interruptions of this sort are a significant source of complaint calls to electric utility companies, and handling these calls involves expense. By tracking momentary outages at the customer's premises, the system can help pinpoint the location of such line contacts and allow cost-effective pro-active correction of the condition. More specifically, if the first microcomputer detects multiple momentary interruptions meeting frequency and duration criteria established by the utility, it can then initiate a message to the utility company, requesting a service call by a line crew. The utility company, by determining whether similar requests have been received from other customer's CPEU's and, if so, determining the location of the power feed cable common to the affected customers, can localize the problem and efficiently direct the repair crew to the problem area.

I. Customer-Controlled Circuits—Via the system's video interface, a customer can control lighting and appliances. For example, the customer can operate exterior or interior lighting, start the coffee pot, operate a sprinkler system, schedule the pool pump, etc. All of these operations can be controlled from a central location using a video interface which presents an input/output display tailored to the type of load.

J. Temperature Control—Using the video display, any CEBus-compatible thermostat can be programmed to predetermined comfort levels by the day of the week and hour of the day.

K. Seasonal Mode—Using this option, the customer can store lighting, heating and cooling schedules to correspond with the seasons.

L. Empty Nest Mode—This option allows the customer to store a schedule for energy use which would conserve power consumption during vacations and other times away from home. It can be coupled to a humidity sensor to allow a dehumidifier or air conditioner to be switched on to reduce the threat of mildew during high humidity periods.

M. Power Pickup Staging—When a power outage occurs, before backup control power is lost, a message may be sent by the first microcomputer to all control modules to open all breakers and disconnect the loads from the mains. Alternatively, breakers may deenergize in the open-circuit position, not re-energizing and closing until signaled to do so. When power is restored, the first microcomputer brings each load on-line in a predefined sequence based on the appliance type and its restart requirements. A pseudorandom delay within a predetermined range may further be added to avoid having all appliances of a certain type come on-line at the same time. This capability ensures that all of these loads do not come back on-line the instant power is restored, and that their reenergization is staggered. This alleviates a significant strain on the power system and helps to minimize cold load pickup problems. Additionally, some appliances require a reset period before power is restored; this includes some older air conditioning systems. A programmed waiting period allows these appliances to come back on-line in a normal fashion and avoids straining the power system and the appliances by prematurely restarting them.

N. Cost-Effectiveness—The disclosed invention has particular cost advantages to the customer. The watt-hour meter and the first microcomputer is part of the CPEU, outside the customer premises and is owned by the utility company. Therefore the customer need not invest in these articles. The customer's investment is limited to the second microcomputer and the various load control modules. As load control modules are included in new appliances at the time of manufacture, it will not be necessary for the customer to invest separately in such equipment, either. Therefore, the customer's investment is kept to a minimum. Moreover, since the utility company retains control over the CPEU, it can augment the equipment as desired and it can use the computing and control capabilities of the first microcomputer as it chooses. This includes adding communication boards which interconnect the premises PLC bus with various other communications services. Therefore, if a CEBus node is made available to translate CEBus messages into conventional television signals for display on a television, cards can be added to the CPEU to allow other services to send messages for display on the customer's television. Further, the CPEU can have a board allowing the customer to send messages to other service providers, such as a cable television company (e.g., to order service, report problems, or ask questions), via selected media (e.g., the cable television distribution system, telephone or an RF ink).

Further cost advantages accrue both to the customer and to the utility company by using the first microcomputer as a server to provide computational, communications or other support for devices the customer may purchase. The cost of the devices is reduced by virtue of not having to provide the capabilities given by the system; and the utility can charge the manufacturer for providing access to the first microcomputer. The manufacturer can also be charged for communicating with the device via the CPEU.

Additional cost advantages accrue when utility services other than electric power are metered through this system. It is well known that there are substantial costs involved in having to send personnel to customer premises to read gas, water and electric meters. Such meters can now be interfaced to a CEBus or other PLC or network communications system, for remote reading by this system, greatly reducing the cost of meter reading.

O. Energy Brokerage—The present invention also facilitates the implementation of a system allowing a real-time energy sourcing marketplace, or brokerage. Various electrical energy suppliers can publish their rate structures to potential customers; this can be done as often as is practical, though changing rates more frequently than hourly is unlikely to be desirable. The customer, using the second microcomputer as a communications terminal, can receive these publications if they are provided electronically and then select a new supplier for any future time interval. The customer's utility company acts as a distributor for the available suppliers. When the customer changes suppliers, the utility company obtains a remote meter reading from the customer's meter, for use in billing the customer's account and crediting the original supplier's account for the usage at the original supplier's rate; downloads to the customer's system the rate which the new supplier will be charging; and records the new customer-supplier relationship and its starting date and time. Each supplier may, within regulatory limits, determine the minimum commitment and contract terms for its service; the utility company's computer system will be appropriately programmed so that the customer will be allowed to change suppliers only in accordance with that minimum commitment and other contract terms. Thus energy suppliers will be able to compete for customers' business. The utility company, of course, may be both a supplier and a distributor if the regulatory laws so allow. The present invention will make possible, therefore, competition in the energy marketplace at the end-user level.

P. Facilitation of Smart Appliances—Additionally, a system according to this invention facilitates the deployment and utilization of so-called "smart" appliances. For example, recipes can be downloaded, from sources external to the customer premises (e.g., the utility company or a connected service) through the CPEU directly to a microprocessor-controlled oven. Then the customer need not worry about programming the oven for the correct temperature(s) and time(s). As another example, a CEBus appliance can call the manufacturer for service, automatically, if its internal diagnostics indicate the existence of a problem. This call can be placed via the telephone if a telephone interface or modem is provided in the CPEU, or it can be placed via the utility company's computer system. The CPEU may store programming information for appliances, also; then, when power is restored after an outage, the CPEU and the appliance can interact to restore programming to the appliance (e.g., VCR programming) and to reset the appliance's clock.

As used herein, the terms "energy" and "power" may be interchanged except where one is intended to the exclusion of the other. Energy is actually the time-integral of power, of course. As such, the energy used by a load over a given time is generally calculated herein by measuring the power input to the load over a number of samples taken at successive instants of time. Nevertheless, following the vernacular, we sometimes speak, for example, in terms of measuring energy or consuming energy; it will be understood that energy is calculated from measured quantities and energy is actually transformed from an electrical form to another form (e.g., light, heat or motion). If "energy" is used where "power" would be more precise, or vice versa, it should be understood that the more precise term was intended.

Having thus described various illustrative embodiments of the invention, some of its advantages and optional features, it will be apparent that such embodiments are presented by way of example only and not by way of limitation. Those skilled in the art will readily devise alterations and improvements on these embodiments, as well as additional embodiments, without departing from the spirit and scope of the invention. For example, though the load control modules are shown as separate from the loads they control, it will be appreciated that an appliance can be designed with a control module as an integral part thereof. Indeed, it is foreseen that so-called "smart appliances" of the future will be built just this way with, for example, a CEBus or other interface included, as well as a circuit breaker and/or power monitoring circuit built-in. In another variation, instead of using industry-standard microcomputer platforms for both first and second microcomputers, one or both of the microcomputers or their operating systems can be non-standard; some flexibility will be lost, but one or both processors also can be replaced with a nonprogrammable controller which may even be dedicated hardware. Accordingly, the invention is limited only as defined in the following claims and equivalents thereto.

What is claimed is:

1. A first microcomputer for use in conjunction with a second microcomputer to control the operation of a plurality of electrical loads in a customer premises, comprising:

a first processor unit;

a first memory unit;

means for receiving from the second microcomputer commands to schedule events concerning the operation of loads;

means operable in cooperation with the first processor unit for collecting and storing in the first memory data describing historical power or energy usage by the customer; and means operable under control of the first processor unit for transmitting to load control modules message to effectuate said scheduled events.

2. The first microcomputer of claim 1 further including:

means for receiving, over a communications link, messages containing requests for implementing load shedding operations at the customer premises; and means operable under control of the first processor unit for transmitting to load control modules messages to effectuate said load shedding operations.

3. The first microcomputer of claim 1 further including means for reading a watt-hour meter which meters the consumption of energy at the premises, the historical data including data obtained by reading the watt-hour meter.

4. The first microcomputer of any of claims 1, 3 and 2 further including energy monitor means for monitoring and measuring the consumption of energy by at least one load.

5. The first microcomputer of claim 3 wherein the energy monitor means is adapted to monitor and measure the consumption of energy by up to four loads.

6. The first microcomputer of any of claims 1, 3 and 2 further including, in the first memory, a data structure; and the first microcomputer executing operations to store in the data structure on a periodic basis the energy consumption measurement for each said load.

7. The first microcomputer of claim 6 further including means for transmitting to at beast one of the second microcomputer and a remote site, via the communications link, data comprising at least one of watt-hour meter readings and energy consumption by a load device.

8. The first microcomputer of claim 7 wherein the data comprises, as a function of time interval, said at least one watt-hour meter reading and said energy consumption by a load device.

9. For use with a master controller, a secondary controller for reporting the operation of a plurality of electrical loads in a customer premises, comprising:

means for communicating with the master controller;

means for displaying messages to the customer;

means for obtaining from the master controller historical energy consumption data for one or more loads; and means for generating, in response to a request, on the means for displaying, a report describing said historical energy consumption data.

10. A secondary controller according to claim 9, wherein the means for generating creates on the means for displaying a graphical indication of the rate at which energy is being consumed at the premises.

11. A secondary controller according to claim 9, wherein the means for generating further creates on the means for displaying a graphical indication of the rate at which a selected load device has been consuming energy.

12. A system for controlling the operation of an electrical load to connect said load to and disconnect said load from electrical mains under specified conditions, comprising:

a. a first microcomputer including a first processor and first memory connected to intercommunicate and a first control program to control the execution of operations by the first microcomputer;

b. a second microcomputer including a second processor and second memory connected to intercommunicate, user means for a user to provide input data and a second control program to control the execution of operations by the second microcomputer;

c. at least one load control module which controls the condition of the load responsive to instructions from the first microcomputer, including at least instructions to connect the load to electrical mains and to disconnect the load from electrical mains;

d. a communications channel;

e. the first and second microcomputers and the load control module all being adapted to intercommunicate via the communications channel whereby the first microcomputer sends instructions to the load control module via the communications channel;

f. responsive to input data provided to the second microcomputer by the user, the first computer program causing the first microcomputer to execute instructions which build in the first memory a database including for at least specified loads a user-supplied maximum rate the user is willing to pay for energy to operate the load;

g. means for receiving from a energy provider an energy rate charge for operation of the load; and h. the first microcomputer executing instructions in the first computer program to obtain from the database said user-supplied maximum rate, to compare said maximum rate to the rate charge received from the electrical energy provider, and to send to the load control module instructions to disconnect the load from the electrical mains if and when the received rate exceeds the maximum rate.

13. A method for supplying information about usage, at the premises of a customer, of electrical energy supplied from an external source, comprising the steps of:

a. metering electrical energy used at the premises to produce an energy consumption meter reading;

b. at intervals, storing in a memory the meter reading;

c. at intervals, measuring electrical power consumption by each of a plurality of load devices at the premises;

d. storing in said memory, in association with the each said load device the electrical power consumption measurements therefor;

e. associating in said memory, for each load device, information identifying the load device; and f. providing reports detailing, as a function of time, the electrical energy consumed by each said load device and by the premises as a whole.

14. The method of claim 13 further including the step of storing, in said memory, in association with different classes of load devices, as a function of time, a rate associated with each of said classes of devices.

15. A first microcomputer for use in conjunction with a second microcomputer to control the operation of a plurality of electrical loads in a customer premises, the second microcomputer being located at the customer premises and the first microcomputer being locatable in the vicinity of the customer premises and being locatable independently of the second microcomputer, comprising:

means for receiving, from a communications link carrying messages from a source other than the second microcomputer, messages contain requests for implementing load shedding operations at the customer premises;

means for receiving from the second microcomputer commands to establish user-determined criteria concerning the operation of loads;

means for transmitting to load control modules messages to effectuate said load shedding operations only if the established user-determined criteria are satisfied: and means for collecting and storing data describing historical power or energy usage by the customer.

16. The first microcomputer of claim 15 further including means for reading a Watt-hour meter which meters the consumption of an energy at the premises.

17. The first microcomputer of either of claims 2 and 15 wherein a message containing a request for implementing a load shedding operation may include a request to shed a load of a predetermined type and the means operable under control of the first processor unit for transmitting to load control modules messages to effectuate load shedding operations responsively transmits a load shedding message only to load control modules for loads of the predetermined type, 18. The first microcomputer of either of claims 2 and 15 wherein the user-determined criteria includes an energy price limit associated with a load, the means for receiving messages is adapted to receive information defining an energy price at which load shedding is no longer required and the first processor unit transmits to a load control module a message to effectuate shedding of an associated load only if the user-determined energy price limit exceeds the energy price.

19. A system for controlling the operation of an electrical load at a premises to connect said load to and disconnect said load from electrical mains at determined times, comprising:

a. a first microcomputer adapted to be sited in the vicinity of the premises, including a first processor and first memory connected to intercommunicate and a first control program to control the execution of operations by the first microcomputer;

b. a second microcomputer for siting in the vicinity of the premises, including a second processor and second memory connected to intercommunicate, user means for a user to provide input data and a second control program to control the execution of operations by the second microcomputer;

c. at least one load control module which controls the condition of the load responsive to instructions from the first microcomputer, including at least instructions to connect the load to electrical mains and to disconnect the load from electrical mains;

d. a communications channel;

e. the first and second microcomputers and the load control module all being adapted to intercommunicate via the communications channel whereby the first microcomputer sends instructions to the load control module via the communications channel;

f. responsive to input data provided to the second microcomputer by the user, the first computer program causing the first microcomputer to execute instructions which build in the first memory a database of at least one of power and energy-price criteria associated with loads; and g. the first microcomputer executing instructions in the first computer program to obtain from the database said power and energy-price criteria and executing corresponding instructions to evaluate the criteria and send to the load control module instructions to connect the load to or disconnect the load from the mains when the criteria are satisfied.

20. A system for metering and controlling the operation of an electrical load at a premises to connect said load to and disconnect said load from electrical mains at determined times and to meter energy usage by said load, comprising:

a. a first microcomputer adapted to be sited in the vicinity of the premises, including a first processor and first memory connected to intercommunicate and a first control program to control the execution of operations by the first microcomputer;

b. a second microcomputer for siting in the vicinity of the premises, including a second processor and second memory connected to intercommunicate, user means for a user to provide input data and a second control program to control the execution of operations by the second microcomputer;

c. at least one load control module which controls the condition of the load responsive to instructions from the first microcomputer, including at least instructions to connect the load to electrical mains and to disconnect the load from electrical mains;

d. a communications channel;

e. the first and second microcomputers and the load control module all being adapted to intercommunicate via the communications channel whereby the first microcomputer sends instructions to the load control module via the communications channel;

f. responsive to input data provided to the second microcomputer by the user, the first computer program causing the first microcomputer to execute instructions which build in the first memory a database of load events to occur at predetermined times;

g. the first microcomputer executing instructions in the first computer program to obtain from the database said load events at said predetermined times and executing corresponding instructions to send to the load control module instructions to connect the load to or disconnect the load from electrical mains;

h. the second microcomputer including a database of load events to occur at predetermined times;

i. an electrical energy consumption metering subsystem for metering, during successive determined intervals, the electrical energy consumed by the loads connected to the mains and for supplying a value for the energy metered, wherein the first microcomputer is operated to obtain from the metering subsystem and store in the database of the first microcomputer said metered values, indexed according to the succession of intervals; and wherein the second microcomputer is operated from time to time, when it is turned on, to transmit to the first microcomputer a request for a predetermined number of said metered values; the first microcomputer is operated, in response to receiving said request, to transmit to the second microcomputer any of said predetermined number of metered values not previously sent to the second microcomputer; and the second microcomputer, in response to receiving said metered values, modifies its database by adding thereto corresponding entries.

21. The system of claim 20 wherein at least one load control module is of a type which measures an electrical usage parameter of a corresponding load and the first microcomputer is adapted to receive from said load control module, via the communications channel, a message containing said measurement and the first microcomputer is operated to store in the first database said measurement in such a way as to associate said measurement with the corresponding load.

22. The system of claim 21 wherein the second microcomputer is operable to request from the first microcomputer said measurement; the first microcomputer operates in response to said request by transmitting to the second microcomputer said measurement and the second microcomputer then stores said measurement in the second database, in association with the corresponding load.

23. The system of claim 21 wherein the first microcomputer has memory capacity to store a first predetermined number of days' metered values and a first predetermined number of load measurements, the second microcomputer has memory capacity to store a second predetermined number of days' metered values and a second predetermined number of load measurements, and further wherein the first and second computer programs execute interactively on the first and second microcomputers, respectively, when the second microcomputer becomes active after having been inactive, to transfer those metered values and load measurements to synchronize the contents of the database of metered values and load measurements in the second microcomputer with the database of metered values and load measurements in the first microcomputer.

24. The system of claim 23 wherein the first and second programs execute interactively to synchronize the contents of the databases after power has been shut off to the second microcomputer for some period of time.

25. The system of claim 23 wherein the first and second programs execute interactively to synchronize the contents of the databases after power is turned on for the second microcomputer for the first time.

26. The system of claim 23 wherein the database in the second microcomputer has a larger capacity for storing more metered values or more load measurements than the database in the first microcomputer.

27. The system of claim 20 wherein at least one load control module is adapted to measure the voltage across a corresponding controlled load, a current through the load and a phase angle of said current with respect to said voltage.

28. The system of claim 27 further including means for computing the energy consumption of the controlled load and the power factor for the load.

29. The system of claim 28 wherein the means for computing is located at the load control module.

* * * * *

UNITED STATES PATENT AND TRADEMARK OFFICE
CERTIFICATE OF CORRECTION

PATENT : 5,572,438
DATED : November 5, 1996
INVENTOR(S) : Ehlers et al.

It is certified that error appears in the above-identified patent and that said Letters Patent is hereby corrected as shown below:

Title page, item [54], and column 1, line 1 the title should read

ENERGY MANAGEMENT AND BUILDING AUTOMATION SYSTEM

Signed and Sealed this

Twenty-ninth Day of July, 1997

Attest:

BRUCE LEHMAN

*Attesting Officer*     *Commissioner of Patents and Trademarks*